US009240467B2

(12) United States Patent
Yamazaki et al.

(10) Patent No.: US 9,240,467 B2
(45) Date of Patent: Jan. 19, 2016

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Shunpei Yamazaki, Setagaya (JP); Junichiro Sakata, Atsugi (JP); Hiroki Ohara, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/609,833

(22) Filed: Jan. 30, 2015

(65) Prior Publication Data
US 2015/0155373 A1 Jun. 4, 2015

Related U.S. Application Data

(63) Continuation of application No. 13/399,375, filed on Feb. 17, 2012, now Pat. No. 8,957,414, which is a continuation of application No. 12/957,437, filed on Dec. 1, 2010, now Pat. No. 8,377,744.

(30) Foreign Application Priority Data

Dec. 4, 2009 (JP) ................................. 2009-277078

(51) Int. Cl.
*H01L 29/66* (2006.01)
*H01L 21/28* (2006.01)
(Continued)

(52) U.S. Cl.
CPC .... *H01L 29/66969* (2013.01); *H01L 21/02565* (2013.01); *H01L 21/28176* (2013.01);
(Continued)

(58) Field of Classification Search
CPC ............ H01L 29/66969; H01L 21/465; H01L 29/045; H01L 21/477; H01L 21/02565; H01L 29/04; H01L 29/78603; H01L 21/28176; H01L 29/78618; H01L 29/78606; H01L 29/78642; H01L 21/324; H01L 29/7869; H01L 29/78648
See application file for complete search history.

(56) References Cited

U.S. PATENT DOCUMENTS 4,341,939 A 7/1982 Briffod et al.
5,310,720 A 5/1994 Shin et al.
(Continued)

FOREIGN PATENT DOCUMENTS

EP 1737044 A 12/2006
EP 1770788 A 4/2007
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
(Continued)

*Primary Examiner* — William Coleman
(74) *Attorney, Agent, or Firm* — Eric J. Robinson; Robinson Intellectual Property Law Office, P.C.

(57) ABSTRACT

A semiconductor device for high power application in which a novel semiconductor material having high mass productivity is provided. An oxide semiconductor film is formed, and then, first heat treatment is performed on the exposed oxide semiconductor film in order to reduce impurities such as moisture or hydrogen in the oxide semiconductor film. Next, in order to further reduce impurities such as moisture or hydrogen in the oxide semiconductor film, oxygen is added to the oxide semiconductor film by an ion implantation method, an ion doping method, or the like, and after that, second heat treatment is performed on the exposed oxide semiconductor film.

16 Claims, 25 Drawing Sheets

(51) Int. Cl.
  *H01L 21/324* (2006.01)
  *H01L 29/04* (2006.01)
  *H01L 29/786* (2006.01)
  *H01L 21/02* (2006.01)
  *H01L 21/465* (2006.01)
  *H01L 21/477* (2006.01)

(52) U.S. Cl.
  CPC ............ *H01L21/324* (2013.01); *H01L 21/465* (2013.01); *H01L 21/477* (2013.01); *H01L 29/04* (2013.01); *H01L 29/045* (2013.01); *H01L 29/66742* (2013.01); *H01L 29/7869* (2013.01); *H01L 29/78603* (2013.01); *H01L 29/78606* (2013.01); *H01L 29/78618* (2013.01); *H01L 29/78642* (2013.01); *H01L 29/78648* (2013.01); *H01L 29/78696* (2013.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,891,809 A | 4/1999 | Chau et al. |
| 5,926,741 A | 7/1999 | Matsuoka et al. |
| 6,294,274 B1 | 9/2001 | Kawazoe et al. |
| 6,358,819 B1 | 3/2002 | Shelton et al. |
| 6,563,174 B2 | 5/2003 | Kawasaki et al. |
| 6,589,828 B2 | 7/2003 | Lee |
| 6,727,522 B1 | 4/2004 | Kawasaki et al. |
| 6,730,568 B2 | 5/2004 | Sohn |
| 6,838,308 B2 | 1/2005 | Haga |
| 7,049,190 B2 | 5/2006 | Takeda et al. |
| 7,056,381 B1 | 6/2006 | Yamazaki et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,394 B2 | 8/2009 | Furuta et al. |
| 7,601,984 B2 | 10/2009 | Sano et al. |
| 7,633,108 B2 | 12/2009 | Li et al. |
| 7,674,650 B2 | 3/2010 | Akimoto et al. |
| 7,732,819 B2 | 6/2010 | Akimoto et al. |
| 7,767,505 B2 | 8/2010 | Son et al. |
| 7,824,957 B2 | 11/2010 | Umeda et al. |
| 7,884,360 B2 | 2/2011 | Takechi et al. |
| 7,910,490 B2 | 3/2011 | Akimoto et al. |
| 7,932,521 B2 | 4/2011 | Akimoto et al. |
| 7,935,964 B2 | 5/2011 | Kim et al. |
| 7,960,289 B2 | 6/2011 | Chang |
| 7,994,500 B2 | 8/2011 | Kim et al. |
| 7,998,372 B2 | 8/2011 | Yano et al. |
| 8,026,506 B2 | 9/2011 | Shiino et al. |
| 8,058,645 B2 | 11/2011 | Jeong et al. |
| 8,062,936 B2 | 11/2011 | Seo et al. |
| 8,148,245 B2 | 4/2012 | Ikisawa et al. |
| 8,148,779 B2 | 4/2012 | Jeong et al. |
| 8,168,544 B2 | 5/2012 | Chang |
| 8,188,480 B2 | 5/2012 | Itai |
| 8,202,365 B2 | 6/2012 | Umeda et al. |
| 8,203,143 B2 | 6/2012 | Imai |
| 8,207,756 B2 | 6/2012 | Shionoiri et al. |
| 8,236,635 B2 | 8/2012 | Suzawa et al. |
| 8,242,494 B2 | 8/2012 | Suzawa et al. |
| 8,274,077 B2 | 9/2012 | Akimoto et al. |
| 8,274,078 B2 | 9/2012 | Itagaki et al. |
| 8,304,765 B2 | 11/2012 | Yamazaki et al. |
| 8,309,961 B2 | 11/2012 | Yamazaki et al. |
| 8,319,215 B2 | 11/2012 | Yamazaki et al. |
| 8,319,226 B2 | 11/2012 | Tokunaga |
| 8,343,799 B2 | 1/2013 | Ito et al. |
| 8,415,198 B2 | 4/2013 | Itagaki et al. |
| 8,420,442 B2 | 4/2013 | Takechi et al. |
| 8,466,463 B2 | 6/2013 | Akimoto et al. |
| 8,502,217 B2 | 8/2013 | Sato et al. |
| 8,513,661 B2 | 8/2013 | Takahashi et al. |
| 8,530,891 B2 | 9/2013 | Inoue et al. |
| 8,566,502 B2 | 10/2013 | Vaghani |
| 8,629,069 B2 | 1/2014 | Akimoto et al. |
| 8,647,933 B2 | 2/2014 | Yamazaki |
| 8,669,550 B2 | 3/2014 | Akimoto et al. |
| 8,790,959 B2 | 7/2014 | Akimoto et al. |
| 8,796,069 B2 | 8/2014 | Akimoto et al. |
| 9,099,562 B2 | 8/2015 | Akimoto et al. |
| 2001/0046027 A1 | 11/2001 | Tai et al. |
| 2002/0042186 A1 | 4/2002 | Kirchhoff |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0012742 A1 | 1/2004 | Ohnishi |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0191847 A1 | 9/2005 | Misawa et al. |
| 2005/0199959 A1 | 9/2005 | Chiang et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0284575 A1 | 12/2007 | Li et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |

(56) References Cited

U.S. PATENT DOCUMENTS

| | | |
|---|---|---|
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2008/0315193 A1 | 12/2008 | Kim et al. |
| 2009/0001363 A1 | 1/2009 | Park et al. |
| 2009/0008638 A1 | 1/2009 | Kang et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0298226 A1 | 12/2009 | Umeda et al. |
| 2009/0305461 A1 | 12/2009 | Akimoto et al. |
| 2009/0325341 A1 | 12/2009 | Itagaki et al. |
| 2010/0051949 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0084648 A1 | 4/2010 | Watanabe |
| 2010/0084650 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0105163 A1 | 4/2010 | Ito et al. |
| 2010/0109002 A1 | 5/2010 | Itagaki et al. |
| 2010/0117071 A1 | 5/2010 | Inoue et al. |
| 2010/0117075 A1 | 5/2010 | Akimoto et al. |
| 2010/0123136 A1 | 5/2010 | Lee et al. |
| 2010/0136743 A1 | 6/2010 | Akimoto et al. |
| 2010/0186815 A1 | 7/2010 | Yang et al. |
| 2010/0301329 A1 | 12/2010 | Asano et al. |
| 2010/0320458 A1 | 12/2010 | Umeda et al. |
| 2010/0320459 A1 | 12/2010 | Umeda et al. |
| 2011/0062433 A1 | 3/2011 | Yamazaki |
| 2011/0062436 A1 | 3/2011 | Yamazaki et al. |
| 2011/0104851 A1 | 5/2011 | Akimoto et al. |
| 2011/0114943 A1 | 5/2011 | Yamazaki et al. |
| 2011/0117697 A1 | 5/2011 | Akimoto et al. |
| 2011/0117698 A1 | 5/2011 | Suzawa et al. |
| 2011/0121290 A1 | 5/2011 | Akimoto et al. |
| 2011/0124153 A1 | 5/2011 | Hosoba et al. |
| 2011/0136301 A1 | 6/2011 | Yamazaki et al. |
| 2011/0136302 A1 | 6/2011 | Yamazaki et al. |
| 2012/0149147 A1 | 6/2012 | Yamazaki et al. |
| 2012/0256179 A1 | 10/2012 | Yamazaki et al. |
| 2012/0295399 A1 | 11/2012 | Kim et al. |
| 2013/0237012 A1 | 9/2013 | Takechi et al. |
| 2015/0340513 A1 | 11/2015 | Akimoto et al. |

FOREIGN PATENT DOCUMENTS

| | | |
|---|---|---|
| EP | 1995787 A | 11/2008 |
| EP | 1998373 A | 12/2008 |
| EP | 1998374 A | 12/2008 |
| EP | 1998375 A | 12/2008 |
| EP | 2110855 A | 10/2009 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 64-022066 A | 1/1989 |
| JP | 05-048096 A | 2/1993 |
| JP | 05-251705 A | 9/1993 |
| JP | 08-264794 A | 10/1996 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-041362 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-005116 A | 1/2006 |
| JP | 2007-073559 A | 3/2007 |
| JP | 2007-096055 A | 4/2007 |
| JP | 2007-123861 A | 5/2007 |
| JP | 2008-042088 A | 2/2008 |
| JP | 2008-053356 A | 3/2008 |
| JP | 2008-281988 A | 11/2008 |
| JP | 2009-004787 A | 1/2009 |
| JP | 2009-021612 A | 1/2009 |
| JP | 2009-141002 A | 6/2009 |
| JP | 2009-167087 A | 7/2009 |
| JP | 2009-176865 A | 8/2009 |
| JP | 2009-231613 A | 10/2009 |
| JP | 2009-260378 A | 11/2009 |
| JP | 2009-290111 A | 12/2009 |
| JP | 2010-016347 A | 1/2010 |
| JP | 2010-040552 A | 2/2010 |
| JP | 4415062 | 2/2010 |
| JP | 2010-067954 A | 3/2010 |
| JP | 2010-177431 A | 8/2010 |
| JP | 4571221 | 10/2010 |
| KR | 2008-0106049 A | 12/2008 |
| TW | 200908333 | 2/2009 |
| TW | 200936792 | 9/2009 |
| WO | WO-2004/114391 | 12/2004 |
| WO | WO-2007/058231 | 5/2007 |
| WO | WO-2008/015944 | 2/2008 |
| WO | WO-2008/023553 | 2/2008 |
| WO | WO-2008/069057 | 6/2008 |
| WO | WO-2008/093741 | 8/2008 |
| WO | WO-2008/126492 | 10/2008 |
| WO | WO-2008/126879 | 10/2008 |
| WO | WO-2008/133345 | 11/2008 |
| WO | WO-2009/034953 | 3/2009 |
| WO | WO-2009/072532 | 6/2009 |
| WO | WO-2009/093722 | 7/2009 |

OTHER PUBLICATIONS

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceddings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistros (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel, YBFE2O4, and YB2FE3O7 Types of Structures for Compounds in the In2O3 and Sc2O3—A2O3—BO

(56) References Cited

OTHER PUBLICATIONS

Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physcial Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters), 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using Castep", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

International Search Report (Application No. PCT/JP2010/070518) Dated Feb. 15, 2011.

Written Opinion (Application No. PCT/JP2010/070518) Dated Feb. 15, 2011.

International Search Report (Application No. PCT/JP2010/070643) Dated Feb. 15, 2011.

Written Opinion (Application No. PCT/JP2010/070643) Dated Feb. 15, 2011.

Office Action (U.S. Appl. No. 12/957,746) Dated Dec. 1, 2011.

Moriga.T et al., "Phase Relationship and Physical Properties of Homologous Compounds in the Zinc Oxide—Indium Oxide System", Journal of the American Ceramic Society, Dec. 1, 1998, vol. 81, No. 5, pp. 1310-1316.

Batzill.M et al., "The surface and materials science of tin oxide", Progress in Surface Science, 2005, vol. 79, pp. 47-154.

Cheng et al., "Indium oxide nanostructures", Applied Physics A, 2006, vol. 85, pp. 233-240, Materials Science & Processing.

Nakayama et al., "17a-TL-8 Effect of GaO Layer on IGZO-TFT Channel", Extended Abstracts (The 57th Spring Meeting 2010), The Japan Soceity of Applied Physics and Releated Societies, Mar. 17, 2010, pp. 21-21008.

Hiramatsu.T et al., "Behavior of oxygen in zinc oxide films through thermal annealing and its effect on sheet resistance", Applied Surface Science, 2011, vol. 257, pp. 5480-5483.

Japanese Office Action (Application No. 2012-164265) Dated Dec. 24, 2013.

Taiwanese Office Action (Application No. 101105925) Dated Jan. 28, 2014.

Office Action (U.S. Appl. No. 12/957,746) Dated Dec. 19, 2013.

Pending Claims (U.S. Appl. No. 12/957,746) Dated Dec. 6, 2013.

Pending Claims (U.S. Appl. No. 12/957,746) Dated Jan. 28, 2014.

Kim.G et al., "Formation Mechanism of Solution-Processed Nanocrystalline InGaZnO Thin Film as Active Channel Layer in Thin-Film Transistor", J. Electrochem. Soc. (Journal of the Electrochemical Society), Oct. 30, 2008, vol. 156, No. 1, pp. H7-H9.

Adikaari.A et al., "Thickness dependence of properties of excimer laser crystallized nano-polycrystalline silicon", J. Appl. Phys. (Journal of Applied Physics), May 24, 2005, vol. 97, pp. 114305-1-114305-7.

European Search Report (Application No. 10834485.4) Dated Apr. 14, 2014.

Taiwanese Office Action (Application No. 101105926) Dated Jun. 5, 2015.

Taiwanese Office Action (Application No. 099141025) Dated Jun. 23, 2015.

Energy band diagram of B-B' section (VG>0)

Energy band diagram of B-B' section (VG<0)

SEMICONDUCTOR DEVICE AND MANUFACTURING METHOD THEREOF

TECHNICAL FIELD

The present invention relates to a semiconductor device using an oxide semiconductor and a manufacturing method thereof.

BACKGROUND ART

A transistor using a semiconductor film formed over an insulating surface is an essential semiconductor element for a semiconductor device. Since the manufacturing of transistors has a limitation on the allowable temperature limit of a substrate, a transistor using, as an active layer, amorphous silicon which can be formed at a relatively low temperature, polysilicon which can be obtained by crystallization using laser light or a catalytic element, or the like has been mainly used as a transistor for the semiconductor display device.

In recent years, a metal oxide having semiconductor characteristics which is referred to as an oxide semiconductor has attracted attention as a novel semiconductor material which has both high mobility, which is a characteristic of polysilicon, and uniform element characteristics, which is a characteristic of amorphous silicon. The metal oxide has been used for various applications; for example, indium oxide that is a well-known metal oxide has been used as a material of a transparent electrode included in a liquid crystal display device or the like. Examples of such metal oxides having semiconductor characteristics include tungsten oxide, tin oxide, indium oxide, and zinc oxide. Transistors in each of which a channel formation region is formed using such a metal oxide having semiconductor characteristics have been known (Patent Documents 1 and 2).

REFERENCE

Patent Document 1: Japanese Published Patent Application No. 2007-123861
Patent Document 2: Japanese Published Patent Application No. 2007-096055

DISCLOSURE OF INVENTION

As for a transistor included in a semiconductor device, it is preferable to reduce the variation of the threshold voltage caused by time degradation and to reduce the off-state current. With the transistor the variation of the threshold voltage caused by time degradation of which is small, reliability of a semiconductor device can be increased. With a transistor the off-state current of which is low, power consumption of a semiconductor device can be suppressed.

It is an object of the present invention to provide a method for manufacturing a highly reliable semiconductor device. It is another object of the present invention to provide a method for manufacturing a semiconductor device with low power consumption. It is another object of the present invention to provide a highly reliable semiconductor device. It is another object of the present invention to provide a semiconductor device with low power consumption.

In a semiconductor device with high withstand voltage for controlling large current, a so-called power device, silicon has been used mainly as a semiconductor material. However, it is said that the physical characteristics of a semiconductor element using silicon reach the theoretical value limit, and a novel semiconductor material with which the characteristics can be improved has been demanded in order to realize a power device that has high withstand voltage and can control large current. As the semiconductor material that may improve the characteristics such as high withstand voltage, high conversion efficiency, or high-speed switching, for example, a compound semiconductor such as silicon carbide or gallium nitride can be given. The bandgap of silicon carbide and the bandgap of gallium nitride are 3.26 eV and 3.39 eV, respectively, which are about three times as large as that of silicon; it is known that such a compound semiconductor is advantageous for improving the withstand voltage, reducing the power loss of a semiconductor device, and the like.

On the other hand, the compound semiconductor such as silicon carbide or gallium nitride has a problem of high process temperature. The process temperature of silicon carbide is about 1500° C. and the process temperature of gallium nitride is about 1100° C., which does not allow film deposition on a glass substrate whose allowable temperature limit is low. Therefore, an inexpensive glass substrate cannot be used, and further, the compound semiconductor cannot be applied when the size of a substrate is increased, so that the mass productivity of semiconductor devices using the compound semiconductor such as silicon carbide or gallium nitride is low, which disturbs practical application.

In view of the foregoing problems, an object of one embodiment of the present invention is to provide a semiconductor device for high power application in which a novel semiconductor material having high mass productivity is used.

The present inventors paid their attention to the fact that impurities such as hydrogen or water existing in an oxide semiconductor film cause degradation over time, such as shifts in threshold voltage, to transistors. It has been found that the oxide semiconductor film formed by sputtering or the like includes a large amount of hydrogen or water as impurities. According to one embodiment of the present invention, in order to decrease impurities such as moisture or hydrogen in the oxide semiconductor film, after the oxide semiconductor film is formed, the exposed oxide semiconductor film is subjected to first heat treatment in a reduced-pressure atmosphere, an inert gas atmosphere of nitrogen, a rare gas, or the like, an oxygen gas atmosphere, or an ultra dry air atmosphere (in air whose moisture content is less than or equal to 20 ppm (dew point conversion, −55° C.), preferably less than or equal to 1 ppm, far preferably less than or equal to 10 ppb in the case where measurement is performed using a dew-point meter of a cavity ring-down laser spectroscopy (CRDS) system). Next, in order to further decrease impurities such as moisture or hydrogen in the oxide semiconductor film, oxygen is added to the oxide semiconductor film by an ion implantation method, an ion doping method, or the like, and after that, the exposed oxide semiconductor film is subjected to second heat treatment in a reduced-pressure atmosphere, an inert gas atmosphere of nitrogen, a rare gas, or the like, an oxygen gas atmosphere, or an ultra dry air atmosphere (in air whose moisture content is less than or equal to 20 ppm (dew point conversion, −55° C.), preferably less than or equal to 1 ppm, far preferably less than or equal to 10 ppb in the case where measurement is performed using a dew-point meter of a cavity ring-down laser spectroscopy (CRDS) system).

The first heat treatment decreases the impurities such as moisture or hydrogen in the oxide semiconductor film, but does not eliminate completely, so that there is room for improvement. This incompleteness of impurity elimination is considered to be caused by hydrogen or a hydroxyl group bonded to a metal that is a component of the oxide semiconductor. In accordance with the present invention, the bond between the metal as a component of the oxide semiconductor and the hydrogen or the hydroxyl group is cut and the hydrogen or the hydroxyl group is made to react with oxygen to produce water by adding oxygen in the oxide semiconductor film by an ion implantation method, an ion doping method, or the like. Then the second heat treatment is performed after the addition of oxygen, whereby impurities such as hydrogen or a hydroxyl group left can be easily eliminated as water.

When an oxide semiconductor which is an i-type (intrinsic) semiconductor or a substantially i-type semiconductor can be obtained by elimination of impurities such as moisture or hydrogen, deterioration of characteristics of the transistor due to the impurities, such as shifts in threshold voltage, can be prevented from being promoted and off-state current can be reduced. Specifically, impurities such as hydrogen or water contained in an oxide semiconductor are removed so that the value of the concentration of hydrogen in the oxide semiconductor measured by secondary ion mass spectroscopy (SIMS) is less than or equal to $5\times10^{19}/cm^3$, preferably less than or equal to $5\times10^{18}/cm^3$, far preferably less than or equal to $5\times10^{17}/cm^3$, still far preferably less than $1\times10^{16}/cm^3$. In addition, the carrier density of the oxide semiconductor film, which is measured by Hall effect measurement, is less than $1\times10^{14}/cm^3$, preferably less than $1\times10^{12}/cm^3$, far preferably less than or equal to $1\times10^{11}/cm^3$ that is less than or equal to a measurement limit. In other words, the carrier density of the oxide semiconductor film is extremely close to zero. Furthermore, the band gap of the oxide semiconductor is greater than or equal to 2 eV, preferably greater than or equal to 2.5 eV, far preferably greater than or equal to 3 eV. With the use of the oxide semiconductor film which is highly purified by sufficiently reducing the hydrogen concentration, the off-state current of the transistor can be reduced.

The above two heat treatments are preferably performed at a temperature higher than or equal to 500° C. and lower than or equal to 850° C. (or lower than or equal to the strain point of a glass substrate), far preferably at a temperature higher than or equal to 550° C. and lower than or equal to 750° C. Note that these heat treatments are performed at a temperature not exceeding the allowable temperature limit of the substrate to be used. An effect of elimination of water or hydrogen by heat treatment has been confirmed by thermal desorption spectroscopy (TDS).

Heat treatment in a furnace or a rapid thermal annealing method (RTA method) is used for the heat treatment. As the RTA method, a method using a lamp light source or a method in which heat treatment is performed for a short time while a substrate is moved in a heated gas can be employed. With the use of the RTA method, it is also possible to make the time involved in heat treatment shorter than 0.1 hours.

For example, even in the case where the transistor using the highly purified oxide semiconductor film in the above-described manner is an element whose channel width W is $1\times10^4$ μm and whose channel length L is 3 μm, electrical characteristics of an off-state current of $10^{-13}$ A or less and a subthreshold swing (S factor) of about 0.1 V/dec (the thickness of a gate insulating film is 100 nm) can be obtained. Therefore, the off-state current in the state where a source-drain voltage is 0 or less, that is, the leakage current is much smaller than that of a transistor using silicon having crystallinity.

Further, such a transistor using a highly-purified oxide semiconductor (purified OS) exhibits almost no temperature dependence of off-state current. This is because the conductivity type is made to be as close to an intrinsic type as possible by removing impurities which become electron donors (donors) in the oxide semiconductor to highly purify the oxide semiconductor, so that the Fermi level positions in a center of the forbidden band. This also results from the fact that the oxide semiconductor has an energy gap of 3 eV or more and includes very few thermally excited carriers. In addition, the source electrode and the drain electrode are in a degenerated state, which is also a factor for showing no temperature dependence. Transistors are mainly operated with carriers which are injected from the degenerated source electrode to the oxide semiconductor, and the above-described characteristics (no dependence of the off-state current on the temperature) can be explained by no dependence of carrier density on the temperature.

Further, in the first heat treatment, by performing dehydration or dehydrogenation treatment at high temperature for short time on the oxide semiconductor film by an RTA (Rapid Thermal Anneal) method or the like, a superficial portion of the oxide semiconductor film is made to have a crystal region including a so-called nanocrystal with a grain size greater than or equal to 1 nm and less than or equal to 20 nm, and the other portion thereof is made to be amorphous or a mixture of an amorphous state and microcrystals where the microcrystals are provided in the amorphous state. Note that the above-described size of the nanocrystal is just an example, and the present invention is not construed as being limited to the above range.

The crystal region formed in the superficial portion of the oxide semiconductor film is damaged by addition of oxygen by an ion implantation method, an ion doping method, or the like. However, in the oxide semiconductor film, an oxygen defect is generated in addition to removal of water or hydrogen by the first heat treatment, and oxygen can be sufficiently supplied to the oxygen-deficient oxide semiconductor film by the addition of oxygen by an ion implantation method, an ion doping method, or the like. Further, since hydrogen or water removed by the first heat treatment is not a component element of the oxide semiconductor but a so-called impurity and oxygen added later is one component element of the oxide semiconductor, a structure which satisfies the stoichiometric composition ratio can be obtained. Therefore, by performing the second heat treatment after the first heat treatment and the addition of oxygen, the damaged crystal region can be repaired, and crystal growth is promoted from the superficial portion of the oxide semiconductor film to a larger depth of the oxide semiconductor film, so that the crystal region can be expanded. Further, crystal growth is further promoted by this second heat treatment as compared to the first heat treatment, so that in the crystal region, crystal grains are adjacent to each other and metal elements each of which is a component element of the oxide semiconductor are continuous, that is, continuously in contact with each other between crystal grains which are adjacent to each other. Accordingly, in a transistor in which a channel formation region is formed using the above-described crystal region, the potential barrier at a crystal grain boundary is low, so that excellent characteristics such as high mobility and high withstand voltage can be achieved.

As the oxide semiconductor, the following can be used: an oxide of four metal elements such as an In—Sn—Ga—Zn—O-based oxide semiconductor; an oxide of three metal elements such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; an oxide of two metal elements such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; an In—O-based oxide semiconductor, a Sn—O-based oxide semiconductor, a Zn—O-based oxide semiconductor, or the like. In this specification, for example, an In—Sn—Ga—Zn—O-based oxide semiconductor means a metal oxide including indium (In), tin (Sn), gallium (Ga), and zinc (Zn), whose stoichiometric composition ratio is not particularly limited. The above-described oxide semiconductor may include silicon.

Alternatively, oxide semiconductors can be represented by the chemical formula, $InMO_3(ZnO)_m$ (m>0). Here, M represents one or more metal elements selected from Ga, Al, Mn, and Co.

The analysis of the concentrations of hydrogen in the oxide semiconductor film and the conductive film is described here. The concentrations of hydrogen in the oxide semiconductor film and the conductive film are measured by secondary ion mass spectrometry (SIMS). It is known that it is difficult to obtain data in the proximity of a surface of a sample or in the proximity of an interface between stacked films formed using different materials by the SIMS analysis in principle. Thus, in the case where the distribution of the hydrogen concentration of the film in a thickness direction is analyzed by SIMS, an average value in a region of the film, in which the value is not greatly changed and almost the same value can be obtained is employed as the hydrogen concentration. Further, in the case where the thickness of the film is small, such a region where almost the same value can be obtained cannot be found in some cases due to the influence of the hydrogen concentration of a film which is adjacent to the film. In that case, the maximum value or the minimum value of the hydrogen concentration in the region of the film is employed as the hydrogen concentration of the film. Further, in the case where a mountain-shaped peak having the maximum value or a valley-shaped peak having the minimum value do not exist in the region of the film, the value at the inflection point is employed as the hydrogen concentration.

The transistor may be a bottom-gate transistor, a top-gate transistor, or a bottom-contact transistor. A bottom-gate transistor has a gate electrode over an insulating surface; a gate insulating film over the gate electrode; an oxide semiconductor film which overlaps with the gate electrode over the gate insulating film; a source electrode and a drain electrode which are over the oxide semiconductor film; and an insulating film over the source electrode, the drain electrode, and the oxide semiconductor film. A top-gate transistor has an oxide semiconductor film over an insulating surface; a gate insulating film over the oxide semiconductor film; a gate electrode which overlaps with the oxide semiconductor film over the gate insulating film and functions as a conductive film; a drain electrode; a source electrode; and an insulating film over the source electrode, the drain electrode, and the oxide semiconductor film. A bottom-contact transistor has a gate electrode over an insulating surface; a gate insulating film over the gate electrode; a source electrode and a drain electrode which are over the gate insulating film; an oxide semiconductor film which is over the source electrode and the drain electrode and which overlaps with the gate electrode over the gate insulating film; and an insulating film over the source electrode, the drain electrode, and the oxide semiconductor film.

Hydrogen or water which is around the oxide semiconductor film is easily absorbed by the oxide semiconductor film not only in film deposition by sputtering or the like but also after the film deposition. Water or hydrogen easily forms a donor level and thus serves as an impurity in the oxide semiconductor itself. Therefore, according to one embodiment of the present invention, after the source electrode and the drain electrode are formed, an insulating film using an insulating material having a high barrier property may be formed so as to cover the source electrode, the drain electrode, and the oxide semiconductor film. It is preferable to use an insulating material having a high barrier property for the insulating film. For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having lower proportion of nitrogen than the insulating film having a high barrier property, such as a silicon oxide film or a silicon oxynitride film, is formed on the side close to the oxide semiconductor film. Then, an insulating film having a barrier property is formed so as to overlap with the source electrode, the drain electrode, and the oxide semiconductor film with the insulating film having lower proportion of nitrogen provided therebetween. With the insulating film having a barrier property, impurities such as moisture or hydrogen can be prevented from entering the oxide semiconductor film, the gate insulating film, or the interface between the oxide semiconductor film and another insulating film and the vicinity thereof.

Between the gate electrode and the oxide semiconductor film, a gate insulating film may be formed to have a structure in which an insulating film formed using a material having a high barrier property and an insulating film having lower proportion of nitrogen, such as a silicon oxide film or a silicon oxynitride film are stacked. The insulating film such as a silicon oxide film or a silicon oxynitride film is formed between the insulating film having a barrier property and the oxide semiconductor film. With the insulating film having a barrier property, impurities in an atmosphere, such as moisture or hydrogen, or impurities included in a substrate, such as an alkali metal or a heavy metal, can be prevented from entering the oxide semiconductor film, the gate insulating film, or the interface between the oxide semiconductor film and another insulating film and the vicinity thereof.

In accordance with the present invention, a method for manufacturing a semiconductor device with high reliability can be provided. A method for manufacturing a semiconductor device with low power consumption can be provided. Further, a semiconductor device with high reliability can be provided. A semiconductor device with low power consumption can be provided.

Further, a semiconductor element having a high withstand voltage can be manufactured at a low film deposition temperature, so that a semiconductor device for high power application with high mass productivity can be provided.

BEST MODE FOR CARRYING OUT THE INVENTION

Embodiments and Example of the present invention will be described below with reference to the accompanying drawings. Note that the present invention is not limited to the following description, and it is easily understood by those skilled in the art that modes and details disclosed herein can be modified in various ways without departing from the spirit and the scope of the present invention. Therefore, the present invention is not to be construed as being limited to the content of the embodiments included herein.

The present invention can be applied to manufacture of any kind of semiconductor devices including microprocessors, integrated circuits such as image processing circuits, RF tags, and semiconductor display devices. A semiconductor device means any device which can function by utilizing semiconductor characteristics, and a semiconductor display device, a semiconductor circuit, and an electronic device are all included in the category of the semiconductor device. The semiconductor display devices include the following in its category: liquid crystal display devices, light-emitting devices in which a light-emitting element typified by an organic light-emitting element (OLED) is provided for each pixel, electronic papers, digital micromirror devices (DMDs), plasma display panels (PDPs), field emission displays (FEDs), and other semiconductor display devices in which a circuit element using a semiconductor film is included in a driver circuit.

Embodiment 1

A bottom-gate transistor having a channel-etched structure is taken as an example, and a structure of the transistor included in a semiconductor device according to one embodiment of the present invention and a manufacturing method thereof will be described.

Figure 1A:
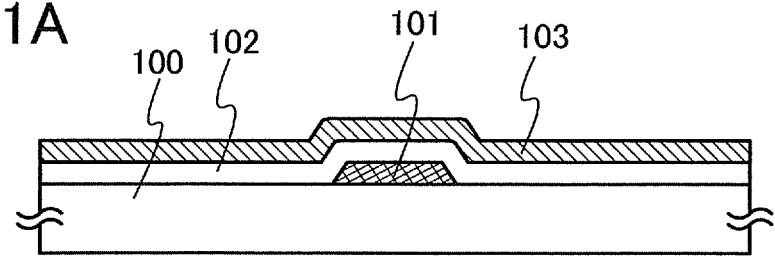
FIGS. 1A to 1E are views illustrating a method for manufacturing a semiconductor device.

As shown in FIG. 1A, a gate electrode 101 is formed over a substrate 100.

Although there is no particular limitation on a substrate that can be used as the substrate 100 having an insulating surface, it is necessary that the substrate has heat resistance high enough to withstand at least heat treatment to be performed later. For example, a glass substrate manufactured by a fusion method or a float method can be used. When the temperature of the heat treatment performed later is high, it is preferable to use a substrate having a strain point of 730° C. or higher as the glass substrate. For the glass substrate, a glass material such as aluminosilicate glass, aluminoborosilicate glass, or barium borosilicate glass is used, for example. In general, by containing a larger amount of barium oxide (BaO) than boron oxide, a glass substrate which is heat-resistant and more practical can be obtained. Therefore, it is preferable to use a glass substrate containing BaO and $B_2O_3$ so that the amount of BaO is larger than that of $B_2O_3$.

Instead of the above-described glass substrate, a substrate formed of an insulator such as a ceramic substrate, a quartz substrate, or a sapphire substrate may be used. Alternatively, crystallized glass or the like may be used. Further alternatively, a metal substrate such as a substrate of a stainless steel alloy, provided with an insulating film on its surface, may be used.

A substrate formed from a flexible synthetic resin, such as plastic, generally tends to have a low allowable temperature limit, but can be used as the substrate 100 as long as the substrate can withstand a processing temperature in the later manufacturing process. Examples of the plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

An insulating film to serve as a base film may be formed between the substrate 100 and the gate electrode 101. As the base film, for example, a single layer of a silicon oxide film, a silicon oxynitride film, a silicon nitride film, a silicon nitride oxide film, an aluminum nitride film, or an aluminum nitride oxide film or a stacked layer of a plurality of these films can be used. In particular, an insulating film having a high barrier property, for example, a silicon nitride film, a silicon nitride oxide film, an aluminum nitride film, or an aluminum nitride oxide film may be used for the base film, so that impurities in an atmosphere, such as moisture or hydrogen, or impurities included in the substrate 100, such as an alkali metal or a heavy metal, can be prevented from entering the oxide semiconductor film, the gate insulating film, or the interface between the oxide semiconductor film and another insulating film and the vicinity thereof.

In this specification, oxynitride refers to a substance which includes more oxygen than nitrogen, and nitride oxide refers to a substance which includes more nitrogen than oxygen.

The gate electrode 101 can be formed to have a single-layer structure or a stacked-layer structure using one or more conductive films using a metal material such as molybdenum, titanium, chromium, tantalum, tungsten, neodymium, or scandium or an alloy material which contains any of these metal materials as its main component, or a nitride which contains any of these metals. Aluminum or copper can be used as one of the metal material if aluminum or copper can withstand a temperature of heat treatment performed in a later process. Aluminum or copper is preferably combined with a refractory metal material so as to prevent a heat resistance problem and a corrosive problem. As the refractory metal material, molybdenum, titanium, chromium, tantalum, tungsten, neodymium, scandium, or the like can be used.

For example, as a two-layer structure of the gate electrode 101, the following structure is preferable: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, or a two-layer structure in which a titanium nitride film and a molybdenum film are stacked. As a three-layer structure of the gate electrode 101, the following structure is preferable: a stacked structure in which an aluminum film, an alloy film of aluminum and silicon, an alloy film of aluminum and titanium, or an alloy film of aluminum and neodymium is sandwiched by any two films selected from a tungsten film, a tungsten nitride film, a titanium nitride film, and a titanium film.

Further, a light-transmitting oxide conductive film of indium oxide, an alloy of indium oxide and tin oxide, an alloy of indium oxide and zinc oxide, zinc oxide, aluminum zinc oxide, aluminum zinc oxynitride, gallium zinc oxide, or the like may be used for the gate electrode 101, so that the aperture ratio of a pixel portion can be increased.

The gate electrode 101 is formed to a thickness of 10 nm to 400 nm, preferably 100 nm to 200 nm. In this embodiment, a conductive film for the gate electrode is formed to a thickness of 150 nm by a sputtering method using a tungsten target, and then, the conductive film is processed (patterned) into an appropriate shape by etching; in such a manner, the gate electrode 101 is formed. It is preferable that an end portion of the gate electrode be tapered because coverage with a gate insulating film formed thereover is improved. Note that a resist mask may be formed by an inkjet method. Formation of the resist mask by an inkjet method needs no photomask; thus, manufacturing costs can be reduced.

Next, a gate insulating film 102 is formed over the gate electrode 101. The gate insulating film 102 can be formed to have a single-layer structure or a stacked-layer structure of one or more selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and a tantalum oxide film by a plasma CVD method, a sputtering method, or the like. It is preferable that the gate insulating film 102 include impurities such as moisture or hydrogen as little as possible. In the case where a silicon oxide film is formed by a sputtering method, a silicon target or a quartz target is used as a target and oxygen or a mixed gas of oxygen and argon is used as a sputtering gas.

An oxide semiconductor that is made to be i-type or substantially i-type (an oxide semiconductor that is highly purified) by removal of impurities is extremely sensitive to an interface state and an interface electric charge; thus, an interface between the oxide semiconductor and the gate insulating film 102 is important. Thus, a gate insulating film (GI) which is to be in contact with the highly purified oxide semiconductor needs to have high quality.

For example, high-density plasma CVD using microwaves (2.45 GHz) is preferable because a dense high-quality insulating film having high withstand voltage can be formed. This is because an interface state can be reduced and interface characteristics can be favorable when the highly purified oxide semiconductor and the high quality gate insulating film are in contact with each other.

Needless to say, other film formation methods, such as a sputtering method or a plasma CVD method, can be applied as long as a high-quality insulating film can be formed as the gate insulating film. The film quality of the gate insulating film and/or properties of an interface with an oxide semiconductor thereof may be modified by heat treatment performed after film deposition. In any case, any insulating film can be used as long as film quality as a gate insulating film is high, interface state density with an oxide semiconductor is decreased, and a favorable interface can be formed.

The gate insulating film 102 may have a structure in which an insulating film formed using a material having a high barrier property and an insulating film having lower proportion of nitrogen such as a silicon oxide film or a silicon oxynitride film are stacked. In that case, the insulating film such as a silicon oxide film or a silicon oxynitride film is formed between the insulating film having a barrier property and the oxide semiconductor film. As the insulating film having a high barrier property, a silicon nitride film, a silicon nitride oxide film, an aluminum nitride film, an aluminum nitride oxide film, or the like can be given, for example. With the insulating film having a barrier property, impurities in an atmosphere, such as moisture or hydrogen, or impurities included in the substrate, such as an alkali metal or a heavy metal, can be prevented from entering the oxide semiconductor film, the gate insulating film 102, or the interface between the oxide semiconductor film and another insulating film and the vicinity thereof. In addition, the insulating film having lower proportion of nitrogen such as a silicon oxide film or a silicon oxynitride film may be formed so as to be in contact with the oxide semiconductor film, so that the insulating film formed using a material having a high barrier property can be prevented from being in contact with the oxide semiconductor film directly.

For example, a stacked-layer film with a thickness of 100 nm may be formed as the gate insulating film 102 as follows: a silicon nitride film ($SiN_y$ (y>0)) with a thickness greater than or equal to 50 nm and less than or equal to 200 nm is formed by a sputtering method as a first gate insulating film, and a silicon oxide film ($SiO_x$ (x>0)) with a thickness greater than or equal to 5 nm and less than or equal to 300 nm is stacked over the first gate insulating film as a second gate insulating film. The thickness of the gate insulating film 102 may be set as appropriate depending on characteristics needed for a transistor and may be about 350 nm to 400 nm.

In this embodiment, the gate insulating film 102 is formed to have a structure in which a silicon oxide film having a thickness of 100 nm formed by a sputtering method is stacked over a silicon nitride film having a thickness of 50 nm formed by a sputtering method.

In order that hydrogen, a hydroxyl group, and moisture may be contained in the gate insulating layer 102 as little as possible, it is preferable that the substrate 100 over which the gate electrode layer 101 is formed be preheated in a preheating chamber of a sputtering apparatus as pretreatment for film formation so that impurities such as hydrogen and moisture adsorbed to the substrate 100 are removed and exhausted. The temperature of the preheating is higher than or equal to 100°

C. and lower than or equal to 400° C., preferably higher than or equal to 150° C. and lower than or equal to 300° C. As an exhaustion unit provided in the preheating chamber, a cryopump is preferable. This preheating treatment can be omitted.

Next, over the gate insulating film 102, an oxide semiconductor film 103 having a thickness greater than or equal to 2 nm and less than or equal to 200 nm, preferably greater than or equal to 3 nm and less than or equal to 50 nm, far preferably greater than or equal to 3 nm and less than or equal to 20 nm is formed. The oxide semiconductor film 103 is formed by a sputtering method using an oxide semiconductor as a target. The oxide semiconductor film 103 can be formed by a sputtering method under a rare gas (for example, argon) atmosphere, an oxygen atmosphere, or an atmosphere including a rare gas (for example, argon) and oxygen.

Before the oxide semiconductor film 103 is formed by a sputtering method, dust attached to a surface of the gate insulating film 102 is preferably removed by reverse sputtering in which an argon gas is introduced and plasma is generated. The reverse sputtering refers to a method in which, without application of a voltage to a target side, an RF power source is used for application of a voltage to a substrate side in an argon atmosphere to modify a surface. Instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

The above-described oxide semiconductor can be used as the oxide semiconductor film 103.

In this embodiment, as the oxide semiconductor film 103, an In—Ga—Zn—O-based non-single-crystal film with a thickness of 30 nm, which is obtained by a sputtering method using an oxide semiconductor target including indium (In), gallium (Ga), and zinc (Zn), is used. As the target, for example, an oxide semiconductor target having a composition ratio with an atom ratio of metals, In:Ga:Zn=1:1:0.5, In:Ga:Zn=1:1:1, or In:Ga:Zn=1:1:2 can be used. Further, the oxide semiconductor film 103 can be formed by a sputtering method under a rare gas (typically argon) atmosphere, an oxygen atmosphere, or an atmosphere containing a rare gas (typically argon) and oxygen. In the case of using a sputtering method, a target containing $SiO_2$ at 2 wt % to 10 wt % both inclusive may be used for depositing the film. The filling rate of the oxide semiconductor target including In, Ga, and Zn is greater than or equal to 90% and less than or equal to 100%, preferably greater than or equal to 95% and less than or equal to 99.9%. With the use of the oxide semiconductor target with a high filling rate, a dense oxide semiconductor film is formed.

The oxide semiconductor film 103 is formed over the substrate 100 in such a manner that the substrate is held in the treatment chamber maintained at reduced pressure, a sputtering gas from which hydrogen and moisture have been removed is introduced into the treatment chamber while moisture remaining therein is removed, and metal oxide is used as a target. At that time, the substrate may be heated at higher than or equal to 100° C. and lower than or equal to 600° C., preferably higher than or equal to 200° C. and lower than or equal to 400° C. Film deposition may be performed while the substrate is heated, whereby the concentration of an impurity contained in the oxide semiconductor film deposited can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. An evacuation unit may be a turbo pump provided with a cold trap. In the deposition chamber which is evacuated with the cryopump, for example, a hydrogen atom, a compound containing a hydrogen atom, such as water ($H_2O$), (far preferably, also a compound containing a carbon atom), and the like are removed, whereby the concentration of an impurity in the oxide semiconductor film deposited in the deposition chamber can be reduced.

As one example of the deposition condition, the following can be employed: the distance between the substrate and the target is 100 mm, the pressure is 0.6 Pa, the direct-current (DC) power is 0.5 kW, and the atmosphere is an oxygen atmosphere (the proportion of the oxygen flow rate is 100%). Note that a pulsed direct-current (DC) power source is preferable because powder substances (also referred to as particles) generated in film deposition can be reduced and the film thickness can be uniform. The oxide semiconductor film preferably has a thickness greater than or equal to 5 nm and less than or equal to 30 nm. Since appropriate thickness depends on an oxide semiconductor material used, the thickness can be determined as appropriate depending on the material.

Further, in order that hydrogen, a hydroxyl group, and moisture may be contained in the oxide semiconductor film 103 as little as possible, it is preferable that the substrate 100 on which the process up to and including the step of forming the gate insulating film 102 is already performed be preheated in a preheating chamber of a sputtering apparatus as pretreatment for film formation so that impurities such as hydrogen and moisture adsorbed to the substrate 100 are removed and exhausted. The temperature of the preheating is higher than or equal to 100° C. and lower than or equal to 400° C., preferably higher than or equal to 150° C. and lower than or equal to 300° C. As an exhaustion unit provided in the preheating chamber, a cryopump is preferable. This preheating treatment can be omitted. Further, this preheating may be similarly performed on the substrate 100 on which the process up to and including the step of forming a source electrode 111 and a drain electrode 112 is already performed, before the formation of an insulating film 113.

Examples of a sputtering method include an RF sputtering method in which a high-frequency power source is used for a sputtering power supply, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as a deposition method using a sputtering method, a reactive sputtering method in which a target substance and a sputtering gas component are chemically reacted with each other during deposition to form a thin compound film thereof, or a bias sputtering method in which a voltage is also applied to a substrate during deposition can be used.

The gate insulating film 102 and the oxide semiconductor film 103 may be formed successively without exposure to air. Successive film formation without exposure to air makes it possible to obtain each interface between stacked layers, which is not contaminated by atmospheric components or impurity elements floating in air, such as water, hydrocarbon, or the like. Accordingly, variation in characteristics of the transistor can be reduced.

Figure 1B:
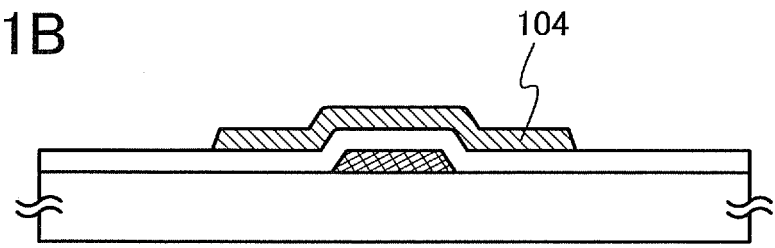

Next, as illustrated in FIG. 1B, the oxide semiconductor film 103 is processed (patterned) into an appropriate shape by etching or the like, whereby an island-shaped oxide semiconductor film 104 is formed over the gate insulating film 102 so as to overlap with the gate electrode 101.

A resist mask for forming the island-shaped oxide semiconductor film 104 may be formed by an inkjet method. Formation of the resist mask by an inkjet method needs no photomask; thus, manufacturing costs can be reduced.

In the case where a contact hole is formed in the gate insulating film 102, a step of forming the contact hole can be performed at the time of formation of the island-shaped oxide semiconductor film 104.

The etching for forming the island-shaped oxide semiconductor film 104 may be dry etching, wet etching, or both dry etching and wet etching. As the etching gas for the dry etching, a gas containing chlorine (chlorine-based gas such as chlorine ($Cl_2$), boron chloride ($BCl_3$), silicon tetrachloride ($SiCl_4$), or carbon tetrachloride ($CCl_4$)) is preferably used. Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into an appropriate shape, the etching condition (the amount of electric power applied to a coil-shaped electrode, the amount of electric power applied to an electrode on a substrate side, the temperature of the electrode on the substrate side, or the like) is adjusted as appropriate.

As an etchant used for the wet etching, a mixed solution of phosphoric acid, acetic acid, and nitric acid, organic acid such as citric acid or oxalic acid, or the like can be used. Alternatively, ITO-07N (manufactured by Kanto Chemical Co., Inc.) may be used. The etchant after the wet etching is removed together with the etched materials by cleaning. The waste liquid including the etchant and the material etched off may be purified and the material may be reused. A material such as indium included in the oxide semiconductor film may be collected from the waste liquid after the etching and reused, whereby the resources can be efficiently used and the costs can be reduced.

It is preferable that reverse sputtering be performed before the formation of a conductive film in a subsequent step so that a resist residue or the like that attaches onto surfaces of the island-shaped oxide semiconductor film 104 and the gate insulating film 102 is removed.

Figure 1C:
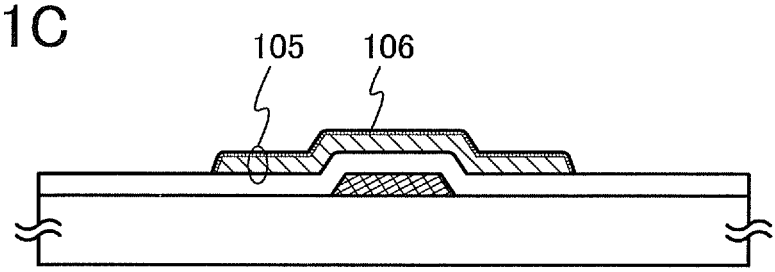

Next, first heat treatment is performed on the oxide semiconductor film 104 in a reduced-pressure atmosphere, an inert gas atmosphere such as a nitrogen atmosphere or a rare gas atmosphere, an oxygen gas atmosphere, or an ultra dry air atmosphere (in air whose moisture content is less than or equal to 20 ppm (dew point conversion, −55° C.), preferably less than or equal to 1 ppm, far preferably less than or equal to 10 ppb in the case where measurement is performed using a dew-point meter of a cavity ring-down laser spectroscopy (CRDS) system). By the first heat treatment on the oxide semiconductor film 104, an oxide semiconductor film 105 in which moisture or hydrogen is eliminated is formed as shown in FIG. 1C. Specifically, heat treatment may be performed at a temperature higher than or equal to 500° C. and lower than or equal to 850° C. (or a temperature lower than or equal to a strain point of a glass substrate), preferably a temperature higher than or equal to 550° C. and lower than or equal to 750° C. For example, heat treatment may be performed at 600° C. for a period longer than or equal to 3 minutes and shorter than or equal to 6 minutes. Since dehydration or dehydrogenation can be performed in a short time with the RTA method, the first heat treatment can be performed even at a temperature over the strain point of a glass substrate. In this embodiment, heat treatment is performed on the oxide semiconductor film 104 at a substrate temperature of 600° C. for 6 minutes in a nitrogen atmosphere with the use of an electrical furnace that is one of heat treatment apparatuses, and then, the oxide semiconductor film is not exposed to the air and water and hydrogen are prevented from entering the oxide semiconductor film, so that the oxide semiconductor film 105 is obtained.

The heat treatment apparatus is not limited to an electrical furnace, and may be provided with a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA by which the substrate is moved into an inert gas heated to a high temperature as high as 650° C. to 700° C., heated for several minutes, and moved out of the inert gas heated to the high temperature may be performed. GRTA enables high-temperature heat treatment for a short period of time.

It is preferable that in the heat treatment, moisture, hydrogen, or the like be not contained in nitrogen or a rare gas such as helium, neon, or argon. The purity of nitrogen or the rare gas such as helium, neon, or argon which is introduced into the heat treatment apparatus is preferably set to be 6N (99.9999%) or higher, far preferably 7N (99.99999%) or higher (that is, the impurity concentration is preferably 1 ppm or lower, far preferably 0.1 ppm or lower).

Thus, as shown in FIG. 1C, by the first heat treatment, a superficial portion of the island-shaped oxide semiconductor film 105 is made to have a crystal region 106. The crystal region 106 includes a so-called nanocrystal with a grain size greater than or equal to 1 nm and less than or equal to 20 nm, and the other portion of the island-shaped oxide semiconductor film 105 other than the crystal region 106 is amorphous or includes a mixture of an amorphous state and microcrystals where the microcrystals are provided in the amorphous state. Note that the above-described size of the nanocrystal is just an example, and the present invention is not construed as being limited to the above range. In the case where the oxide semiconductor film is an In—Ga—Zn—O-based oxide semiconductor film formed by a sputtering method using a target the atom ratio of metals of which is In:Ga:Zn=1:1:1, crystallization of the superficial portion of the oxide semiconductor film is likely to be further promoted as compared to the case where a target having a different atom ratio is used, so that the crystal region 106 is likely to be formed to a larger depth.

Figure 1D:
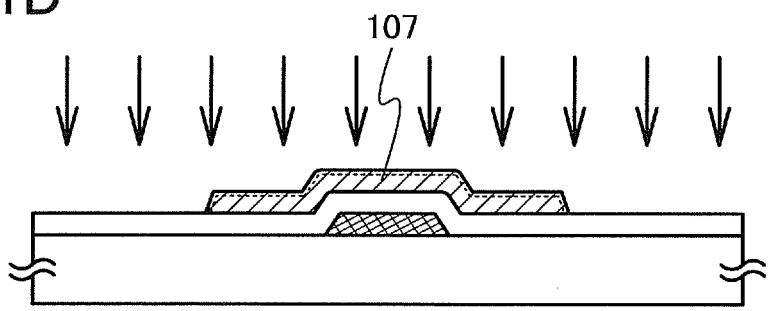

Next, as shown in FIG. 1D, oxygen is added into the oxide semiconductor film having the crystal region 106 in the superficial portion by an ion implantation method or an ion doping method. Oxygen is added into the oxide semiconductor film 105 by an ion implantation method, an ion doping method, or the like, so that an oxide semiconductor film 107 in which oxygen is added excessively is formed. By adding oxygen, a bond between a metal as a component of the oxide semiconductor and hydrogen or a bond between the metal and a hydroxyl group is cut and the hydrogen or the hydroxyl group is reacted with oxygen to produce water; this leads to easy elimination of hydrogen or a hydroxyl group that is an impurity, in the form of water by second heat treatment performed later.

In an ion implantation method, a source gas is made into plasma, ion species included in this plasma are extracted and mass-separated, ion species having predetermined mass are accelerated, and an object is irradiated with the accelerated ion species in the form of an ion beam. In an ion doping method, a source gas is made into plasma, ion species are extracted from this plasma by an operation of a predetermined electric field, the extracted ion species are accelerated without mass separation, and an object is irradiated with the accelerated ion species in the form of an ion beam. When the addition of oxygen is performed using an ion implantation method involving mass-separation, an impurity such as a metal element can be prevented from being added into the oxide semiconductor film. On the other hand, an ion doping method enables ion-beam irradiation to a larger area than an ion implantation method, and therefore, when the addition of oxygen is performed using an ion doping method, the takt time can be shortened.

In the case where an oxygen gas is used and oxygen is added by an ion implantation method, the acceleration voltage may be set in the range of 5 kV to 100 kV both inclusive and the dosage may be set in the range of $1\times10^{13}$ ions/cm$^2$ to $1\times10^{16}$ ions/cm$^2$ both inclusive.

Heat treatment may be performed on the substrate provided with the oxide semiconductor film 105 at a temperature higher than or equal to 500° C. and lower than or equal to 850° C. (or a temperature lower than or equal to a strain point of a glass substrate), preferably a temperature higher than or equal to 550° C. and lower than or equal to 750° C. while the addition of oxygen into the oxide semiconductor film 105 is performed by an ion implantation method.

Crystals included in the crystal region 106 formed in the superficial portion of the oxide semiconductor film 105 are damaged by addition of oxygen using an ion implantation method, an ion doping method, or the like. Therefore, the crystallinity of a superficial portion of the oxide semiconductor film 107 is lower than that of the crystal region 106 of the oxide semiconductor film 105 before the oxygen addition, and the superficial portion of the oxide semiconductor film 107 may be in a similar state to the amorphous region of the oxide semiconductor film 105 depending on the dosage of oxygen.

Figure 1E:
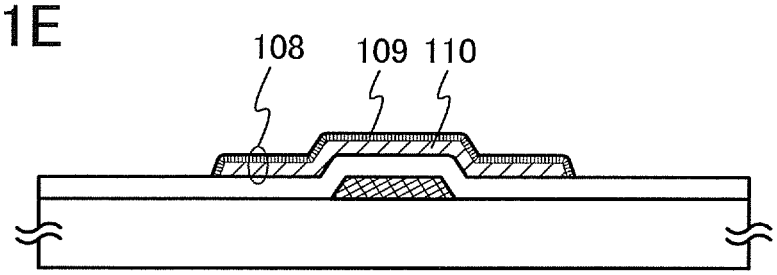

Next, second heat treatment is performed. The second heat treatment can be performed in a similar condition to the first heat treatment. Specifically, heat treatment may be performed in a reduced-pressure atmosphere, an inert gas atmosphere such as a nitrogen atmosphere or a rare gas atmosphere, an oxygen gas atmosphere, or an ultra dry air atmosphere (in air whose moisture content is less than or equal to 20 ppm (dew point conversion, −55° C.), preferably less than or equal to 1 ppm, far preferably less than or equal to 10 ppb in the case where measurement is performed using a dew-point meter of a cavity ring-down laser spectroscopy (CRDS) system). In the case where heat treatment is performed by RTA (Rapid Thermal Anneal), for example, heat treatment may be performed at 600° C. for a period longer than or equal to 3 minutes and shorter than or equal to 6 minutes. Since dehydration or dehydrogenation can be performed in a short time with the RTA method, the second heat treatment can be performed even at a temperature over the strain point of a glass substrate. In this embodiment, heat treatment is performed at a substrate temperature of 600° C. for 6 minutes in a nitrogen atmosphere with the use of an electrical furnace that is one of heat treatment apparatuses, and then, the oxide semiconductor film is not exposed to the air and water and hydrogen are prevented from entering the oxide semiconductor film, so that an oxide semiconductor film 108 is obtained as shown in FIG. 1E. The heat treatment may be performed plural times after the island-shaped oxide semiconductor film 108 is formed.

According to one embodiment of the present invention, the bond between a metal as a component of the oxide semiconductor and hydrogen or a hydroxyl group is cut and the hydrogen or the hydroxyl group is made to react with oxygen to produce water by adding oxygen in the oxide semiconductor film 105. Thus, an impurity such as hydrogen or a hydroxyl group left in the film can be easily eliminated in the form of water by the second heat treatment after the oxygen addition. The island-shaped oxide semiconductor film 108 formed through the second heat treatment is more i-type (intrinsic) or closer to i-type than the oxide semiconductor film 105 after the first heat treatment because impurities such as moisture or hydrogen left even after the first heat treatment are removed. Impurities such as moisture or hydrogen are eliminated, and the island-shaped oxide semiconductor film becomes an i-type (intrinsic) semiconductor or a substantially i-type semiconductor; therefore, deterioration of characteristics of the transistor due to the impurities, such as shifts in threshold voltage, can be prevented from being promoted and off-state current can be reduced.

Further, when an oxide semiconductor containing an impurity is subjected to a gate bias-temperature stress test (BT test) for 12 hours under conditions that the temperature is 85° C. and the voltage applied to the gate is $2\times10^6$ V/cm, a bond between the impurity and a main component of the oxide semiconductor is cut by a high electric field (B: bias) and a high temperature (T: temperature), and a generated dangling bond induces drift of threshold voltage ($V_{th}$). However, in the above-described manner, by improving the interfacial characteristics between the gate insulating film and the oxide semiconductor film and removing impurities, particularly hydrogen, water, and the like, in the oxide semiconductor film as much as possible, a transistor which remains stable even with respect to the BT test can be obtained.

The heat treatment apparatus is not limited to an electrical furnace, and may be provided with a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the second heat treatment, GRTA by which the substrate is moved into an inert gas heated to a high temperature as high as 650° C. to 700° C., heated for several minutes, and moved out of the inert gas heated to the high temperature may be performed. GRTA enables high-temperature heat treatment for a short period of time.

It is preferable that in the heat treatment, moisture, hydrogen, or the like be not contained in nitrogen or a rare gas such as helium, neon, or argon. The purity of nitrogen or the rare gas such as helium, neon, or argon which is introduced into the heat treatment apparatus is preferably set to be 6N (99.9999%) or higher, far preferably 7N (99.99999%) or higher (that is, the impurity concentration is preferably 1 ppm or lower, far preferably 0.1 ppm or lower).

However, in the oxide semiconductor film 105, an oxygen defect is generated in addition to removal of water or hydrogen by the first heat treatment, and oxygen can be sufficiently supplied to the oxygen-deficient oxide semiconductor film by the addition of oxygen by an ion implantation method, an ion doping method, or the like. Further, since hydrogen or water removed by the first heat treatment is not a component element of the oxide semiconductor but a so-called impurity and oxygen added later is one component element of the oxide semiconductor, a structure which satisfies the stoichiometric composition ratio can be obtained. Therefore, by performing the second heat treatment after the first heat treatment and the addition of oxygen, the damaged crystal region 106 can be repaired, and crystal growth is promoted from the superficial portion of the oxide semiconductor film 108 to a larger depth of the oxide semiconductor film, so that a crystal region 109 which is expanded to a deeper portion of the oxide semiconductor film 108 as shown in FIG. 1E can be formed. Further, crystal growth is further promoted by this second heat treatment as compared to the first heat treatment, so that in the crystal region 109, crystal grains are adjacent to each other and metal elements each of which is a component element of the oxide semiconductor are continuous, that is, continuously in contact with each other between crystal grains which are adjacent to each other.

The crystal region 109 is described below in more detail. C-axes of crystals of the crystal region 109 in the superficial portion are aligned in a direction which is almost perpendicular to the top surface of the oxide semiconductor film 108 and adjacent to each other. For example, in the case of using an In—Ga—Zn—O-based oxide semiconductor material, in the crystal region 109, the c-axes of crystals of $InGaZnO_4$ are oriented in a direction which is almost perpendicular to the top surface of the oxide semiconductor film 108.

The crystals of $InGaZnO_4$ include any of In, Ga, and Zn, and can be considered to have a stacked-layer structure of layers parallel to an a-axis and a b-axis. That is, the crystals of $InGaZnO_4$ have a structure in which a first layer including In, a second layer including In, and a third layer including In are stacked in a c-axis direction.

Since electrical conductivity of the crystals of $InGaZnO_4$ are controlled mainly by In, electrical characteristics of the first layer including In to the third layer including In in a planar direction parallel to the a-axis and the b-axis are preferable. This is because one of a 5 s orbital of In is overlapped with a 5 s orbital of which are adjacent to In in at least one of the first to third layers including In, so that a carrier path is formed.

When such crystals are oriented, an effect on electrical characteristics of the oxide semiconductor film 108 also arises. Specifically, for example, electrical characteristics in a direction parallel to the top surface of the oxide semiconductor film 108 are improved. This is because the c-axes of the crystals of $InGaZnO_4$ are oriented in a direction almost perpendicular to the top surface of the oxide semiconductor film 108, and current flows in a planar direction parallel to the a-axis and the b-axis in $InGaZnO_4$ crystals.

Figure 4:
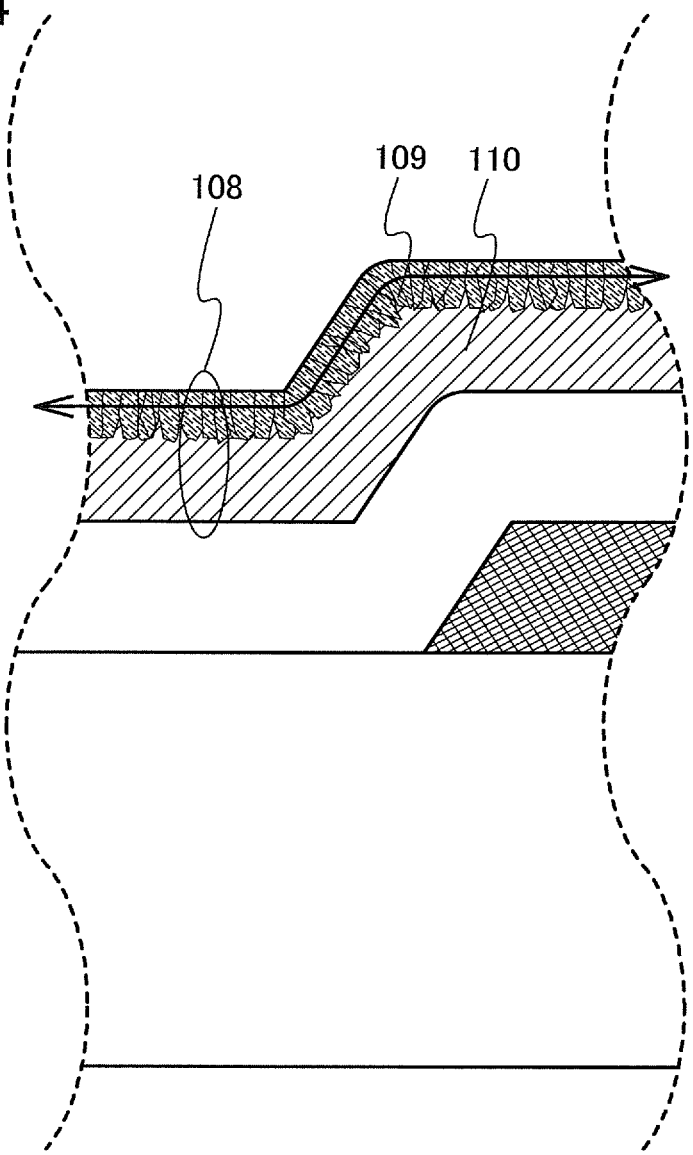
FIG. 4 is a cross-sectional view of a semiconductor device.

According to one embodiment of the present invention, in the crystal region, crystal grains adjacent to each other and metal elements each of which is a component element of the oxide semiconductor are continuous, that is, continuously in contact with each other between crystal grains which are adjacent to each other. Therefore, current is likely to easily flow in directions parallel to the a-axis and b-axis, denoted by arrows in FIG. 4, so that electrical characteristics in a direction parallel to the top surface of the oxide semiconductor film 108 can be further improved. The oxide semiconductor film 108 shown in FIG. 1E includes an amorphous region 110 which is mainly amorphous and the crystal region 109 formed in the superficial portion of the oxide semiconductor film 108.

The crystal structure of the crystal region 109 is not limited to the above-described structure, and the crystal region 109 may include a crystal having another structure. For example, in the case of using an In—Ga—Zn—O-based oxide semiconductor material, crystals of $In_2Ga_2ZnO_7$, $InGaZn_5O_8$, or the like may be included in addition to crystals of $InGaZnO_4$ crystals. Needless to say, the case where the crystals of $InGaZnO_4$ exist in the whole crystal region 109 is more effective and more preferable.

As described above, the oxide semiconductor film 108 has the crystal region 109 in the superficial portion, whereby favorable electrical characteristics can be achieved. In particular, in the case where the crystal region 109 includes $InGaZnO_4$ crystals c-axes of which are oriented in a direction almost perpendicular to the top surface of the oxide semiconductor film 108, the carrier mobility in the superficial portion of the oxide semiconductor film 108 is increased by the electrical characteristics of the $InGaZnO_4$ crystals. Thus, the field-effect mobility of the transistor in which the oxide semiconductor film 108 is included is increased, which leads to favorable electrical characteristics of the transistor.

Further, the crystal region 109 is more stable than the amorphous region 110; therefore, when the crystal region 109 is included in the superficial portion of the oxide semiconductor film 108, the entry of impurities (e.g., hydrogen, water, a hydroxy group, hydride, or the like) into the amorphous region 110 can be suppressed. Thus, the reliability of the oxide semiconductor film 108 can be improved.

Through the above-described process, the concentration of hydrogen in the oxide semiconductor film can be reduced and the oxide semiconductor film can be highly purified. Thus, the oxide semiconductor film can be stabilized. In addition, heat treatment at a temperature which is lower than or equal to the glass transition temperature makes it possible to form an oxide semiconductor film with a wide band gap in which carrier density is extremely low. Therefore, a transistor can be manufactured using a large-sized substrate, so that mass productivity can be increased. In addition, by using the oxide semiconductor film whose hydrogen concentration is reduced and which is highly purified, it is possible to form a transistor with a high withstand voltage, less short-channel effect, and a high on/off ratio.

The amorphous region 110 is mainly an amorphous oxide semiconductor film. The word "mainly" means, for example, a state where the occupancy is 50% or more, and means a state where the amorphous region 110 is occupied by the amorphous oxide semiconductor film at an occupancy of 50% or more by volume (or weight) in this case. In other words, the amorphous region in some cases includes crystals of an oxide semiconductor film other than an amorphous oxide semiconductor film, and the occupancy thereof is preferably less than 50% by volume (or weight). However, the occupancy is not limited to the above.

In the case where the In—Ga—Zn—O-based oxide semiconductor film is used as a material of the oxide semiconductor film, the composition of the above-described amorphous region 110 is preferably set so that a Zn content (atomic %) is larger than an In or Ga content (atomic %). Such a composition makes it easy to form the crystal region 109 with a predetermined composition.

Although the manufacturing method in which the oxide semiconductor film 103 is processed into a predetermined shape to form the island-shaped oxide semiconductor film 104, and after that, the first heat treatment, the addition of oxygen, and the second heat treatment are performed is described in Embodiment 1, the present invention is not limited to this structure. The first heat treatment, the addition of oxygen, and the second heat treatment may be performed on the oxide semiconductor film 103 before being processed into the island-shaped oxide semiconductor film 104, and after that, the oxide semiconductor film may be processed into a predetermined shape to form the island-shaped oxide semiconductor film 104. Alternatively, the first heat treatment may be performed on the oxide semiconductor film 103, and after that, the oxide semiconductor film may be processed into a predetermined shape to form the island-shaped oxide semiconductor film, and then, the addition of oxygen and the second heat treatment may be performed on the island-shaped oxide semiconductor film. Further alternatively, the first heat treatment and the addition of oxygen may be performed on the oxide semiconductor film 103, and after that, the oxide semiconductor film may be processed into a predetermined shape to form the island-shaped oxide semiconductor film, and then, the second heat treatment may be performed on the island-shaped oxide semiconductor film.

Figure 2A:
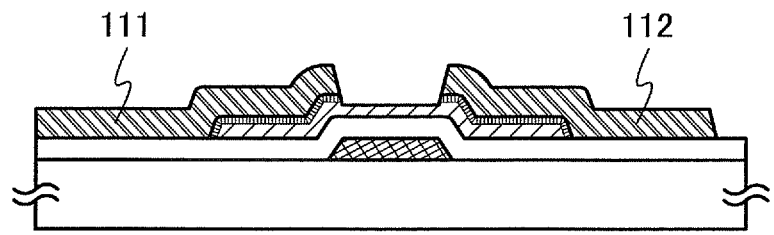
FIGS. 2A to 2C are views illustrating a method for manufacturing a semiconductor device.

Next, as shown in FIG. 2A, a conductive film which forms a source electrode and a drain electrode (including a wiring formed from the same layer as the source electrode or the drain electrode) is formed over the gate insulating film 102 and the oxide semiconductor film 108 and is patterned to form the source electrode 111 and the drain electrode 112. The conductive film may be formed by a sputtering method or a vacuum evaporation method. As a material of the conductive film to be the source and drain electrodes (including the wiring formed from the same layer as the source or the drain electrode), there are an element selected from Al, Cr, Cu, Ta, Ti, Mo, or W; an alloy including any of the above elements; an alloy film containing a combination of any of these elements; and the like. A structure may be employed in which a film of a high-melting point metal such as Cr, Ta, Ti, Mo, or W and a metal film of Al, Cu, or the like are stacked. By using an Al material to which an element which prevents generation of hillocks or whisker in an Al film, such as Si, Ti, Ta, W, Mo, Cr, Nd, Sc, or Y is added, heat resistance can be improved.

The conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given.

Alternatively, the conductive film to be the source and drain electrodes (including the wiring formed from the same layer as the source or the drain electrode) may be formed using a conductive metal oxide. As a conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or the metal oxide material to which silicon or silicon oxide is added can be used.

In the case where heat treatment is performed after the deposition of the conductive film, it is preferable that the conductive film have heat resistance high enough to withstand the heat treatment.

Then, a resist mask is formed over the conductive film, and selective etching is performed, so that the source electrode 111 and the drain electrode 112 are formed. After that, the resist mask is removed.

Ultraviolet, a KrF laser beam, or an ArF laser beam is used for light exposure for forming the resist mask in a photolithography step. The channel length L of a transistor to be formed later is determined by a pitch between a lower end of the source electrode and a lower end of the drain electrode that are adjacent to each other over the oxide semiconductor film 108. Note that when light exposure is performed in the case where the channel length L is shorter than 25 nm, extreme ultraviolet with extremely short wavelengths of several nanometers to several tens of nanometers is used for light exposure for forming the resist mask in the photolithography step. Light exposure with extreme ultraviolet leads to a high resolution and a large depth of focus. Thus, the channel length L of the transistor can be greater than or equal to 10 nm and less than or equal to 1000 nm and the operation speed of a circuit can be increased and furthermore the value of off-state current is extremely small, so that low power consumption can be achieved.

Each material and etching conditions are adjusted as appropriate so that the oxide semiconductor film 108 is not removed in etching of the conductive film as much as possible.

In this embodiment, a titanium film is used as the conductive film, a solution (an ammonia hydrogen peroxide mixture) containing ammonia and hydrogen peroxide is used, and the conductive film is wet-etched, whereby the source electrode 111 and the drain electrode 112 are formed. As the ammonia hydrogen peroxide mixture, specifically, a solution in which oxygenated water of 31 wt %, ammonia water of 28 wt %, and water are mixed at a volume ratio of 5:2:2 is used. Alternatively, dry etching may be performed on the conductive film 105 with the use of a gas containing chlorine ($Cl_2$), boron chloride ($BCl_3$), or the like.

In the patterning for forming the source electrode 111 and the drain electrode 112, an exposed portion of the island-shaped oxide semiconductor film 108 may be partly etched so that a groove (a recessed portion) is formed in the island-shaped oxide semiconductor film 108. The resist mask used for forming the source electrode 111 and the drain electrode 112 may be formed by an inkjet method. Formation of the resist mask by an inkjet method needs no photomask; thus, manufacturing costs can be reduced.

In order to reduce the number of photomasks and steps in a photolithography step, etching may be performed with the use of a resist mask formed using a multi-tone mask which is a light-exposure mask through which light is transmitted so as to have a plurality of intensities. Such a resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by one multi-tone mask. Thus, the number of light-exposure masks can be reduced and the number of corresponding photolithography steps can be also reduced, whereby simplification of a process can be realized.

The source electrode 111 and the drain electrode 112 are in contact with the crystal region 109 of the oxide semiconductor film 108. Owing to this contact between the highly conductive crystal region 109 and each of the source electrode 111 and the drain electrode 112, the contact resistance between each of the source electrode 111 and the drain electrode 112 and the oxide semiconductor film 108 can be reduced, so that the on-state current of the transistor formed can be increased.

Next, plasma treatment is performed thereon, using a gas such as $N_2O$, $N_2$, or Ar. By the plasma treatment, adsorbed water or the like which attaches to an exposed surface of the oxide semiconductor film is removed. Plasma treatment may be performed using a mixture gas of oxygen and argon as well.

Figure 2B:
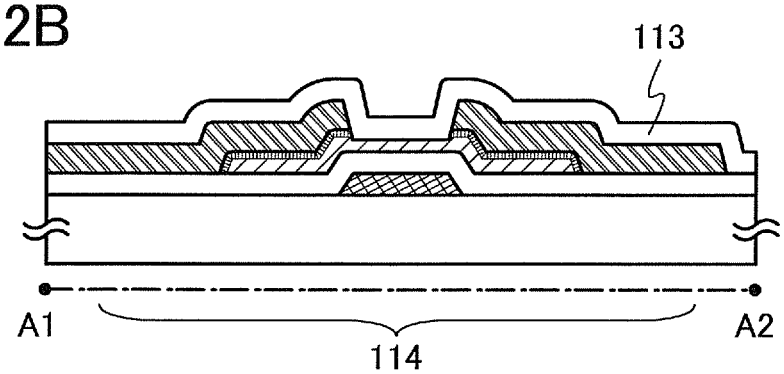

After the plasma treatment, as shown in FIG. 2B, an insulating film 113 is formed to cover the source electrode 111, the drain electrode 112, and the oxide semiconductor film 108. The insulating film 113 preferably includes no impurities such as moisture or hydrogen as much as possible, and may be formed using a single-layer insulating film or a plurality of insulating films stacked. When hydrogen is contained in the insulating film 113, entry of hydrogen to the oxide semiconductor film or extraction of oxygen contained in the oxide semiconductor film by hydrogen is caused; thus, a backchannel portion of the oxide semiconductor film might have low resistance (n-type conductivity) and a parasitic channel might be formed. Therefore, it is preferable that a formation method in which hydrogen is not used is employed in order to form the insulating film 113 containing as little hydrogen as possible. A material having a high barrier property is preferably used for the insulating film 113. For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having lower proportion of nitrogen than the insulating film having a high barrier property, such as a silicon oxide film or a silicon oxynitride film, is formed on the side close to the oxide semiconductor film 108. Then, the insulating film having a barrier property is formed so as to overlap with the source electrode 111, the drain electrode 112, and the oxide semiconductor film 108 with the insulating film having lower proportion of nitrogen provided therebetween. With the insulating film having a barrier property, impurities such as moisture or hydrogen can be prevented from entering the oxide semiconductor film 108, the gate insulating film 102, or the interface between the oxide semiconductor film 108 and another insulating film and the vicinity thereof. In addition, by forming the insulating film having lower proportion of nitrogen such as a silicon oxide film or a silicon oxynitride film so as to be in contact with the oxide semiconductor film 108, the insulating film formed using a material having a high barrier property can be prevented from being in contact with the oxide semiconductor film 108 directly.

In this embodiment, the insulating film 113 has a structure in which a silicon nitride film having a thickness of 100 nm formed by a sputtering method is stacked over a silicon oxide film having a thickness of 200 nm formed by a sputtering method. The substrate temperature in the film formation may be higher than or equal to room temperature and lower than or equal to 300° C. and is 100° C. in this embodiment.

After the insulating film 113 is formed, heat treatment may be performed. The heat treatment is performed in an inert gas atmosphere (nitrogen, helium, neon, argon, or the like) at a temperature, preferably, higher than or equal to 200° C. and lower than or equal to 400° C., for example, at a temperature higher than or equal to 250° C. and lower than or equal to 350° C. In this embodiment, heat treatment for 1 hour at 250° C. in a nitrogen atmosphere is performed. Alternatively, an RTA treatment for a short time at a high temperature may be performed before the formation of the source electrode 111 and the drain electrode 112 in a similar manner to the heat treatment performed on the oxide semiconductor film. By the heat treatment performed on the state where the insulating film 113 containing oxygen is in contact with an exposed region of the oxide semiconductor film 108, provided between the source electrode 111 and the drain electrode 112, oxygen is supplied to the oxide semiconductor film 108, whereby the region of the oxide semiconductor film 108, which is in contact with the insulating film 113 can be selectively made an oxygen-excess state. Consequently, a structure which satisfies the stoichiometric composition ratio can be obtained, and a channel formation region which overlaps with the gate electrode 101 becomes i-type, which leads to improvement of the electrical characteristics of the transistor and suppression of variation of the electrical characteristics. The timing of this heat treatment is not particularly limited as long as it is after the formation of the insulating film 113, and can be performed without increasing the number of manufacturing steps by doubling as another step such as a heat treatment for a formation of a resin film or a heat treatment for reduction of the resistance of a transparent conductive film.

Through the above-described process, a transistor 114 is formed.

Figure 2C:
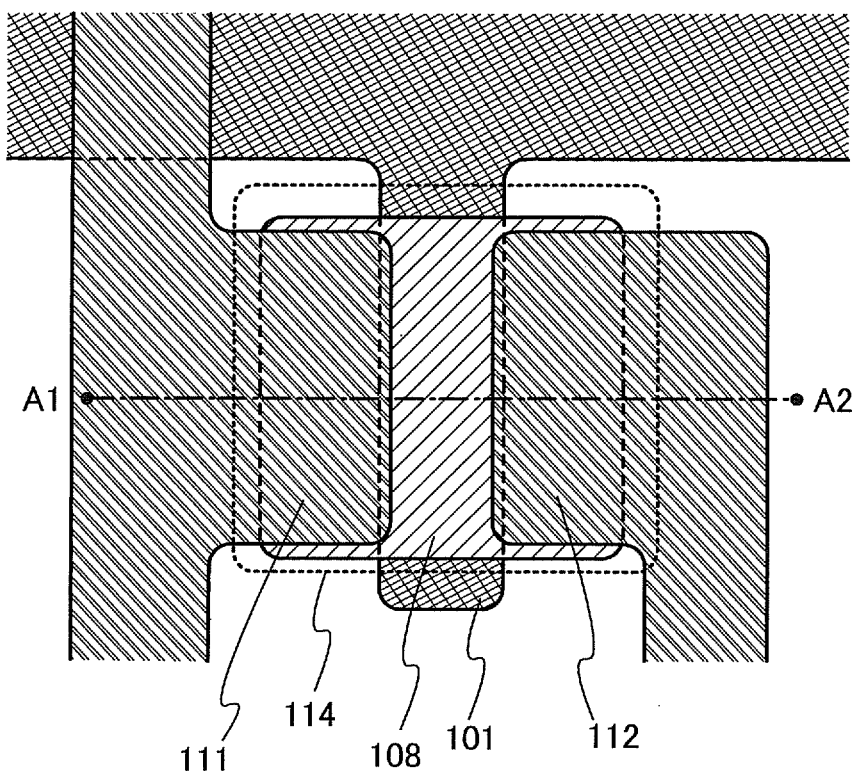

FIG. 2C is a top view of the transistor 114 shown in FIG. 2B. A cross-sectional view along dashed line A1-A2 in FIG. 2C corresponds to FIG. 2B.

The transistor 114 includes the gate electrode 101 formed over the substrate 100 having an insulating surface, the gate insulating film 102 over the gate electrode 101, the oxide semiconductor film 108 which overlaps with the gate electrode 101 over the gate insulating film 102, and a pair of the source electrode 111 and the drain electrode 112 formed over the oxide semiconductor film 108. The transistor 114 may include the insulating film 113 provided over the oxide semiconductor film 108. The transistor 114 shown in FIG. 2C has a channel-etched structure in which part of the oxide semiconductor film 108 is etched between the source electrode 111 and the drain electrode 112.

Although the transistor 114 is described as a single-gate transistor in Embodiment 1, a multi-gate transistor including a plurality of channel formation regions can be formed when needed.

The transistor 114 formed by the manufacturing method shown in FIGS. 1A to 1D and 2A to 2C has a structure in which part of the crystal region 109, which is provided between the source electrode 111 and the drain electrode 112 is removed by etching to expose the amorphous region 110. However, whether the amorphous region 110 is exposed or not depends on the depth to which the superficial portion where the crystal region 109 exists reaches from the top surface of the oxide semiconductor film 108 and the amount by which the top surface of the oxide semiconductor film 108 is etched in forming the source electrode 111 and the drain electrode 112.

Figure 11A:
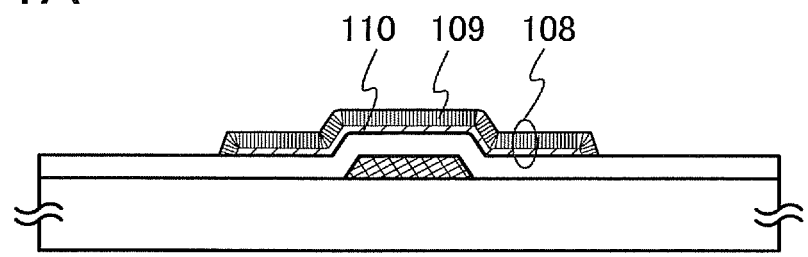
FIGS. 11A and 11B are cross-sectional views of a transistor.
Figure 11B:
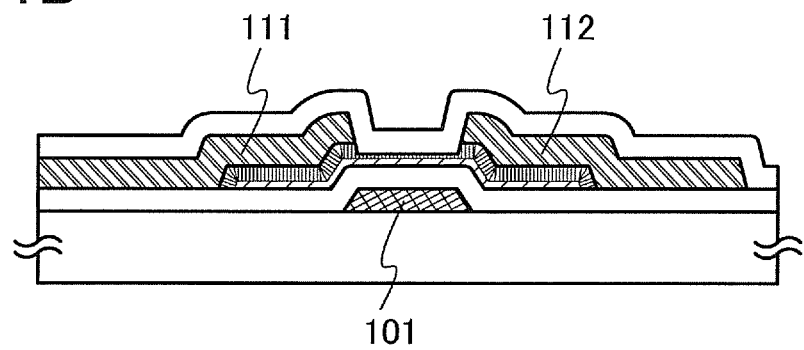

FIG. 11A is a cross-sectional view of the oxide semiconductor film 108 in the case where the oxide semiconductor film 108 includes the crystal region 109 and the amorphous region 110 and the superficial portion where the crystal region 109 exists reaches to a distance (depth) from the top surface of one half or more of the thickness of the oxide semiconductor film 108. In addition, FIG. 11B illustrates an example of a cross-sectional view of a channel-etched transistor using the oxide semiconductor film 108 shown in FIG. 11A. In FIG. 11B, the superficial portion where the crystal region 109 exists reaches to a larger depth from the top surface than that of the transistor 114 shown in shown in FIGS. 1A to 1D and 2A to 2C, and therefore, part of the crystal region 109 between the source electrode 111 and the drain electrode 112 is left.

One embodiment of the present invention may have a structure in which the amorphous region 110 is exposed between the source electrode 111 and the drain electrode 112 as shown in FIG. 2B or a structure in which the crystal region 109 is left as shown in FIG. 11B. However, in the case of a channel-etched transistor having a bottom-gate structure, in order to prevent formation of a parasitic channel in a back-channel portion of the oxide semiconductor film 108, which is far from the gate electrode 101, it is preferable that the back-channel portion is formed from the amorphous region 110 which has high resistance. Therefore, the on/off ratio of the transistor can be increased by employing the structure in which the amorphous region 110 is exposed between the source electrode 111 and the drain electrode 112 as shown in FIG. 2B rather than the structure as shown in FIG. 11B.

Figure 12A:
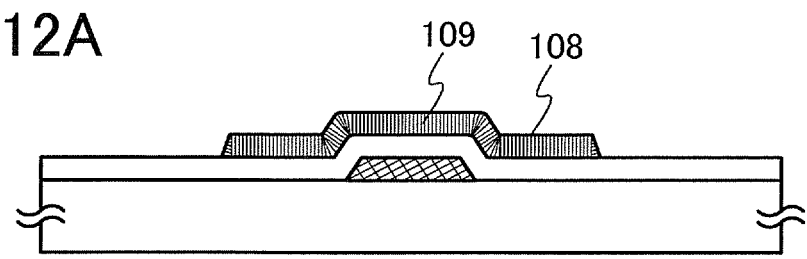
FIGS. 12A and 12B are cross-sectional views of a transistor.
Figure 12B:
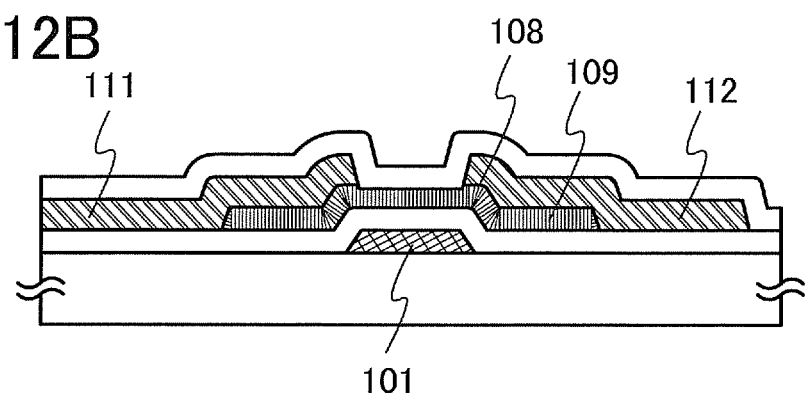

In accordance with further progress of crystallization of the oxide semiconductor film 108, the oxide semiconductor film 108 may be almost wholly occupied by the crystal region 109. FIG. 12A is a cross-sectional view of the oxide semiconductor film 108 in the case where the oxide semiconductor film 108 is almost wholly occupied by the crystal region 109. FIG. 12B illustrates an example of a cross-sectional view of a channel-etched transistor using the oxide semiconductor film 108 shown in FIG. 12A. In FIG. 12B, a region of the oxide semiconductor film 108, which overlaps with the gate electrode 101, that is, a channel formation region, is wholly formed from the crystal region 109. By employing the above-described structure, the carrier mobility in the channel formation region is increased, so that the field-effect mobility of the transistor is increased and favorable electrical characteristics can be achieved.

Figure 3A:
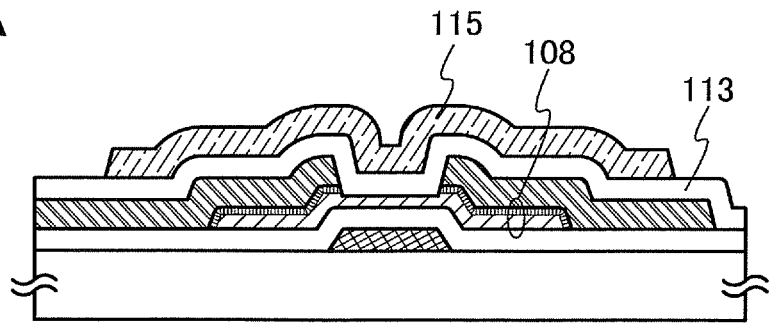
FIGS. 3A to 3C are views illustrating a method for manufacturing a semiconductor device.

Next, a conductive film may be formed over the insulating film 113 and may be patterned so that a back gate electrode 115 is formed so as to overlap with the oxide semiconductor film 108 as shown in FIG. 3A. The back gate electrode 115 can be formed using a material and a structure which are similar to those of the gate electrode 101 or the source electrode 111 or the drain electrode 112.

The thickness of the back gate electrode 115 is set to 10 nm to 400 nm, preferably 100 nm to 200 nm. In this embodiment, a conductive film in which a titanium film, an aluminum film, and a titanium film are stacked is formed. Then, a resist mask is formed by a photolithography method, and an unnecessary portion is removed by etching so that the conductive film is processed (patterned) into an appropriate shape; thus, the back gate electrode 115 is formed.

Figure 3B:
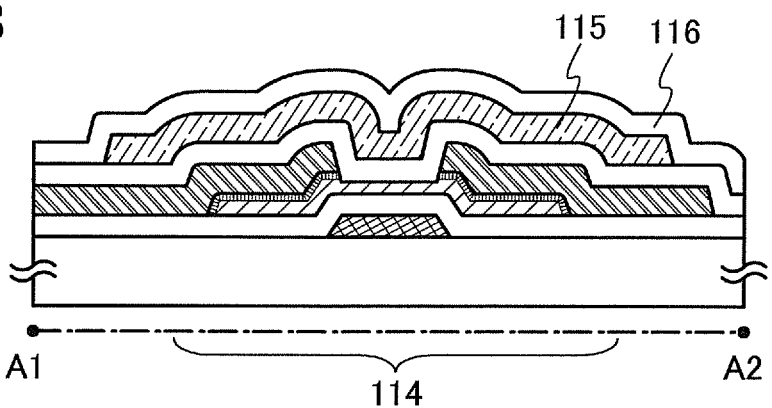

Next, as shown in FIG. 3B, an insulating film 116 is formed so as to cover the back gate electrode 115. The insulating film 116 is preferably formed using a material with a high barrier property that can prevent moisture, hydrogen, oxygen, and the like in an atmosphere from affecting the characteristics of the transistor 114. For example, the insulating film having a high barrier property can be formed to have a single-layer structure or a stacked-layer structure of a silicon nitride film, a silicon nitride oxide film, an aluminum nitride film, an aluminum nitride oxide film, or the like by a plasma CVD method, a sputtering method, or the like. In order to obtain an effect of a barrier property, the insulating film 116 is preferably formed to a thickness of 15 nm to 400 nm, for example.

In this embodiment, an insulating film with a thickness of 300 nm is formed by a plasma CVD method. The insulating film is formed under the following conditions: the flow rate of a silane gas is 4 sccm; the flow rate of dinitrogen monoxide ($N_2O$) is 800 sccm; and the substrate temperature is 400° C.

Figure 3C:
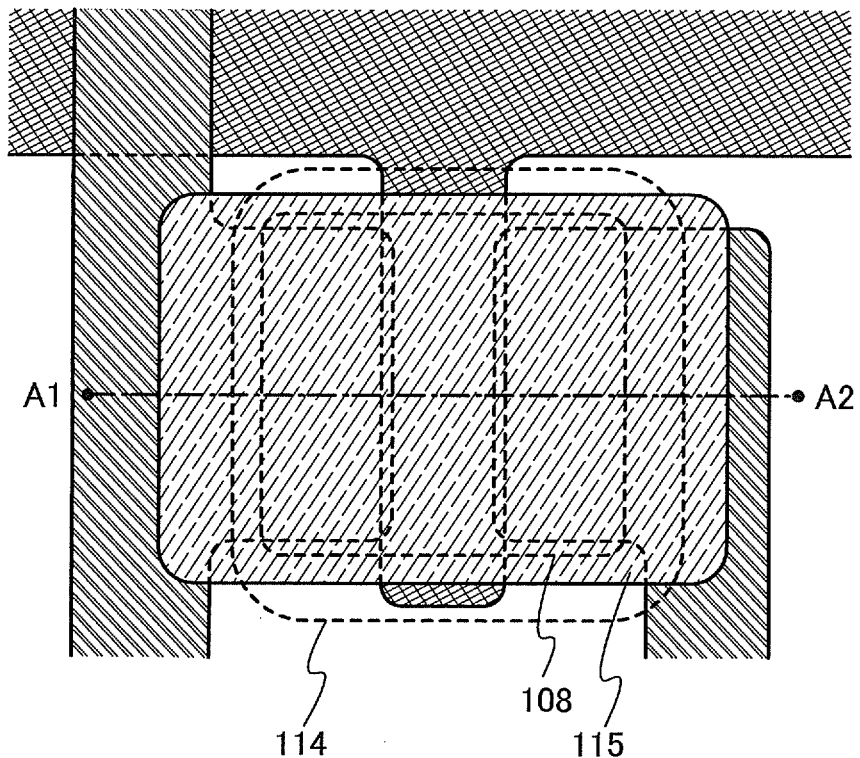

A top view of the semiconductor device shown in FIG. 3B is FIG. 3C. FIG. 3B is a cross-sectional view along dashed line A1-A2 in FIG. 3C.

Although the back gate electrode 115 covers the oxide semiconductor film 108 entirely in FIG. 3B, one embodiment of the present invention is not limited to this structure. The back gate electrode 115 overlaps with at least part of the channel formation region included in the oxide semiconductor film 108.

The back gate electrode 115 may be electrically insulated to be in a floating state, or may be in a state where the back gate electrode 115 is supplied with a potential. In the latter case, to the back gate electrode 115, a potential which is the same level as the gate electrode 101 may be applied, or a fixed potential such as ground may be applied. The level of the potential supplied to the back gate electrode 115 is controlled, whereby the threshold voltage of the transistor 114 can be controlled.

How characteristics of the transistor are influenced by high purification of the oxide semiconductor film by removal of impurities such as hydrogen, water, or the like contained in the oxide semiconductor film as in this embodiment is described below.

Figure 22:
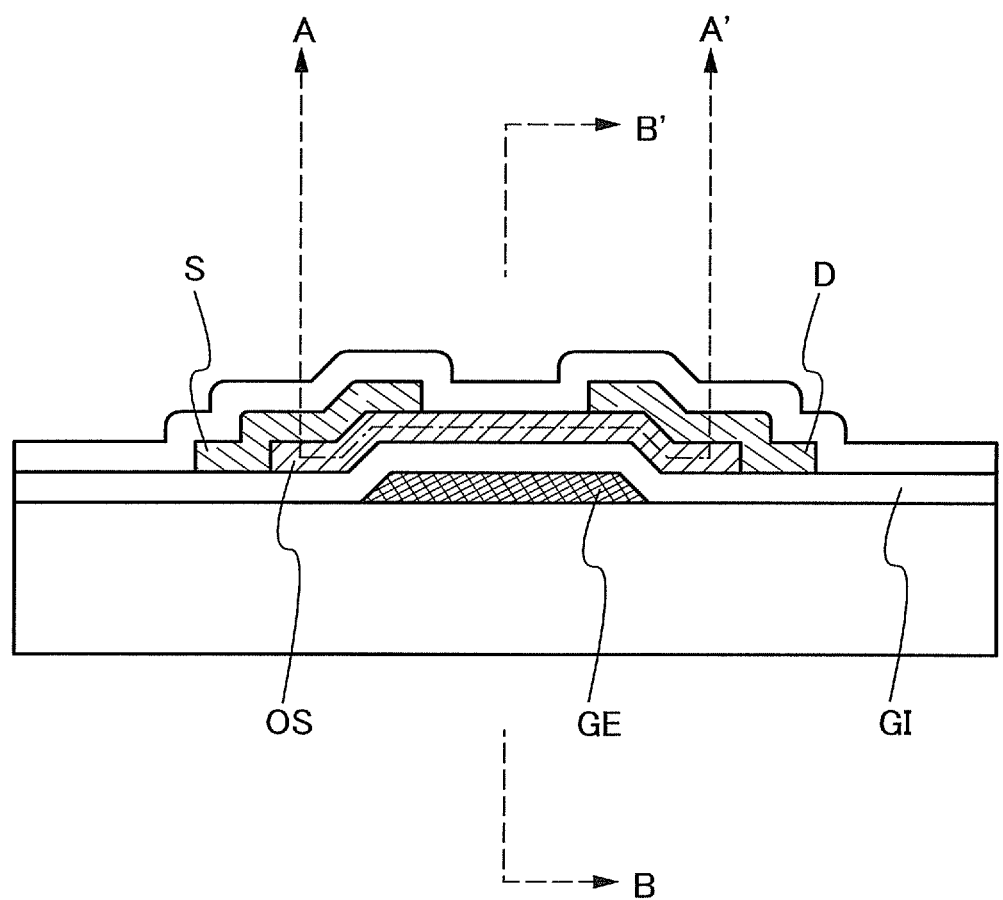
FIG. 22 is a longitudinal cross-sectional view of an inverted staggered transistor using an oxide semiconductor.

FIG. 22 is a cross-sectional view of an inverted staggered transistor including an oxide semiconductor. An oxide semiconductor film (OS) is provided over a gate electrode (GE) with a gate insulating film (GI) provided therebetween, and a source electrode (S) and a drain electrode (D) are provided thereover.

Figure 23:
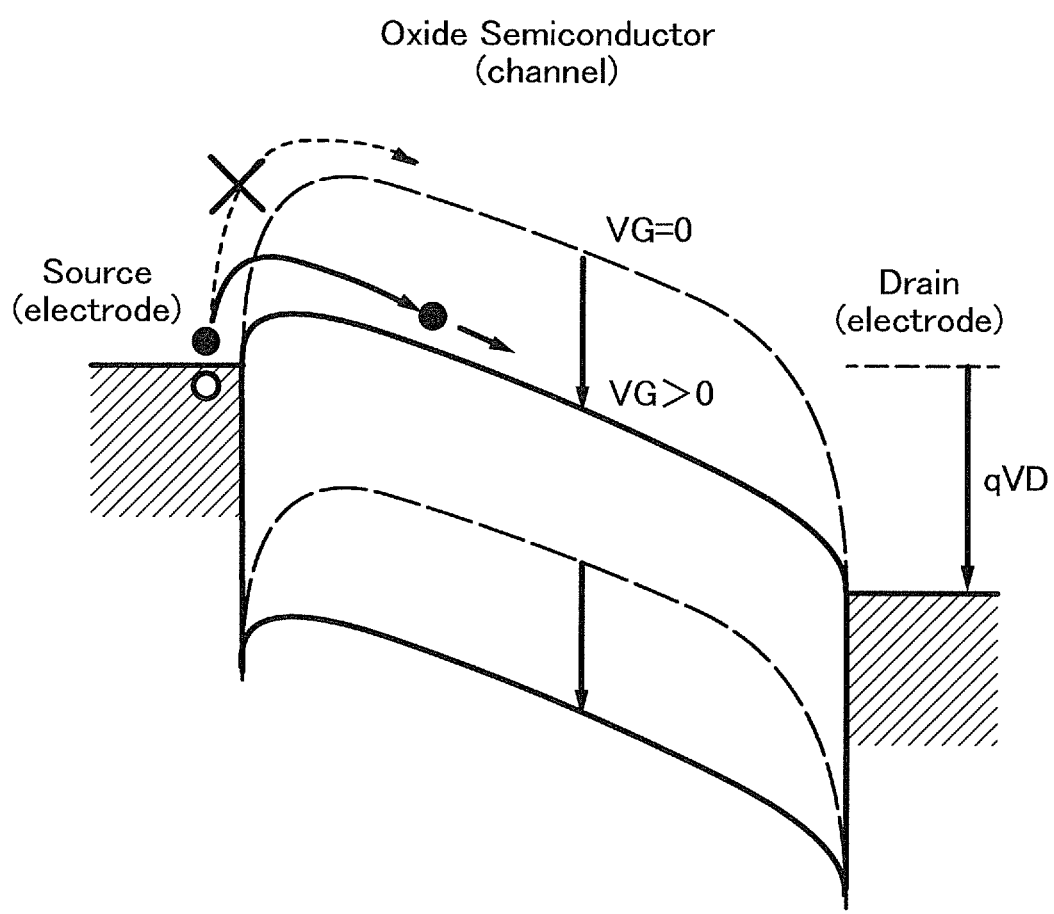
FIG. 23 is an energy band diagram (an schematic diagram) along the section A-A' of FIG. 22.

FIG. 23 is an energy band diagram (schematic diagram) along section A-A' in FIG. 22. In FIG. 23, a black circle (●) and a white circle (○) represent an electron and a hole and have electric charges (−q, +q), respectively. With a positive voltage (VD>0) applied to the drain electrode, the dashed line shows the case where no voltage is applied to the gate electrode (VG=0) and the solid line shows the case where a positive voltage is applied to the gate electrode (VG>0). In the case where no voltage is applied to the gate electrode, carriers (electrons) are not injected to the oxide semiconductor side from an electrode because of high potential barrier, so that a current does not flow, which means an off state. On the other hand, when a positive voltage is applied to the gate electrode, potential barrier is lowered, and thus a current flows, which means an on state.

Figure 24A:
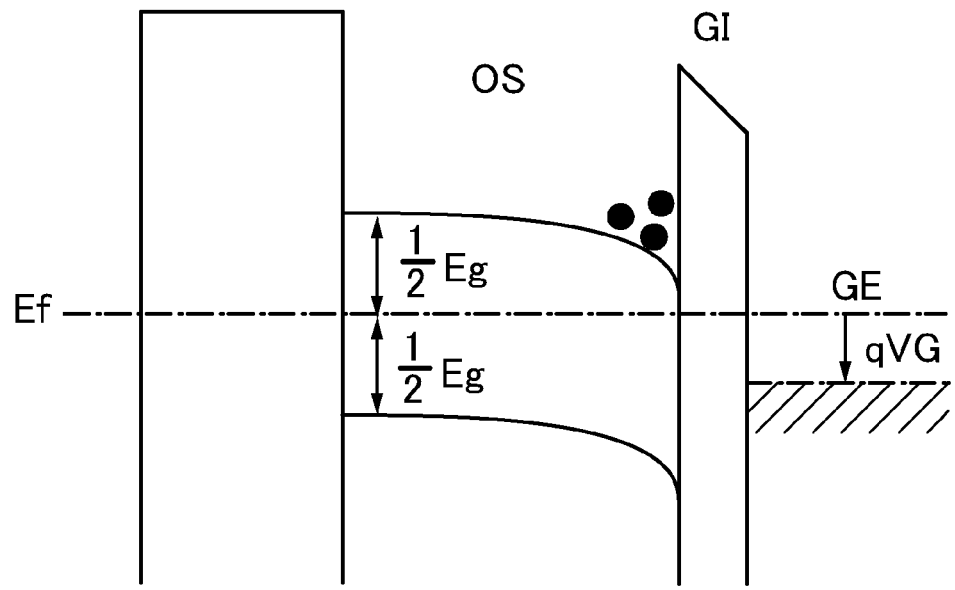
FIG. 24A illustrates the state where a positive potential (VG>0) is applied to a gate electrode (GE) and FIG. 24B illustrates the state where a negative potential (VG<0) is applied to the gate electrode (GE)
Figure 24B:
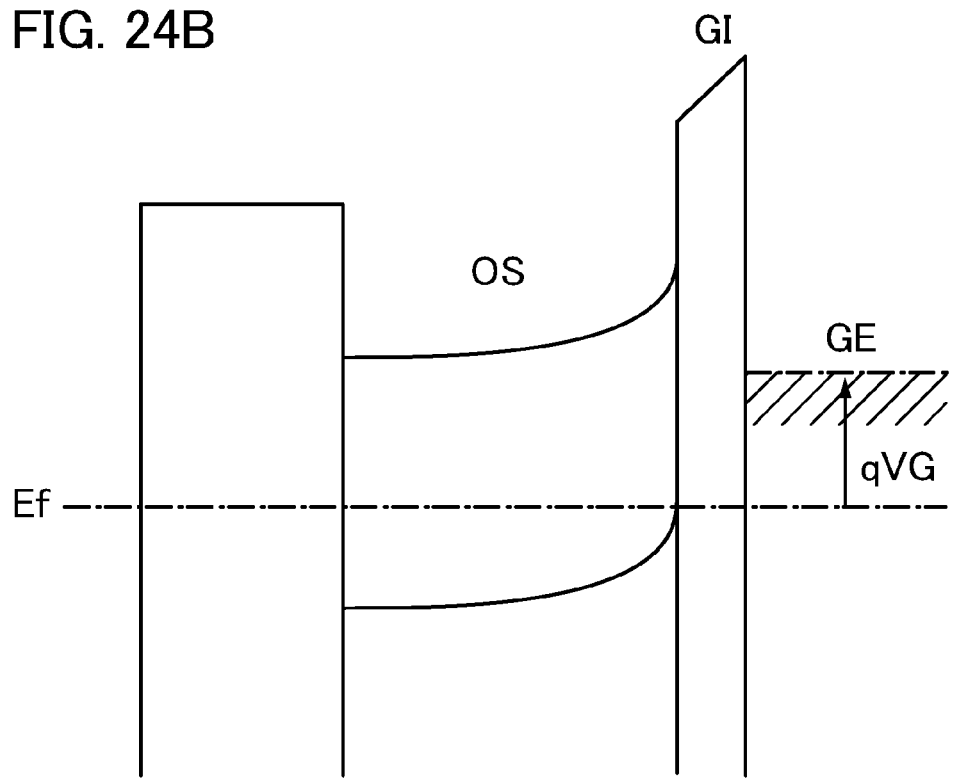

FIGS. 24A and 24B are energy band diagrams (schematic diagrams) along section B-B' in FIG. 22. FIG. 24A illustrates the state where a positive voltage (VG>0) is applied to the gate electrode (GE) and an on state where carriers (electrons) flow between the source electrode and the drain electrode. FIG. 24B illustrates the state where a negative voltage (VG<0) is applied to the gate electrode (GE) and an off state (a minority carrier does not flow).

Figure 25:
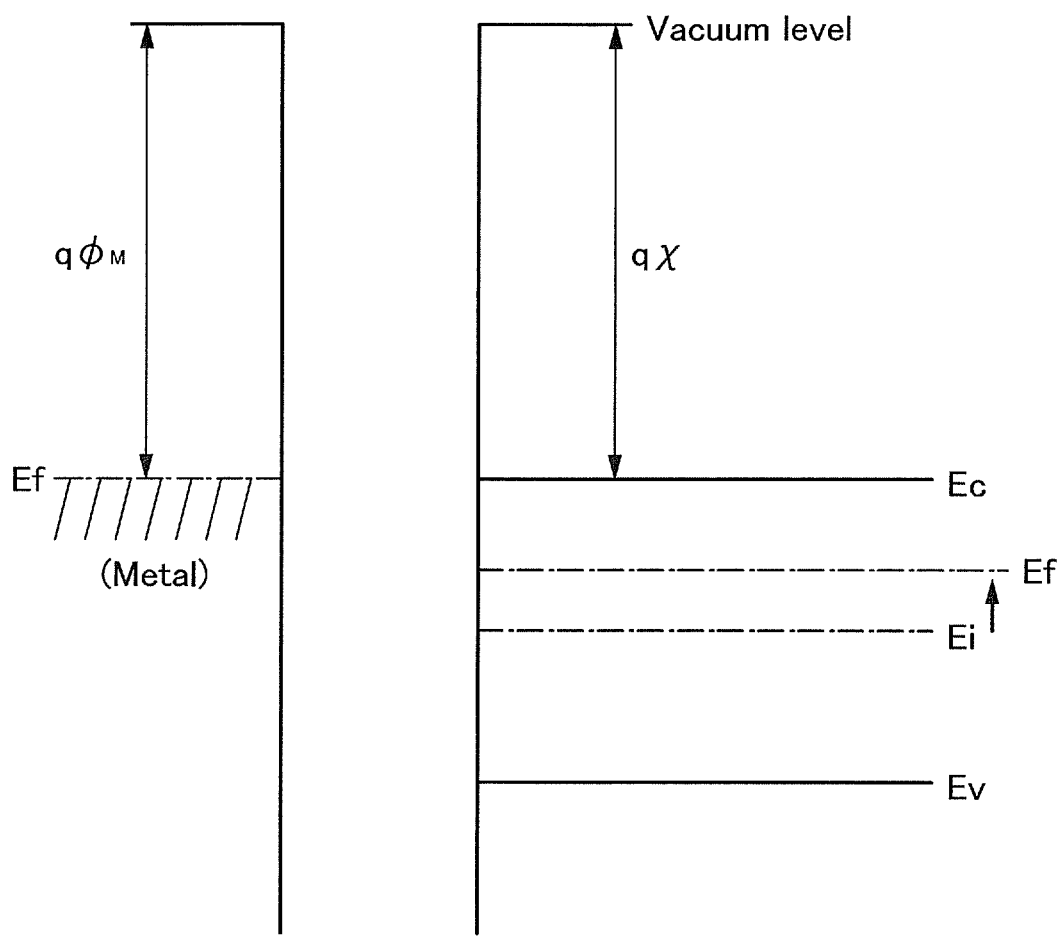
FIG. 25 illustrates a relation between the vacuum level and the work function of a metal ($\phi_M$), and a relation between the vacuum level and the electron affinity of an oxide semiconductor ($\chi$).

FIG. 25 illustrates the relation between the vacuum level, the work function of metal ($\phi_M$), and the electron affinity of an oxide semiconductor ($\chi$).

At normal temperature, electrons in the metal are degenerated and the Fermi level is located in the conduction band. On the other hand, in general, a conventional oxide semiconductor is an n-type semiconductor, and the Fermi level (Ef) thereof is located near the conduction band (Ec) away from an intrinsic Fermi level (Ei) which is located in the center of the band gap. It is known that part of hydrogen in the oxide semiconductor becomes a donor and one of factors that make the oxide semiconductor an n-type semiconductor. Further, an oxygen defect is known as one of factors that make the conductivity type an n-type.

According to one embodiment of the present invention, hydrogen that is an n-type impurity is removed from an oxide semiconductor to highly purify the oxide semiconductor so that impurities that are not main components of the oxide semiconductor are not contained as much as possible and to remove an oxygen defect, whereby an i-type (intrinsic) or substantially intrinsic oxide semiconductor is obtained. That is, an oxide semiconductor is made to be an oxide semiconductor which is an i-type (intrinsic) semiconductor or is a substantially i-type (intrinsic) semiconductor not by adding an impurity but by removing impurities such as hydrogen or water or an oxygen defect as much as possible to have high purity. With the above-described structure, the Fermi level (Ef) can be substantially close to the same level as the intrinsic Fermi level (Ei), as indicated by arrows.

The band gap (Eg) of an oxide semiconductor is said to be 3.15 eV, and the electron affinity ($\chi$) is said to be 4.3 eV. The work function of titanium (Ti) included in the source electrode and the drain electrode is substantially equal to the electron affinity ($\chi$) of the oxide semiconductor. In that case, a Schottky barrier to electrons is not formed at an interface between the metal and the oxide semiconductor.

In that case, as shown in FIG. 24A, the electron moves along the lowest part of the oxide semiconductor, which is energetically stable, at an interface between the gate insulating film and the highly-purified oxide semiconductor.

In FIG. 24B, when a negative potential (reverse bias) is applied to the gate electrode (GE), holes which are minority carriers are substantially zero; therefore, current is substantially close to zero.

In such a manner, an intrinsic (i-type) or substantially intrinsic oxide semiconductor is obtained by being purified such that an element other than its main element (i.e., an impurity element) is contained as little as possible. Thus, characteristics of the interface between the oxide semiconductor and the gate insulating layer become obvious. For that reason, the gate insulating layer needs to be able to form a favorable interface with the oxide semiconductor. Specifically, it is preferable to use, for example, an insulating layer formed by a CVD method using high-density plasma generated with a power supply frequency in the range of the VHF band to the microwave band, an insulating layer formed by a sputtering method, or the like.

The oxide semiconductor is purified and the interface between the oxide semiconductor and the gate insulating layer is made favorable.

For example, even when the transistor has a channel width W of $1 \times 10^4$ μm and a channel length L of 3 μm, an off-state current of $10^{-13}$ A or less and a subthreshold swing (S value) of 0.1 V/dec. (the thickness of the gate insulating film: 100 nm) can be obtained.

In this manner, the oxide semiconductor film is highly purified so that impurities such as water or hydrogen except a main component of the oxide semiconductor are not contained as much as possible, whereby favorable operation of the transistor can be obtained.

Embodiment 2

In Embodiment 2, a structure and a manufacturing method of a transistor for a power device capable of higher voltage or higher current control will be described. Embodiment 1 can be applied to the same portions as Embodiment 1 or portions having functions similar to those of Embodiment 1, and therefore, description thereof is not omitted.

Figure 5A:
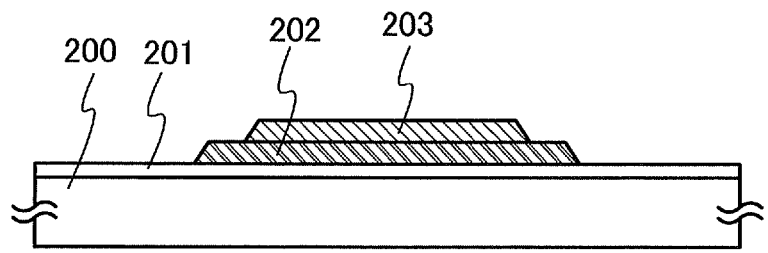
FIGS. 5A to 5E are views illustrating a method for manufacturing a semiconductor device.

As shown in FIG. 5A, an insulating film 201 which serves as a base film is formed over a substrate 200, and then, a first electrode 202 is formed.

The description on the substrate 100 described in Embodiment 1 can be referred to for a substrate to be used as the substrate 200. The description on the base film described in Embodiment 1 can be referred to for a material, the structure, and the thickness of the insulating film 201.

The first electrode 202 is formed using a metal element selected from aluminum, chromium, copper, tantalum, titanium, molybdenum, tungsten, or yttrium; an alloy containing any of these metal elements as a component; an alloy containing these metal elements in combination; or the like. Alternatively, one or more material elements selected from manganese, magnesium, zirconium, beryllium, and thorium can be used. In addition, the first electrode 202 can have a single-layer structure or a stacked-layer structure having two or more layers. For example, a single-layer structure of an aluminum film containing silicon; a two-layer structure of an aluminum film and a titanium film stacked thereover; a two-layer structure of a tungsten film and a titanium film stacked thereover; a three-layer structure in which a titanium film, an aluminum film, and a titanium film are stacked in that order; and the like can be given. Alternatively, a film, an alloy film, or a nitride film which contains aluminum and one or more elements selected from titanium, tantalum, tungsten, molybdenum, chromium, neodymium, and scandium may be used.

Alternatively, a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, can be used as the first electrode 202. A stacked-layer structure of the above-described light-transmitting conductive material and the above-described metal element may be employed.

The first electrode 202 can be formed in such a manner that a conductive film is formed over the substrate 200 by a sputtering method, a CVD method, or a vacuum evaporation method, a resist mask is formed over the conductive film in a photolithography step, and the conductive film is etched using the resist mask. Alternatively, the first electrode 202 can be formed by a printing method or an inkjet method without using a photolithography step, so that the number of steps can be reduced. Note that end portions of the first electrode 202 preferably have a tapered shape, so that the coverage with a gate insulating film formed later improves. When the angle between the end portion of the first electrode 202 and the insulating film 201 is greater than or equal to 30° and less than or equal to 60°, preferably greater than or equal to 40° and less than or equal to 50°, the coverage with the gate insulating film formed later can be improved.

In this embodiment, as the conductive film serving as the first electrode 202, a 50-nm-thick titanium film is formed by a sputtering method, a 100-nm-thick aluminum film is formed, and a 50-nm-thick titanium film is formed. Next, the conductive film is etched with the use of a resist mask formed by a photolithography step, so that the first electrode 202 is formed. Instead of the resist mask formed by the photolithography step, a resist mask may be formed using an ink-jet method, so that the number of steps can be reduced.

Next, an island-shaped oxide semiconductor film 203 is formed over the first electrode 202. The oxide semiconductor film 203 can be formed by a sputtering method, a coating method, a printing method, or the like. In this embodiment, the island-shaped oxide semiconductor film 203 is formed as follows: an oxide semiconductor film is formed over the first electrode 202 by a sputtering method and is processed into an appropriate shape by etching or the like. The oxide semiconductor film can be formed by a sputtering method under a rare gas (for example, argon) atmosphere, an oxygen atmosphere, or an atmosphere including a rare gas (for example, argon) and oxygen.

The etching for forming the island-shaped oxide semiconductor film 203 may be performed according to the description on the etching for forming the island-shaped oxide semiconductor film 203 described in Embodiment 1. The angle formed between the first electrode 202 and an end portion of the island-shaped oxide semiconductor film 203 formed by the etching is set to greater than or equal to 30° and less than or equal to 60°, preferably greater than or equal to 40° and less than or equal to 50°, which is preferable because the coverage with the gate insulating film formed later can be improved.

Note that before the oxide semiconductor film is formed by a sputtering method, reverse sputtering in which an argon gas is introduced and plasma is generated is preferably performed to remove dust attached to a surface of the first electrode 202. The reverse sputtering refers to a method in which, without application of a voltage to a target side, an RF power source is used for voltage application to a substrate side in an argon atmosphere to modify a surface. Instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

The above-described oxide semiconductor can be used for the oxide semiconductor film 203.

In this embodiment, as the oxide semiconductor film 203, an In—Ga—Zn—O-based non-single-crystal film with a thickness of 30 nm, which is obtained by a sputtering method using an oxide semiconductor target including indium (In), gallium (Ga), and zinc (Zn) is used. As the target, for example, an oxide semiconductor target having a composition ratio with an atom ratio of metals, In:Ga:Zn=1:1:0.5, In:Ga:Zn=1:1:1, or In:Ga:Zn=1:1:2 can be used. Further, the oxide semiconductor film can be formed by a sputtering method under a rare gas (typically argon) atmosphere, an oxygen atmosphere, or an atmosphere containing a rare gas (typically argon) and oxygen. In the case of using a sputtering method, a target containing $SiO_2$ at 2 wt % to 10 wt % both inclusive may be used for depositing the film. The filling rate of the oxide semiconductor target including In, Ga, and Zn is greater than or equal to 90% and less than or equal to 100%, preferably greater than or equal to 95% and less than or equal to 99.9%. With the use of the oxide semiconductor target with a high filling rate, a dense oxide semiconductor film is formed.

The oxide semiconductor film 203 is formed over the substrate 200 in such a manner that the substrate is held in the treatment chamber maintained at reduced pressure, a sputtering gas from which hydrogen and moisture have been removed is introduced into the treatment chamber while moisture remaining therein is removed, and metal oxide is used as a target. At that time, the substrate may be heated at higher than or equal to 100° C. and lower than or equal to 600° C., preferably higher than or equal to 200° C. and lower than or equal to 400° C. Film deposition may be performed while the substrate is heated, whereby the concentration of an impurity contained in the oxide semiconductor film deposited can be reduced. In addition, damage by sputtering can be reduced.

In order to remove remaining moisture in the treatment chamber, an entrapment vacuum pump is preferably used. For example, a cryopump, an ion pump, or a titanium sublimation pump is preferably used. An evacuation unit may be a turbo pump provided with a cold trap. In the deposition chamber which is evacuated with the cryopump, for example, a hydrogen atom, a compound containing a hydrogen atom, such as water ($H_2O$), (far preferably, also a compound containing a carbon atom), and the like are removed, whereby the concentration of an impurity in the oxide semiconductor film deposited in the deposition chamber can be reduced.

As one example of the deposition condition, the following can be employed: the substrate temperature is room temperature, the distance between the substrate and the target is 110 mm, the pressure is 0.4 Pa, the direct-current (DC) power is 0.5 kW, and the atmosphere is an atmosphere of oxygen and argon (the oxygen flow rate 15 sccm: the argon flow rate 30 sccm). Note that a pulsed direct-current (DC) power source is preferable because powder substances which are referred to as particles generated in film deposition can be reduced and the film thickness can be uniform. The oxide semiconductor film has a thickness greater than or equal to 1 μm, preferably greater than or equal to 3 μm, far preferably 10 μm. Since appropriate thickness depends on an oxide semiconductor material used, the thickness can be determined as appropriate depending on the material.

Further, in order that hydrogen, a hydroxyl group, and moisture may be contained in the oxide semiconductor film 203 as little as possible, it is preferable that the substrate 200 on which the process up to and including the step of forming the first electrode 202 is already performed be preheated in a preheating chamber of a sputtering apparatus as pretreatment for film formation so that impurities such as hydrogen and moisture adsorbed to the substrate 200 are removed and exhausted. The temperature of the preheating is higher than or equal to 100° C. and lower than or equal to 400° C., preferably higher than or equal to 150° C. and lower than or equal to 300° C. As an exhaustion unit provided in the preheating chamber, a cryopump is preferable. This preheating treatment can be omitted. Further, this preheating may be similarly performed on the substrate 200 on which the process up to and including the step of forming a gate electrode is already performed, before the formation of a gate insulating film.

Examples of a sputtering method include an RF sputtering method in which a high-frequency power source is used for a sputtering power supply, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as a deposition method using a sputtering method, a reactive sputtering method in which a target substance and a sputtering gas component are chemically reacted with each other during deposition to form a thin compound film thereof, or a bias sputtering method in which a voltage is also applied to a substrate during deposition can be used.

Figure 5B:
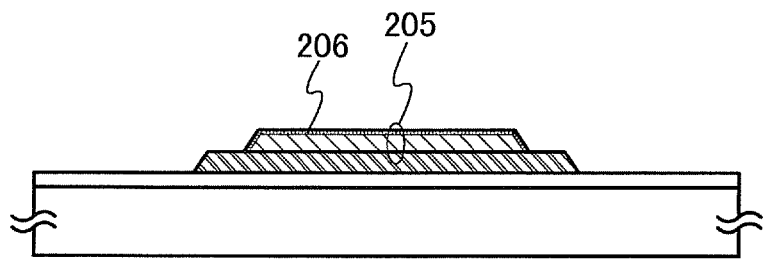

Next, first heat treatment is performed on the oxide semiconductor film 203 in a reduced-pressure atmosphere, an inert gas atmosphere such as a nitrogen atmosphere or a rare gas atmosphere, an oxygen gas atmosphere, or an ultra dry air atmosphere (in air whose moisture content is less than or equal to 20 ppm (dew point conversion, −55° C.), preferably less than or equal to 1 ppm, far preferably less than or equal to 10 ppb in the case where measurement is performed using a dew-point meter of a cavity ring-down laser spectroscopy (CRDS) system). By the first heat treatment on the oxide semiconductor film 203, an oxide semiconductor film 205 in which moisture or hydrogen is eliminated is formed as shown in FIG. 5B. Specifically, heat treatment may be performed at a temperature higher than or equal to 500° C. and lower than or equal to 850° C. (or a temperature lower than or equal to a strain point of a glass substrate), preferably a temperature higher than or equal to 550° C. and lower than or equal to 750° C. For example, heat treatment may be performed at 600° C. for a period longer than or equal to 3 minutes and shorter than or equal to 6 minutes. Since dehydration or dehydrogenation can be performed in a short time with the RTA method, the first heat treatment can be performed even at a temperature over the strain point of a glass substrate. In this embodiment, heat treatment is performed on the oxide semiconductor film 203 at a substrate temperature of 600° C. for 6 minutes in a nitrogen atmosphere with the use of an electrical furnace that is one of heat treatment apparatuses, and then, the oxide semiconductor film is not exposed to the air and water and hydrogen are prevented from entering the oxide semiconductor film, so that the oxide semiconductor film 205 is obtained.

Detailed description on the heat treatment apparatus used for the first heat treatment is already made in Embodiment 1 and therefore omitted here.

It is preferable that in the heat treatment, moisture, hydrogen, or the like be not contained in nitrogen or a rare gas such as helium, neon, or argon. The purity of nitrogen or the rare gas such as helium, neon, or argon which is introduced into the heat treatment apparatus is preferably set to be 6N (99.9999%) or higher, far preferably 7N (99.99999%) or higher (that is, the impurity concentration is preferably 1 ppm or lower, far preferably 0.1 ppm or lower).

Thus, as shown in FIG. 5B, by the first heat treatment, a superficial portion of the island-shaped oxide semiconductor film 205 is made to have a crystal region 206. The crystal region 206 includes a so-called nanocrystal with a grain size greater than or equal to 1 nm and less than or equal to 20 nm, and the other portion of the island-shaped oxide semiconductor film 205 other than the crystal region 206 is amorphous or includes a mixture of an amorphous state and microcrystals where the microcrystals are provided in the amorphous state. Note that the above-described size of the nanocrystal is just an example, and the present invention is not construed as being limited to the above range. In the case where the oxide semiconductor film is an In—Ga—Zn—O-based oxide semiconductor film formed by a sputtering method using a target the atom ratio of metals of which is In:Ga:Zn=1:1:1, crystallization of the superficial portion of the oxide semiconductor film is likely to be further promoted as compared to the case where a target having a different atom ratio is used, so that the crystal region 206 is likely to be formed to a larger depth.

Figure 5C:
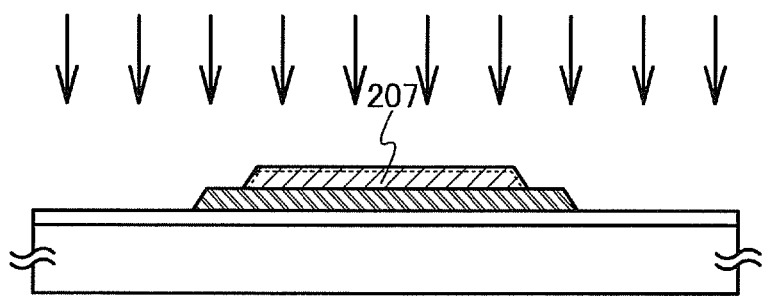

Next, as shown in FIG. 5C, oxygen is added into the oxide semiconductor film 205 having the crystal region 206 in the superficial portion by an ion implantation method or an ion doping method. Oxygen is added into the oxide semiconductor film 205 by an ion implantation method, an ion doping method, or the like, so that an oxide semiconductor film 207 in which oxygen is added excessively is formed. By adding oxygen, a bond between a metal as a component of the oxide semiconductor and hydrogen or a bond between the metal and a hydroxyl group is cut and the hydrogen or the hydroxyl group is reacted with oxygen to produce water; this leads to easy elimination of hydrogen or a hydroxyl group that is an impurity, in the form of water by second heat treatment performed later.

In the case where an oxygen gas is used and oxygen is added by an ion implantation method, the acceleration voltage may be set in the range of 5 kV to 100 kV both inclusive and the dosage may be set in the range of $1\times10^{13}$ ions/cm$^2$ to $1\times10^{16}$ ions/cm$^2$ both inclusive.

Heat treatment may be performed on the substrate provided with the oxide semiconductor film 205 at a temperature higher than or equal to 500° C. and lower than or equal to 850° C. (or a temperature lower than or equal to a strain point of a glass substrate), preferably a temperature higher than or equal to 550° C. and lower than or equal to 750° C. while the addition of oxygen into the oxide semiconductor film 205 is performed by an ion implantation method.

Crystals included in the crystal region 206 formed in the superficial portion of the oxide semiconductor film 205 are damaged by addition of oxygen using an ion implantation method, an ion doping method, or the like. Therefore, the crystallinity of a superficial portion of the oxide semiconductor film 207 is lower than that of the crystal region 206 of the oxide semiconductor film 205 before the oxygen addition, and the superficial portion of the oxide semiconductor film 207 may be in a similar state to the amorphous region of the oxide semiconductor film 205 depending on the dosage of oxygen.

Next, second heat treatment is performed. The second heat treatment can be performed in a similar condition to the first heat treatment. Specifically, heat treatment may be performed in a reduced-pressure atmosphere, an inert gas atmosphere such as a nitrogen atmosphere or a rare gas atmosphere, an oxygen gas atmosphere, or an ultra dry air atmosphere (in air whose moisture content is less than or equal to 20 ppm (dew point conversion, −55° C.), preferably less than or equal to 1 ppm, far preferably less than or equal to 10 ppb in the case where measurement is performed using a dew-point meter of a cavity ring-down laser spectroscopy (CRDS) system) at a temperature higher than or equal to 500° C. and lower than or equal to 850° C. (or a temperature lower than or equal to a strain point of a glass substrate), preferably a temperature higher than or equal to 550° C. and lower than or equal to 750° C. In the case where heat treatment is performed by RTA (Rapid Thermal Anneal), for example, heat treatment may be performed at 600° C. for a period longer than or equal to 3 minutes and shorter than or equal to 6 minutes. Since dehydration or dehydrogenation can be performed in a short time with the RTA method, the second heat treatment can be performed even at a temperature over the strain point of a glass substrate. In this embodiment, heat treatment is performed at a substrate temperature of 600° C. for 6 minutes in a nitrogen atmosphere with the use of an electrical furnace that is one of heat treatment apparatuses, and then, the oxide semiconductor film is not exposed to the air and water and hydrogen are prevented from entering the oxide semiconductor film, so that an oxide semiconductor film 208 is obtained. The heat treatment may be performed plural times after the island-shaped oxide semiconductor film 208 is formed.

According to one embodiment of the present invention, the bond between a metal as a component of the oxide semiconductor and hydrogen or a hydroxyl group is cut and the hydrogen or the hydroxyl group is made to react with oxygen to produce water by adding oxygen in the oxide semiconductor film 205. Thus, an impurity such as hydrogen or a hydroxyl group left in the film can be easily eliminated in the form of water by the second heat treatment after the oxygen addition. The island-shaped oxide semiconductor film 208 formed through the second heat treatment is more i-type (intrinsic) or closer to i-type than the oxide semiconductor film 205 after the first heat treatment because impurities such as moisture or hydrogen left even after the first heat treatment are removed. Impurities such as moisture or hydrogen are eliminated, and the island-shaped oxide semiconductor film becomes an i-type (intrinsic) semiconductor or a substantially i-type semiconductor; therefore, deterioration of characteristics of the transistor due to the impurities, such as shifts in threshold voltage, can be prevented from being promoted and off-state current can be reduced.

Further, when an oxide semiconductor containing an impurity is subjected to a gate bias-temperature stress test (BT test) for 12 hours under conditions that the temperature is 85° C. and the voltage applied to the gate is $2\times10^6$ V/cm, a bond between the impurity and a main component of the oxide semiconductor is cut by a high electric field (B: bias) and a high temperature (T: temperature), and a generated dangling bond induces drift of threshold voltage ($V_{th}$). However, in the above-described manner, by improving the interfacial characteristics between the gate insulating film and the oxide semiconductor film and removing impurities, particularly hydrogen, water, and the like, in the oxide semiconductor film as much as possible, a transistor which remains stable even with respect to the BT test can be obtained.

Detailed description on the heat treatment apparatus used for the second heat treatment is already made in Embodiment 1 and therefore omitted here.

It is preferable that in the heat treatment, moisture, hydrogen, or the like be not contained in nitrogen or a rare gas such as helium, neon, or argon. The purity of nitrogen or the rare gas such as helium, neon, or argon which is introduced into the heat treatment apparatus is preferably set to be 6N (99.9999%) or higher, far preferably 7N (99.99999%) or higher (that is, the impurity concentration is preferably 1 ppm or lower, far preferably 0.1 ppm or lower).

However, in the oxide semiconductor film 205, an oxygen defect is generated in addition to removal of water or hydrogen by the first heat treatment, and oxygen can be sufficiently supplied to the oxygen-deficient oxide semiconductor film by the addition of oxygen by an ion implantation method, an ion doping method, or the like. Further, since hydrogen or water removed by the first heat treatment is not a component element of the oxide semiconductor but a so-called impurity and oxygen added later is one component element of the oxide semiconductor, a structure which satisfies the stoichiometric composition ratio can be obtained. Therefore, by performing the second heat treatment after the first heat treatment and the addition of oxygen, the damaged crystal region 206 can be repaired, and crystal growth is promoted from the superficial portion of the oxide semiconductor film 208 to a larger depth of the oxide semiconductor film, so that a crystal region 209 which is expanded to a deeper portion of the oxide semiconductor film 208 can be formed. Further, crystal growth is further promoted by this second heat treatment as compared to the first heat treatment, so that in the crystal region 209, crystal grains are adjacent to each other and metal elements each of which is a component element of the oxide semiconductor are continuous, that is, continuously in contact with each other between crystal grains which are adjacent to each other. Accordingly, in a transistor in which a channel formation region is formed using the above-described crystal region, the potential barrier at a crystal grain boundary is low, so that excellent characteristics such as high mobility and high withstand voltage can be achieved.

Figure 5D:
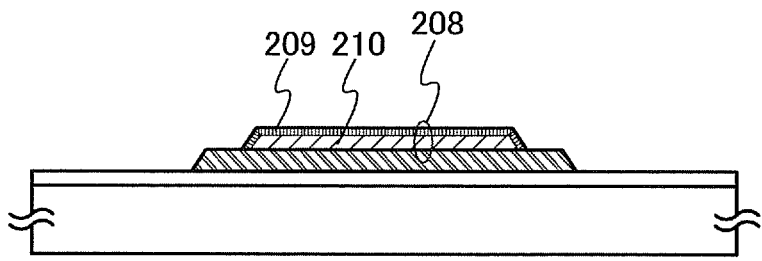

The oxide semiconductor film 208 shown in FIG. 5D includes an amorphous region 210 which is mainly amorphous and the crystal region 209 formed in the superficial portion of the oxide semiconductor film 208.

Further, the crystal region 209 is more stable than the amorphous region 210; therefore, when the crystal region 209 is included in the superficial portion of the oxide semiconductor film 208, the entry of impurities (e.g., hydrogen, water, a hydroxy group, hydride, or the like) into the amorphous region 210 can be suppressed. Thus, the reliability of the oxide semiconductor film 208 can be improved.

Although the oxide semiconductor film 208 includes the crystal region 209 and the amorphous region 210 in this embodiment, the oxide semiconductor film 208 may be almost wholly occupied by the crystal region 209. Even in the case where the oxide semiconductor film 208 includes the crystal region 209 and the amorphous region 210, the depth to which the crystal region 209 reaches from the top surface of the oxide semiconductor film 208 is not limited to that of the structure shown in FIGS. 5A to 5E and 6A to 6C.

Through the above-described process, the concentration of hydrogen in the oxide semiconductor film can be reduced and the oxide semiconductor film can be highly purified. Thus, the oxide semiconductor film can be stabilized. In addition, heat treatment at a temperature which is lower than or equal to the glass transition temperature makes it possible to form an oxide semiconductor film with a wide band gap in which carrier density is extremely low. Therefore, a transistor can be manufactured using a large-sized substrate, so that mass productivity can be increased. In addition, by using the oxide semiconductor film whose hydrogen concentration is reduced and which is highly purified, it is possible to form a transistor with a high withstand voltage, less short-channel effect, and a high on/off ratio.

The amorphous region 210 is mainly an amorphous oxide semiconductor film. The word "mainly" means, for example, a state where the occupancy is 50% or more, and means a state where the amorphous region 210 is occupied by the amorphous oxide semiconductor film at an occupancy of 50% or more by volume (or weight) in this case. In other words, the amorphous region in some cases includes crystals of an oxide semiconductor film other than an amorphous oxide semiconductor film, and the occupancy thereof is preferably less than 50% by volume (or weight). However, the occupancy is not limited to the above.

In the case where the In—Ga—Zn—O-based oxide semiconductor film is used as a material of the oxide semiconductor film, the composition of the above-described amorphous region 210 is preferably set so that a Zn content (atomic %) is larger than an In or Ga content (atomic %). Such a composition makes it easy to form the crystal region 209 with a predetermined composition.

Figure 5E:
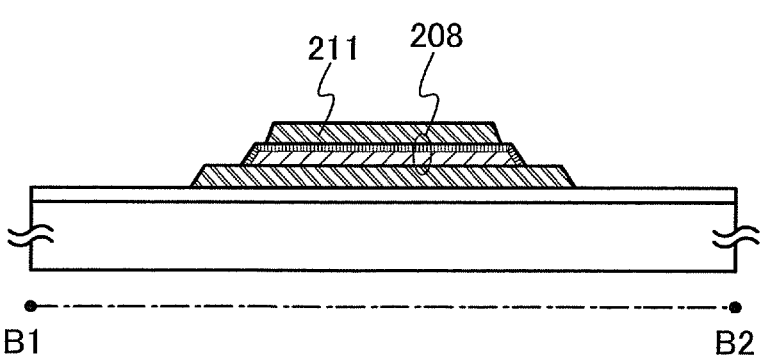

Next, as shown in FIG. 5E, a second electrode 211 is formed over the oxide semiconductor film 208. The similar mode of the first electrode 202 can be applied to a material and the structure of a conductive film used as the second electrode 211. A manufacturing method of the second electrode 211 can be carried out in a similar manner to that of the first electrode 202.

In this embodiment, a resist mask is formed over the conductive film which serves as the second electrode 211 in a photolithography step, and the conductive film is etched using the resist mask, so that the second electrode 211 is formed. Here, as the conductive film that serves as the second electrode 211, a 50-nm-thick titanium film, a 100-nm-thick aluminum film, and a 50-nm-thick titanium film are stacked in this order. The angle formed between the oxide semiconductor film 208 and an end portion of the second electrode 211 may be greater than or equal to 30° and less than or equal to 60°, preferably greater than or equal to 40° and less than or equal to 50°, which is preferable because the coverage with a gate insulating film to be formed later can be improved. Then, the second electrode 211 is formed away from the first electrode 202 so as not to be in contact with the first electrode 202.

One of the first electrode 202 and the second electrode 211 functions as a source electrode of a transistor and the other functions as a drain electrode thereof.

Heat treatment may be performed after the formation of the second electrode 211. The temperature of the heat treatment is higher than or equal to 400° C. and lower than or equal to 850° C., preferably higher than or equal to 400° C. and lower than a strain point of the substrate. In this embodiment, the substrate is introduced into an electric furnace that is one of heat treatment apparatuses, and heat treatment is performed on the oxide semiconductor film 208 in an inert gas atmosphere, such as a nitrogen atmosphere or a rare gas atmosphere, at 450° C. for one hour, and then the oxide semiconductor film is not exposed to air so that hydrogen, water, a hydroxyl group, hydride, or the like can be prevented from entering the oxide semiconductor film, whereby hydrogen concentration is further reduced, and the oxide semiconductor film is highly purified, so that an i-type or a substantially i-type oxide semiconductor film can be obtained.

It is preferable that in the heat treatment, hydrogen, water, a hydroxyl group, a hydride, or the like be not contained in nitrogen or a rare gas such as helium, neon, or argon. The purity of nitrogen or the rare gas such as helium, neon, or argon which is introduced into the heat treatment apparatus is preferably set to be 6N (99.9999%) or higher, far preferably 7N (99.99999%) or higher (that is, the impurity concentration is preferably 1 ppm or lower, far preferably 0.1 ppm or lower).

Figure 7A:
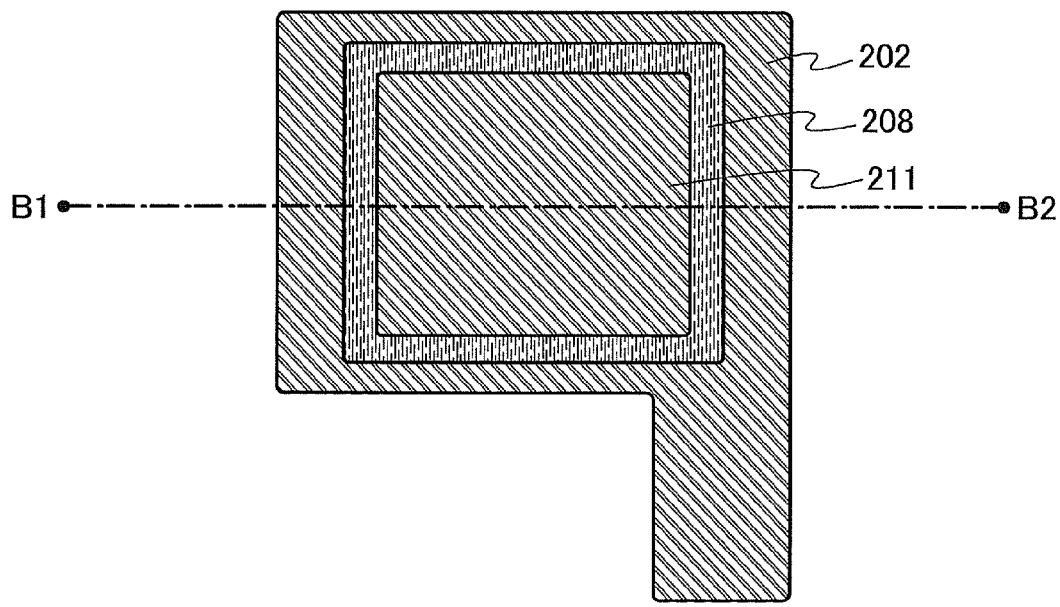
FIGS. 7A and 7B are top views of a semiconductor device.

FIG. 7A is a top view of the first electrode 202, the oxide semiconductor film 208, and the second electrode 211 shown in FIG. 5E. A cross-sectional view along dashed line B1-B2 in FIG. 7A corresponds to FIG. 5E.

Figure 6A:
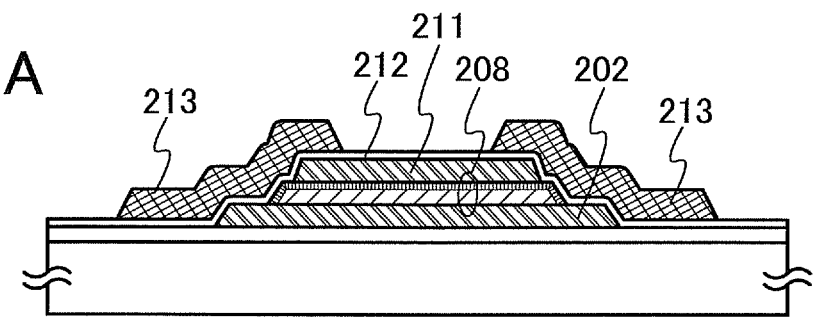
FIGS. 6A to 6C are views illustrating a method for manufacturing a semiconductor device.

Next, as shown in FIG. 6A, a gate insulating film 212 is formed to cover the first electrode 202, the oxide semiconductor film 208, and the second electrode 211. A gate electrode 213 is formed over the gate insulating film 212. The gate insulating film 212 can be formed to have a single-layer structure or a stacked-layer structure of one or more selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and a tantalum oxide film by a plasma CVD method, a sputtering method, or the like.

When the gate insulating film 212 is formed using a high-k material such as hafnium silicate (HfSiO$_x$), HfSi$_x$O$_y$ to which N is added, hafnium aluminate (HfAlO$_x$) to which N is added, hafnium oxide, or yttrium oxide, gate leakage can be reduced. Further, a stacked-layer structure can be used in which a high-k material and one or more selected from a silicon oxide film, a silicon nitride film, a silicon oxynitride film, a silicon nitride oxide film, and an aluminum oxide film are stacked. The thickness of the gate insulating film 212 may be greater than or equal to 50 nm and less than or equal to 500 nm. Leakage current can be reduced by increasing the thickness of the gate insulating film 212.

It is preferable that the gate insulating film 212 include impurities such as moisture or hydrogen as little as possible. In the case where a silicon oxide film is formed by a sputtering method, a silicon target or a quartz target is used as a target and oxygen or a mixed gas of oxygen and argon is used as a sputtering gas.

An oxide semiconductor that is made to be i-type or substantially i-type (an oxide semiconductor that is highly purified) by removal of impurities is extremely sensitive to an interface state and an interface electric charge; thus, an interface between the oxide semiconductor and the gate insulating film 212 is important. Thus, a gate insulating film (GI) which is to be in contact with the highly purified oxide semiconductor needs to have high quality.

For example, high-density plasma CVD using microwaves (2.45 GHz) is preferable because a dense high-quality insulating film having high withstand voltage can be formed. This is because an interface state can be reduced and interface characteristics can be favorable when the highly purified oxide semiconductor and the high quality gate insulating film are in contact with each other.

Needless to say, other film formation methods, such as a sputtering method or a plasma CVD method, can be applied as long as a high-quality insulating film can be formed as the gate insulating film 212. The film quality of the gate insulating film 212 and/or properties of an interface with an oxide semiconductor thereof may be modified by heat treatment performed after film deposition. In any case, any insulating film can be used as long as film quality as a gate insulating film is high, interface state density with an oxide semiconductor is decreased, and a favorable interface can be formed.

The gate insulating film 212 may have a structure in which an insulating film formed using a material having a high barrier property and an insulating film having lower proportion of nitrogen such as a silicon oxide film or a silicon oxynitride film are stacked. In that case, the insulating film such as a silicon oxide film or a silicon oxynitride film is formed between the insulating film having a barrier property and the oxide semiconductor film. As the insulating film having a high barrier property, a silicon nitride film, a silicon nitride oxide film, an aluminum nitride film, an aluminum nitride oxide film, or the like can be given, for example. With the insulating film having a barrier property, impurities in an atmosphere, such as moisture or hydrogen, or impurities included in the substrate, such as an alkali metal or a heavy metal, can be prevented from entering the oxide semiconductor film, the gate insulating film 212, or the interface between the oxide semiconductor film and another insulating film and the vicinity thereof. In addition, the insulating film having lower proportion of nitrogen such as a silicon oxide film or a silicon oxynitride film may be formed so as to be in contact with the oxide semiconductor film, so that the insulating film formed using a material having a high barrier property can be prevented from being in contact with the oxide semiconductor film directly.

For example, a stacked-layer film with a thickness of 100 nm may be formed as the gate insulating film 212 as follows: a silicon oxide film (SiO$_X$(X>0)) with a thickness greater than or equal to 5 nm and less than or equal to 300 nm is formed as a first gate insulating film, and a silicon nitride film (SiN$_Y$(Y>0)) with a thickness greater than or equal to 50 nm and less than or equal to 200 nm is stacked by a sputtering method over the first gate insulating film as a second gate insulating film. In this embodiment, the silicon oxide film having a thickness of 100 nm is formed by an RF sputtering method under the following conditions: the pressure is 0.4 Pa; the high-frequency power is 1.5 kW; and the atmosphere contains oxygen and argon (oxygen flow rate of 25 sccm: argon flow rate of 25 sccm=1:1).

Further, in order that hydrogen, a hydroxyl group, and moisture may be contained in the gate insulating film 212 as little as possible, it is preferable that the substrate 200 provided for the first electrode 202, the oxide semiconductor film 208, and the second electrode 211 be preheated in a preheating chamber of a sputtering apparatus as pretreatment for film formation so that impurities such as hydrogen and moisture adsorbed to the substrate 200 are removed and exhausted. The temperature of the preheating is higher than or equal to 100° C. and lower than or equal to 400° C., preferably higher than or equal to 150° C. and lower than or equal to 300° C. As an exhaustion unit provided in the preheating chamber, a cryopump is preferable. This preheating treatment can be omitted.

After the gate insulating film 212 is formed, heat treatment may be performed. The heat treatment is performed in an inert gas atmosphere (nitrogen, helium, neon, argon, or the like) at a temperature, preferably, higher than or equal to 200° C. and lower than or equal to 400° C., for example, at a temperature higher than or equal to 250° C. and lower than or equal to 350° C. In this embodiment, heat treatment is performed for 1 hour at 250° C. in a nitrogen atmosphere is performed. By the heat treatment performed on the state where silicon oxide contained in the gate insulating film 212 is in contact with the oxide semiconductor film 208, oxygen is supplied from the silicon oxide even when an oxygen defect is generated in the second heat treatment, whereby the number of oxygen defects which form donors can be reduced, a structure which satisfies the stoichiometric composition ratio can be obtained, and the oxide semiconductor film 208 is made to be an i-type or substantially i-type. The timing of this heat treatment is not particularly limited as long as it is after the formation of the gate insulating film 212, and may be performed after another step, for example, after any one of the gate electrode 213, an insulating film 214, and wirings 215, 216, and 217 is formed. This heat treatment can be performed without increasing the number of manufacturing steps by doubling as another step such as a heat treatment for reduction of the resistance of a transparent conductive film.

The gate electrode 213 can be formed to have a single-layer structure or a stacked-layer structure using one or more conductive films using a metal material such as molybdenum, titanium, chromium, tantalum, tungsten, neodymium, or scandium or an alloy material which contains any of these metal materials as its main component, or a nitride which contains any of these metals. Aluminum or copper can be used as one of the metal material if aluminum or copper can withstand a temperature of heat treatment performed in a later process. Aluminum or copper is preferably combined with a refractory metal material so as to prevent a heat resistance problem and a corrosive problem. As the refractory metal material, molybdenum, titanium, chromium, tantalum, tungsten, neodymium, scandium, or the like can be used.

For example, as a two-layer structure of the gate electrode 213, the following structure is preferable: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, or a two-layer structure in which a titanium nitride film and a molybdenum film are stacked. As a three-layer structure of the gate electrode 213, the following structure is preferable: a stacked structure in which an aluminum film, an alloy film of aluminum and silicon, an alloy film of aluminum and titanium, or an alloy film of aluminum and neodymium is sandwiched by any two films selected from a tungsten film, a tungsten nitride film, a titanium nitride film, and a titanium film.

Further, a light-transmitting oxide conductive film of indium oxide, an alloy of indium oxide and tin oxide, an alloy of indium oxide and zinc oxide, zinc oxide, aluminum zinc oxide, aluminum zinc oxynitride, gallium zinc oxide, or the like may be used for the gate electrode 213, so that the aperture ratio of a pixel portion can be increased.

The gate electrode 213 is formed to a thickness of 10 nm to 400 nm, preferably 100 nm to 200 nm. In this embodiment, a conductive film for the gate electrode is formed to a thickness of 150 nm by a sputtering method using a tungsten target, and then, the conductive film is processed (patterned) into an appropriate shape by etching; in such a manner, the gate electrode 213 is formed. The gate electrode 213 is formed at least so as to overlap with the end portion of the oxide semiconductor film 208 with the gate insulating film 212 provided therebetween. In the end portion of the oxide semiconductor film 208, a channel formation region is formed in a portion 218 which overlaps with the gate electrode 213 with the gate insulating film 212 provided therebetween. It is preferable that an end portion of the gate electrode 213 be tapered because coverage with the insulating film 214 formed thereover is improved. Note that a resist mask may be formed by an inkjet method. Formation of the resist mask by an inkjet method needs no photomask; thus, manufacturing costs can be reduced.

Figure 6B:
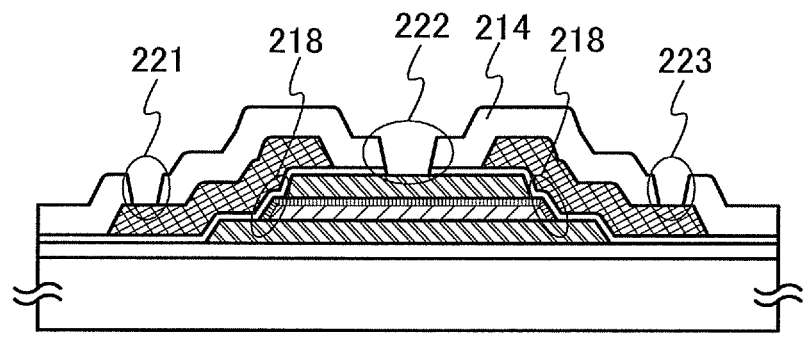

Next, as shown in FIG. 6B, the insulating film 214 is formed to cover the first electrode 202, the oxide semiconductor film 208, the second electrode 211, the gate insulating film 212, and the gate electrode 213, and then, contact holes 221, 222, and 223 are formed. The insulating film 214 preferably includes no impurities such as moisture or hydrogen as much as possible, and may be formed using a single-layer insulating film or a plurality of insulating films stacked. The insulating film 214 is formed, for example, using an oxide insulating film such as a silicon oxide film, a silicon oxynitride film, an aluminum oxide film, or an aluminum oxynitride film; or a nitride insulating film such as a silicon nitride film, a silicon nitride oxide film, an aluminum nitride film, or an aluminum nitride oxide film. Alternatively, an oxide insulating film and a nitride insulating film can be stacked. An insulating film having a high barrier property, for example, a silicon nitride film, a silicon nitride oxide film, an aluminum nitride film, or an aluminum nitride oxide film may be used for the insulating film 214, so that impurities such as moisture or hydrogen can be prevented from entering the oxide semiconductor film 208, the gate insulating film 212, or the interface between the oxide semiconductor film 208 and another insulating film and the vicinity thereof.

In this embodiment, the insulating film 214 has a structure in which a silicon nitride film having a thickness of 100 nm formed by a sputtering method is stacked over a silicon oxide film having a thickness of 200 nm formed by a sputtering method. Note that when the insulating film 214 is formed by a sputtering method, the substrate 200 may be heated to a temperature of 100° C. to 400° C., a high-purity sputtering gas which contains nitrogen, from which hydrogen, water, a hydroxyl group, hydride, or the like is removed may be introduced, and an insulating film may be formed using a silicon target. Also in that case, the insulating film is preferably formed while hydrogen, water, a hydroxyl group, hydride, or the like remaining in the treatment chamber is removed.

After the insulating film 214 is formed, heat treatment may be performed. The heat treatment is performed in an inert gas atmosphere (nitrogen, helium, neon, argon, or the like) at a temperature, preferably, higher than or equal to 200° C. and lower than or equal to 400° C., for example, at a temperature higher than or equal to 250° C. and lower than or equal to 350° C.

The contact holes 221, 222, and 223 are formed as follows: a resist mask is formed by a photolithography step and parts of the gate insulating film 212 and the insulating film 214 are selectively etched using the resist mask. A part of the gate electrode 213 is exposed in the contact hole 221; a part of the second electrode 211 is exposed in the contact hole 222; and a part of the second electrode 213 is exposed in the contact hole 222. At the time of the formation of these contact holes, a contact hole so as to expose the first electrode 202 may be formed in a region of the first electrode 202, which is not covered with the gate electrode 213.

Figure 6C:
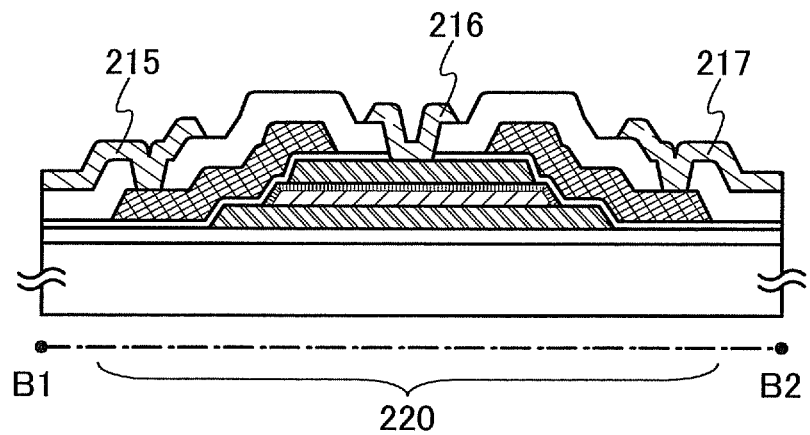

Next, as shown in FIG. 6C, a conductive film is formed over the insulating film 214 to cover the contact holes 221, 222, and 223 and is processed into a desired shape by etching or the like, so that the wirings 215, 216, and 217 are formed. A resist mask used for the etching may be formed by an inkjet method. No photomask is used when a resist mask is formed by an ink-jet method; therefore, manufacturing costs can be reduced.

The wiring 215 is connected to the gate electrode 213 through the contact hole 221. The wiring 216 is connected to the second electrode 211 through the contact hole 222. The wiring 217 is connected to the gate electrode 213 through the contact hole 223. At the time of the formation of these wirings, a wiring which is connected to the first electrode 202 through a contact hole may be formed.

The wirings 215, 216, and 217 can be formed using a conductive film having a similar structure and a similar material to the first electrode 202 by a similar manufacturing method to the first electrode 202.

Through the above-described process, a transistor 220 is formed.

Figure 7B:
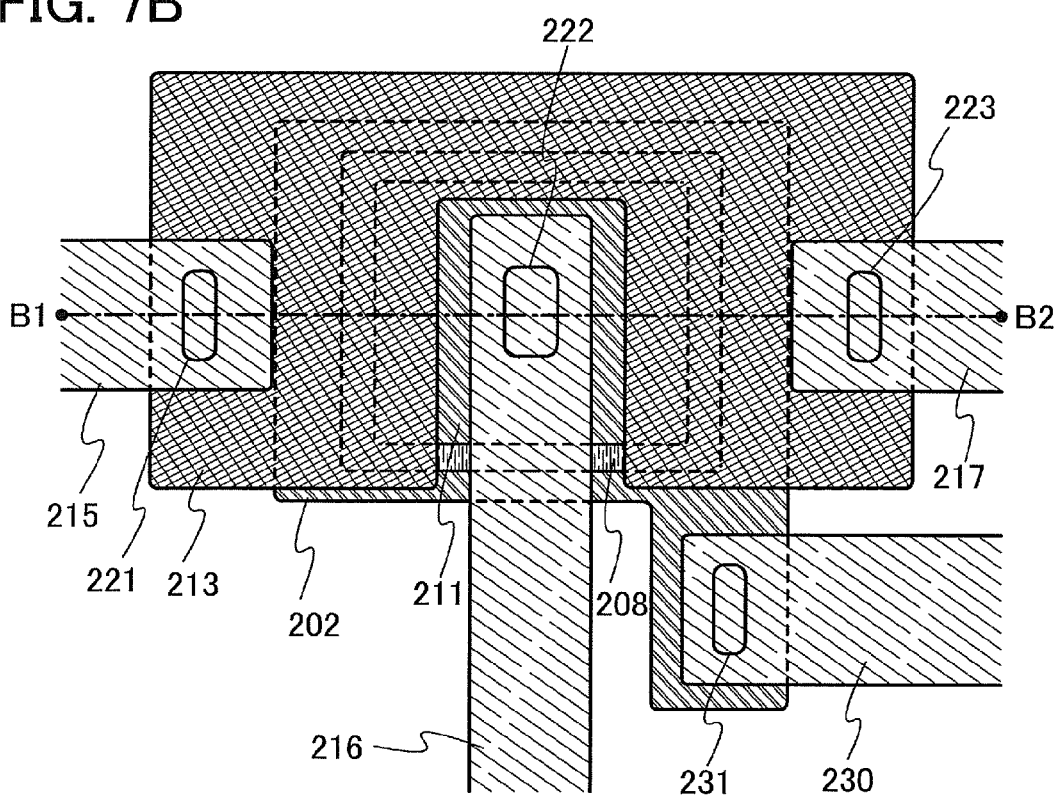

FIG. 7B is a top view of the transistor 220 shown in FIG. 6C. A cross-sectional view along dashed line B1-B2 in FIG. 7B corresponds to FIG. 6C. In FIG. 7B, a wiring 230 is a wiring formed at the same time as the wirings 215, 216, and 217 and is connected to the first electrode 202 through a contact hole 231.

In this manner, the concentration of hydrogen in the oxide semiconductor film can be reduced and the oxide semiconductor film can be highly purified. Thus, the oxide semiconductor film can be stabilized. In addition, heat treatment at a temperature which is lower than or equal to the glass transition temperature makes it possible to form an oxide semiconductor film with a wide band gap in which carrier density is extremely low. Therefore, a transistor can be manufactured using a large-sized substrate, so that mass productivity can be increased. In addition, by using the oxide semiconductor film whose hydrogen concentration is reduced and which is highly purified, it is possible to form a transistor with a high withstand voltage, less short-channel effect, and a high on/off ratio.

In this embodiment, at least the part of the oxide semiconductor film 208, which is formed in a region which is different from the second electrode 211 may be covered with the gate electrode 213. Further, the electrode of the first electrode 202 or the second electrode 211, which functions as a drain electrode, may be connected to the gate electrode 213. When the electrode which functions as a drain electrode is connected to the gate electrode 213, the transistor can function as a diode.

The terms of the "source electrode" and the "drain electrode" included in the transistor interchange with each other depending on the polarity of the transistor or difference between the levels of potentials applied to the respective electrodes. In general, in an n-channel transistor, an electrode to which a lower potential is applied is called a source electrode, and an electrode to which a higher potential is applied is called a drain electrode. Further, in a p-channel transistor, an electrode to which a lower potential is applied is called a drain electrode, and an electrode to which a higher potential is applied is called a source electrode. In this specification and the like, for convenience, connection relation of the transistor is described assuming that the source electrode and the drain electrode are fixed; however, actually, the terms of the source electrode and the drain electrode interchange with each other depending on relation between the above potentials.

Note that "connection" in this specification and the like refers to electrical connection and corresponds to the state in which current or voltage can be conducted.

Here, a drain withstand voltage of the transistor described in this embodiment is described below.

When the electric field in the semiconductor reaches a certain threshold value, impact ionization occurs, and carriers accelerated by the high electric field impact crystal lattices in a depletion layer, thereby generating pairs of electrons and holes. As the electric field becomes higher, the pairs of electrons and holes generated by the impact ionization are further accelerated by the electric field, and the impact ionization is repeated, which causes an avalanche breakdown in which current is increased exponentially. The impact ionization occurs because carriers (electrons and holes) have kinetic energy that is larger than or equal to the band gap of the semiconductor. Therefore, the electric field which causes the impact ionization is increased as the band gap is increased.

Since the band gap of an oxide semiconductor is 3.15 eV, which is larger than the band gap of silicon, i.e., 1.74 eV, the avalanche breakdown is unlikely to occur. Therefore, a transistor using the oxide semiconductor has a high drain withstand voltage, and an exponential sudden increase of on-state current is unlikely to occur even when a high electric field is applied.

Next, hot-carrier degradation of a transistor using an oxide semiconductor is described.

The hot-carrier degradation means deterioration of transistor characteristics, e.g., variation in the threshold voltage or a gate leakage current, which is caused as follows: electrons that are accelerated to be rapid are injected into a gate insulating film in the vicinity of a drain in a channel and become fixed electric charge or form trap levels at the interface between the gate insulating film and the oxide semiconductor. The factors of the hot-carrier degradation are, for example, channel-hot-electron injection (CHE injection) and drain-avalanche-hot-carrier injection (DAHC injection).

Since the band gap of silicon is narrow, electrons are likely to be generated like an avalanche owing to an avalanche breakdown, and the number of electrons that are accelerated to be so rapid as to go over a potential barrier to the gate insulating film is increased. However, the oxide semiconductor described in this embodiment has a wide band gap; therefore, the avalanche breakdown is unlikely to occur and resistance to the hot-carrier degradation is higher than that of silicon. Note that although the band gap of silicon carbide which is one of materials having high withstand voltage and that of an oxide semiconductor are substantially equal to each other, electrons are less likely to be accelerated, hot-carrier degradation is less likely to be caused than in the case of silicon carbide, and drain withstand voltage is high in the oxide semiconductor because the mobility of the oxide semiconductor is two orders of magnitude smaller than that of silicon carbide.

From the above, the transistor using an oxide semiconductor has high drain withstand voltage; specifically, such a transistor can have a drain withstand voltage greater than or equal to 100 V, preferably greater than or equal to 500 V, far preferably greater than or equal to 1 kV.

Comparison between a transistor using silicon carbide, which is a typical example of a transistor, and a transistor using an oxide semiconductor is described below. Here, 4H—SiC is used as the silicon carbide.

An oxide semiconductor and 4H—SiC are common in some points. One example thereof is intrinsic carrier density. According to the Fermi-Dirac distribution, the intrinsic carrier density of the oxide semiconductor is estimated to about $10^{-7}$ cm$^{-3}$, which is extremely low like the carrier density of 4H—SiC, i.e., $6.7 \times 10^{-11}$ cm$^{-3}$.

In addition, the energy band gap of the oxide semiconductor is 3.0 eV to 3.5 eV and that of 4H—SiC is 3.26 eV, which means that the oxide semiconductor and the silicon carbide are both wide-gap semiconductors.

However, the manufacturing temperatures of a transistor using an oxide semiconductor and a transistor using silicon carbide are largely different from each other. Heat treatment at 1500° C. to 2000° C. is generally needed in the case of using silicon carbide. In contrast, in the case of using an oxide semiconductor, manufacturing can be performed by heat treatment at 300° C. to 500° C. (lower than or equal to the glass transition temperature, about 700° C. at maximum), which allows manufacturing of a transistor over a large-sized substrate. In addition, throughput can be increased.

Further, a manufacturing process of the transistor using silicon carbide, which uses a PN junction, involves a step of doping with an impurity that can be a donor or an acceptor (e.g., phosphorus or boron); therefore, the number of manufacturing steps is increased. On the other hand, the transistor using an oxide semiconductor is not needed to be provided with a PN junction; therefore, the number of manufacturing steps can be decreased and the throughput can be improved, and further, a large-sized substrate can be used.

Note that considerable researches have been done on properties of oxide semiconductors such as density of state (DOS) in the band gap; however, the research does not include the idea of sufficiently reducing the DOS itself. In this embodiment, a highly purified oxide semiconductor is manufactured by removing water or hydrogen which might induce the DOS from the oxide semiconductor. This idea is based on the idea that the DOS itself is reduced sufficiently; thus, excellent industrial products can be manufactured.

Further, it is also possible to form a more highly purified (i-type) oxide semiconductor by supplying oxygen to a dangling bond of metal which is generated by an oxygen defect and reducing the DOS due to the oxygen defect. For example, an oxide film containing an excessive amount of oxygen is formed in close contact with a channel formation region and oxygen is supplied from the oxide film, whereby the DOS due to an oxygen defect can be reduced.

It is said that a defect of the oxide semiconductor is caused by a shallow level of 0.1 eV to 0.2 eV below the conduction band due to an excessive amount of hydrogen, a deep level due to lack of oxygen, or the like. The technical idea that hydrogen is reduced as much as possible and oxygen is sufficiently supplied in order to eliminate such a defect would be right.

An oxide semiconductor is generally considered as an n-type semiconductor; however, in this embodiment, an i-type oxide semiconductor is realized by removing an impurity, particularly water or hydrogen. In this point, different from the case of silicon which is made to be an i-type silicon by adding an impurity, one embodiment of the present invention includes a novel technical idea.

By making the oxide semiconductor an i-type semiconductor, favorable temperature characteristics of the transistor can be obtained; specifically, in terms of the current vs. voltage characteristics of the transistor, on-state current, off-state current, field-effect mobility, an S value, and a threshold voltage are hardly fluctuated at temperatures ranging from −25° C. to 150° C. That is, the current vs. voltage characteristics are hardly degraded by the temperature.

In the transistor using an oxide semiconductor which is described in this embodiment, mobility is about two orders of magnitude smaller than that of a transistor using silicon carbide; however, a current value and device characteristics of the transistor can be improved by increasing the drain voltage and the channel width (W).

A technical idea of this embodiment is that an impurity is not added to an oxide semiconductor and the oxide semiconductor itself is highly purified by removing an impurity such as water or hydrogen which exists therein. In other words, the oxide semiconductor is highly purified by removing water or hydrogen which forms a donor level, reducing oxygen deficiency, and sufficiently supplying oxygen that is a main component of the oxide semiconductor.

In an oxide semiconductor as deposition, a hydrogen concentration on the order of $10^{20}$ cm$^{-3}$ is measured by secondary ion mass spectrometry (SIMS). In accordance with the present invention is to highly purify an oxide semiconductor to obtain an electrically i-type (intrinsic) oxide semiconductor by removing an impurity such as water or hydrogen which forms a donor level and further by adding oxygen (one of components of the oxide semiconductor) which decreases at the same time as the removal of water or hydrogen, to the oxide semiconductor.

In this embodiment, it is preferable that the amount of water and hydrogen in the oxide semiconductor and the number of carriers in the oxide semiconductor be small as much as possible. In other words, the carrier density is preferably less than $1 \times 10^{14}$ cm$^{-3}$, far preferably less than $1 \times 10^{12}$ cm$^{-3}$, still far preferably less than $1 \times 10^{11}$ cm$^{-3}$ that is less than the measurement limit. Further, in the technical idea of this embodiment, an ideal carrier density is 0 or as close to 0 as possible. By reducing the number of and preferably removing carriers in the oxide semiconductor, the oxide semiconductor is made to function as a path through which carriers pass in the transistor. As a result, the oxide semiconductor is made to be an i-type (intrinsic) oxide semiconductor which is highly purified and includes an extremely small number of or no carriers, whereby the off-state current can be extremely small when the transistor is off, which is the technical idea of this embodiment.

In addition, when the oxide semiconductor functions as a path and the oxide semiconductor itself is an i-type (intrinsic) oxide semiconductor which is highly purified so as to include an extremely small number of or no carriers, carriers are supplied from a source and drain electrodes.

The transistor having the structure described in Embodiment 2 can less occupy a substrate surface than a horizontal transistor in which a channel is formed substantially in parallel with a substrate as described in Embodiment 1. As a result of this, it is possible to miniaturize the transistor.

As described above, the oxide semiconductor film is highly purified so that an impurity that is not a main component of the oxide semiconductor film, typically hydrogen, water, a hydroxy group, or hydride, is contained as little as possible, whereby good operation of the transistor can be obtained. In particular, withstand voltage can be higher, a short channel effect can be reduced, and a high on-off ratio can be realized.

Further, similarly to the crystal region 109 in Embodiment 1, c-axes of crystals in the crystal region 209 in the superficial portion are oriented in a direction which is substantially perpendicular to the top surface of the oxide semiconductor film 208 and the crystals are adjacent to each other. Therefore, as described in Embodiment 1, owing to the crystal region 209, the electrical characteristics of the oxide semiconductor film 208 in a direction which is parallel to the top surface thereof are improved. According to one embodiment of the present invention, in the crystal region, crystal grains are adjacent to each other and metal elements each of which is a component element of the oxide semiconductor are continuous, that is, continuously in contact with each other between crystal grains which are adjacent to each other. Therefore, electrical characteristics in a direction parallel to the top surface of the oxide semiconductor film 208 can be further improved. Therefore, the carrier mobility in the superficial portion of the oxide semiconductor film 208 is improved, so that the field-effect mobility of the transistor using the oxide semiconductor film 208 is increased and good electrical characteristics can be achieved.

The crystal structure of the crystal region 209 is not limited to the above-described structure, and the crystal region 209 may include a crystal having another structure. For example, in the case of using an In—Ga—Zn—O-based oxide semiconductor material, crystals of $In_2Ga_2ZnO_7$, $InGaZn_5O_8$, or the like may be included in addition to crystals of $InGaZnO_4$ crystals. Needless to say, the case where the crystals of $InGaZnO_4$ exist in the whole crystal region 209 is more effective and more preferable.

Further, the crystal region 209 is more stable than the amorphous region 210; therefore, when the crystal region 209 is included in the superficial portion of the oxide semiconductor film 208, the entry of impurities (e.g., hydrogen, water, a hydroxy group, hydride, or the like) into the amorphous region 210 can be suppressed. Thus, the reliability of the oxide semiconductor film 208 can be improved.

This embodiment can be implemented by being combined as appropriate with the above-described embodiment.

Embodiment 3

In Embodiment 3, a structure and a method for manufacturing a semiconductor device will be described using a bottom-gate transistor having a channel protective structure as an example. Embodiment 1 can be applied to the same portions as Embodiment 1 or portions having functions similar to those of Embodiment 1, and therefore, description thereof is not omitted.

Figure 8A:
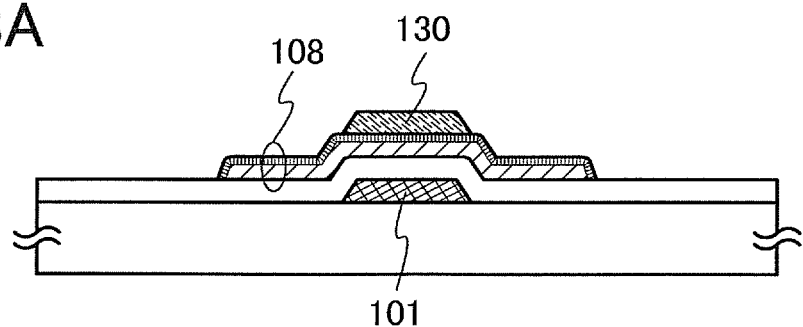
FIGS. 8A to 8C are views illustrating a method for manufacturing a semiconductor device.

The state shown in FIG. 1E described in Embodiment 1 is obtained through the process up to and including the second heat treatment in a similar manner. Next, as shown in FIG. 8A, a channel protective film 130 is formed over the oxide semiconductor film 108 so as to overlap with a region of the oxide semiconductor film 108, which overlaps with the gate electrode 101, that is, so as to overlap with a channel formation region. The channel protective film 130 can prevent the portion of the oxide semiconductor film 108, which serves as the channel formation region, from being damaged in a later step (for example, reduction in thickness due to plasma or an etchant in etching). Accordingly, reliability of the transistor can be improved.

The channel protective film 130 can be formed using an inorganic material including oxygen (such as silicon oxide, silicon oxynitride, or silicon nitride oxide). The channel protective film 130 can be formed by a vapor deposition method such as a plasma enhanced CVD method or a thermal CVD method, or a sputtering method. After the deposition of the channel protective film 130, the shape thereof is processed by etching. In this embodiment, the channel protective film 130 is formed in such a manner that a silicon oxide film is formed by a sputtering method and processed by etching using a mask formed by photolithography.

After the channel protective film 130 is formed, heat treatment may be performed. The heat treatment is performed in an inert gas atmosphere (nitrogen, helium, neon, argon, or the like) at a temperature, preferably, higher than or equal to 200° C. and lower than or equal to 400° C., for example, at a temperature higher than or equal to 250° C. and lower than or equal to 350° C. In this embodiment, heat treatment for 1 hour at 250° C. in a nitrogen atmosphere is performed. By the heat treatment performed on the state where the portion of the oxide semiconductor film 108 which forms the channel formation region is in contact with the channel protective film 130 that is an insulating film containing oxygen, oxygen is supplied to the oxide semiconductor film 108, whereby the region of the oxide semiconductor film 108, which is in contact with the channel protective film 130 can be selectively made an oxygen-excess state. Consequently, even when an oxygen defect occurs due to the second heat treatment in a region of the oxide semiconductor film 108, which is in contact with at least the channel protective film 130, the number of oxygen defects which become donors is reduced, a structure which satisfies the stoichiometric composition ratio can be obtained, and a channel formation region which overlaps with the gate electrode 101 becomes i-type or substantially i-type, which leads to improvement of the electrical characteristics of the transistor and suppression of variation of the electrical characteristics. The timing of this heat treatment is not particularly limited as long as it is after the formation of the channel protective film 130, and can be performed without increasing the number of manufacturing steps by doubling as another step such as a heat treatment for a formation of a resin film or a heat treatment for reduction of the resistance of a transparent conductive film.

Figure 8B:
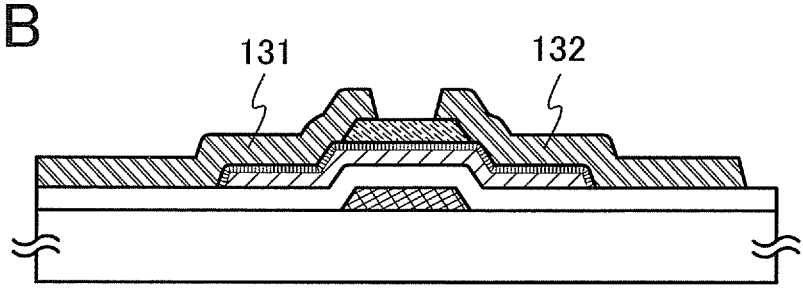

Next, as shown in FIG. 8B, a conductive film which forms a source electrode and a drain electrode (including a wiring formed from the same layer as the source electrode or the drain electrode) is formed over the oxide semiconductor film 108 and is processed into an appropriate shape by etching or the like to form a source electrode 131 and a drain electrode 132. The description on the source electrode 111 and the drain electrode 112 described in Embodiment 1 can be referred to for a material, the structure, and the thickness of each of the source electrode 131 and the drain electrode 132.

The source electrode 131 and the drain electrode 132 are in contact with the crystal region 109 of the oxide semiconductor film 108. Owing to this contact between the highly conductive crystal region 109 and each of the source electrode 131 and the drain electrode 132, the contact resistance between each of the source electrode 131 and the drain electrode 132 and the oxide semiconductor film 108 can be reduced, so that the on-state current of the transistor formed can be increased.

Next, plasma treatment is performed thereon, using a gas such as $N_2O$, $N_2$, or Ar. By the plasma treatment, adsorbed water or the like which attaches to an exposed surface of the oxide semiconductor film is removed. Plasma treatment may be performed using a mixture gas of oxygen and argon as well.

Figure 8C:
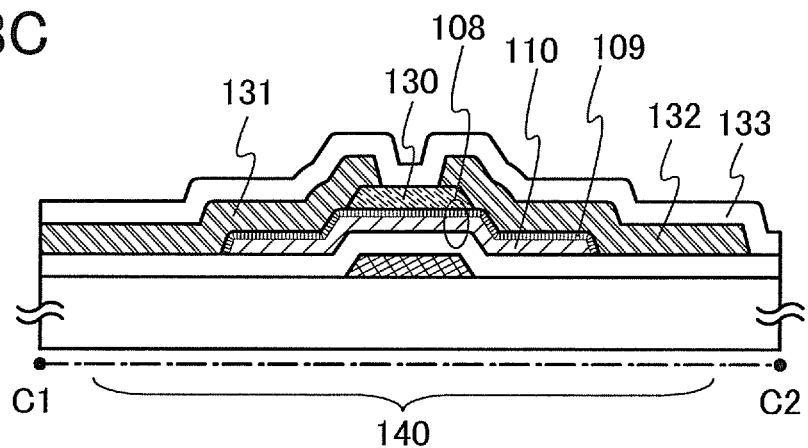

After the plasma treatment, as shown in FIG. 8C, an insulating film 133 is formed to cover the source electrode 131, the drain electrode 132, the channel protective film 130, and the oxide semiconductor film 108. The description on the insulating film 113 described in Embodiment 1 can be referred to for a material, the thickness, the structure, and the manufacturing method of the insulating film 133.

After the insulating film 133 is formed, heat treatment may be performed. The heat treatment is performed in an inert gas atmosphere (nitrogen, helium, neon, argon, or the like) at a temperature, preferably, higher than or equal to 200° C. and lower than or equal to 400° C., for example, at a temperature higher than or equal to 250° C. and lower than or equal to 350° C. In this embodiment, heat treatment for 1 hour at 250° C. in a nitrogen atmosphere is performed.

Through the above-described process, a transistor 140 is formed.

Although the oxide semiconductor film 108 includes the crystal region 109 and the amorphous region 110 in this embodiment, the oxide semiconductor film 108 may be almost wholly occupied by the crystal region 109. Even in the case where the oxide semiconductor film 108 includes the crystal region 109 and the amorphous region 110, the depth to which the crystal region 109 reaches from the top surface of the oxide semiconductor film 108 is not limited that of the structure shown in FIGS. 8A to 8C.

Figure 9:
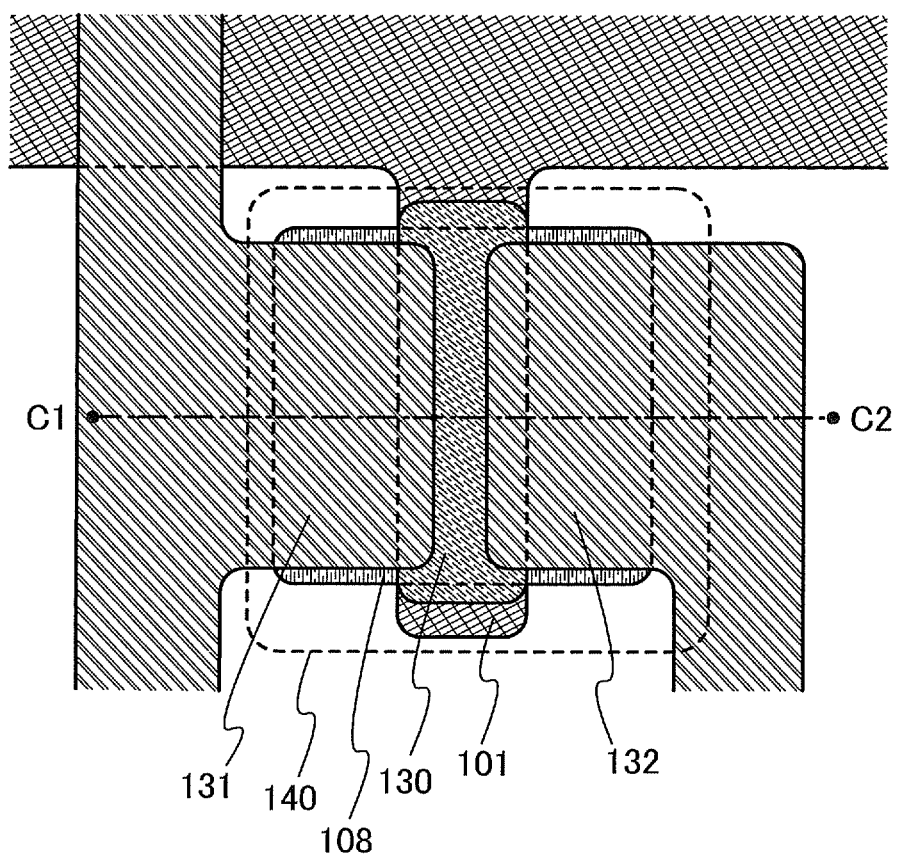
FIG. 9 is a top view of a semiconductor device.

FIG. 9 is a top view of the transistor 140 shown in FIG. 8C. A cross-sectional view along dashed line C1-C2 in FIG. 9 corresponds to FIG. 8C.

The transistor 140 formed according to the above-described manufacturing method includes the gate electrode 101, the gate insulating film 102 over the gate electrode 101, the oxide semiconductor film 108 over the gate insulating film 102, the channel protective film 130 over the oxide semiconductor film 108, and the source electrode 131 and the drain electrode 132 over the oxide semiconductor film 108. The transistor 140 may further include the insulating film 133 over the oxide semiconductor film 108, the source electrode 131 and the drain electrode 132, and the channel protective film 130.

Although the transistor 140 is described as a single-gate transistor, a multi-gate transistor including a plurality of channel formation regions can be formed when needed.

Figure 10A:
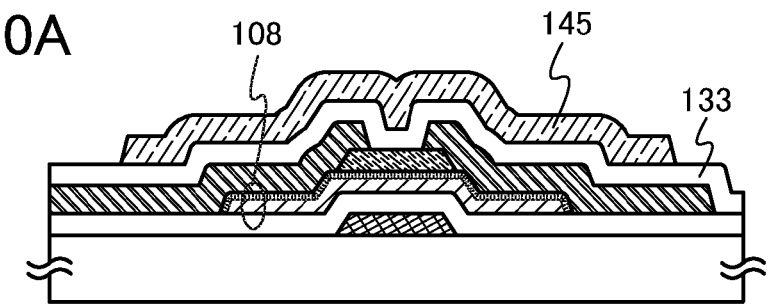
FIGS. 10A to 10C are views illustrating a method for manufacturing a semiconductor device.

Next, a conductive film may be formed over the insulating film 133 and may be patterned so that a back gate electrode 145 is formed so as to overlap with the oxide semiconductor film 108 as shown in FIG. 10A. The back gate electrode 145 can be formed using a material and a structure which are similar to those of the gate electrode 101 or the source electrode 131 or the drain electrode 132.

The thickness of the back gate electrode 145 is set to 10 nm to 400 nm, preferably 100 nm to 200 nm. In this embodiment, a conductive film in which a titanium film, an aluminum film, and a titanium film are stacked is formed. Then, a resist mask is formed by a photolithography method, and an unnecessary portion is removed by etching so that the conductive film is processed (patterned) into an appropriate shape; thus, the back gate electrode 145 is formed.

Figure 10B:
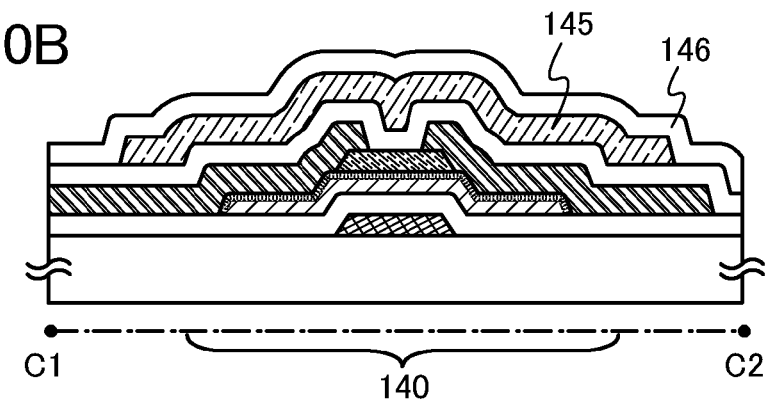

Next, as shown in FIG. 10B, an insulating film 146 is formed so as to cover the back gate electrode 145. The insulating film 146 is preferably formed using a material with a high barrier property that can prevent moisture, hydrogen, oxygen, and the like in an atmosphere from affecting the characteristics of the transistor 140. For example, the insulating film having a high barrier property can be formed to have a single-layer structure or a stacked-layer structure of a silicon nitride film, a silicon nitride oxide film, an aluminum nitride film, an aluminum nitride oxide film, or the like by a plasma CVD method, a sputtering method, or the like. In order to obtain an effect of a barrier property, the insulating film 146 is preferably formed to a thickness of 15 nm to 400 nm, for example.

In this embodiment, an insulating film with a thickness of 300 nm is formed by a plasma CVD method. The insulating film is formed under the following conditions: the flow rate of a silane gas is 4 sccm; the flow rate of nitrous oxide is 800 sccm; and the substrate temperature is 400° C.

Figure 10C:
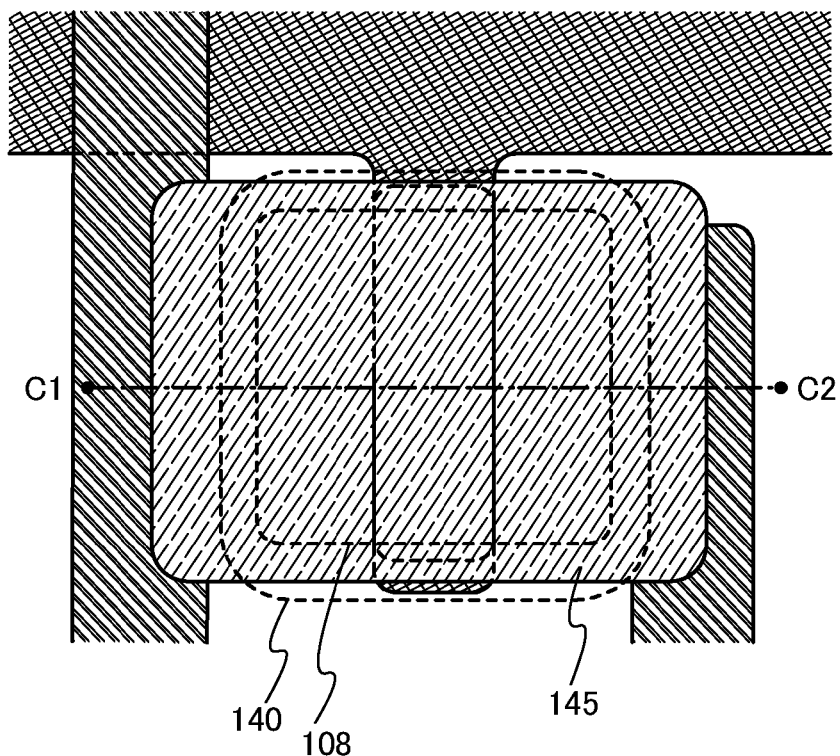

A top view of the semiconductor device shown in FIG. 10B is FIG. 10C. FIG. 10B is a cross-sectional view along dashed line C1-C2 in FIG. 10C.

Although the back gate electrode 145 covers the oxide semiconductor film 108 entirely in FIG. 10B, one embodiment of the present invention is not limited to this structure. The back gate electrode 145 overlaps with at least part of the channel formation region included in the oxide semiconductor film 108.

The back gate electrode 145 may be electrically insulated to be in a floating state, or may be in a state where the back gate electrode 145 is supplied with a potential. In the latter case, to the back gate electrode 145, a potential which is the same level as the gate electrode 101 may be applied, or a fixed potential such as ground may be applied. The level of the potential supplied to the back gate electrode 145 is controlled, whereby the threshold voltage of the transistor 140 can be controlled.

This embodiment can be implemented by being combined as appropriate with the above-described embodiments.

Embodiment 4

In Embodiment 4, a structure of a semiconductor display device which is referred to as electronic paper or digital paper that is one of the semiconductor display devices formed using a manufacturing method of the present invention will be described.

A display element which can control grayscale by voltage application and has a memory property is used for electronic paper. Specifically, in the display element used for electronic paper, the following display element can be used: a non-aqueous electrophoretic display element; a display element using a PDLC (polymer dispersed liquid crystal) method, in which liquid crystal droplets are dispersed in a high polymer material between two electrodes; a display element which includes chiral nematic liquid crystal or cholesteric liquid crystal between two electrodes; a display element which includes charged fine particles between two electrodes and employs a particle-moving method by which the charged fine particles are moved through fine particles by using an electric field; or the like. Non-aqueous electrophoretic display elements include in its category a display element in which a dispersion liquid, in which charged fine particles are dispersed, is sandwiched between two electrodes; a display element in which a dispersion liquid in which charged fine particles are dispersed is included over two electrodes between which an insulating film is interposed; a display element in which twisting balls having hemispheres which are different colors which charge differently are dispersed in a solvent between two electrodes; a display element which includes microcapsules, in which a plurality of charged fine particles are dispersed in a solution, between two electrodes; and the like.

Figure 13A:
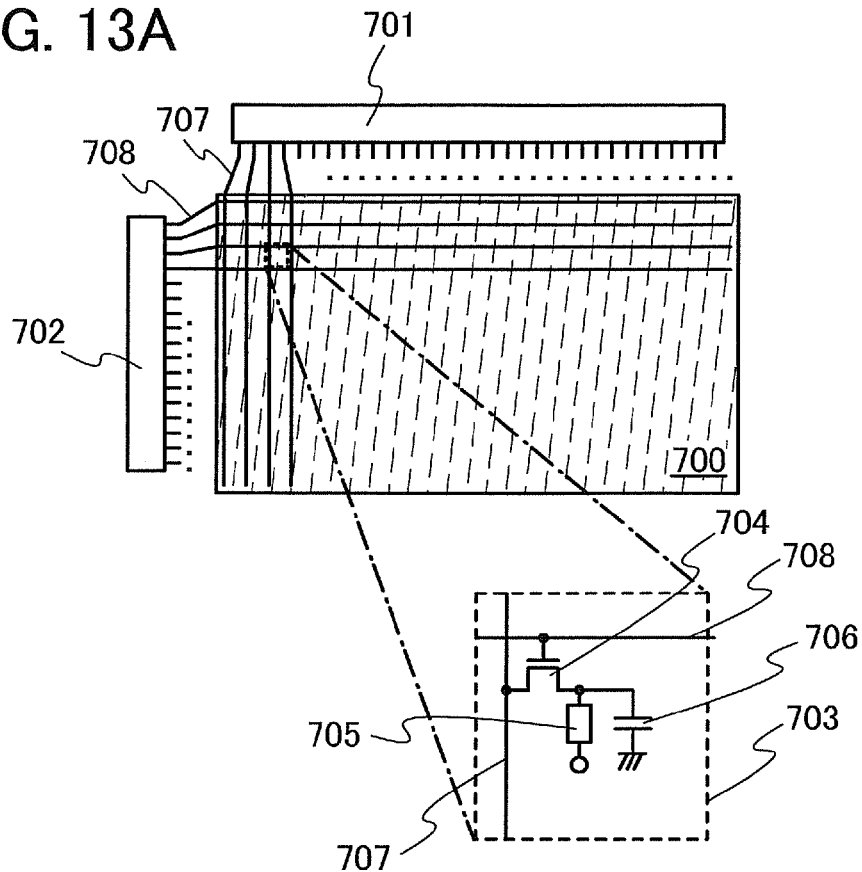
FIGS. 13A and 13B are a top view and a cross-sectional view of electronic paper, respectively.

FIG. 13A is a top view of a pixel portion 700, a signal line driver circuit 701, and a scan line driver circuit 702 of electronic paper.

The pixel portion 700 includes a plurality of pixels 703. A plurality of signal lines 707 is led into the pixel portion 700 from the signal line driver circuit 701. A plurality of scan lines 708 is led into the pixel portion 700 from the scan line driver circuit 702.

Each pixel 703 includes a transistor 704, a display element 705, and a storage capacitor 706. A gate electrode of the transistor 704 is connected to one of the scan lines 708. One of a source electrode and a drain electrode of the transistor 704 is connected to one of the signal lines 707, and the other of the source electrode and the drain electrode of the transistor 704 is connected to a pixel electrode of the display element 705.

In FIG. 13A, the storage capacitor 706 is connected in parallel to the display element 705 so that voltage applied between the pixel electrode and a counter electrode of the display element 705 may be stored; however, in the case where the memory property of the display element 705 is high enough to maintain display, the storage capacitor 706 is not necessarily provided.

Although a structure of an active matrix pixel portion in which one transistor which serves as a switching element is provided in each pixel is illustrated in FIG. 13A, electronic paper of one embodiment of the present invention is not limited to this structure. A plurality of transistors may be provided in each pixel. In addition to the transistor, another element such as a capacitor, a resistor, or a coil may be provided.

Figure 13B:
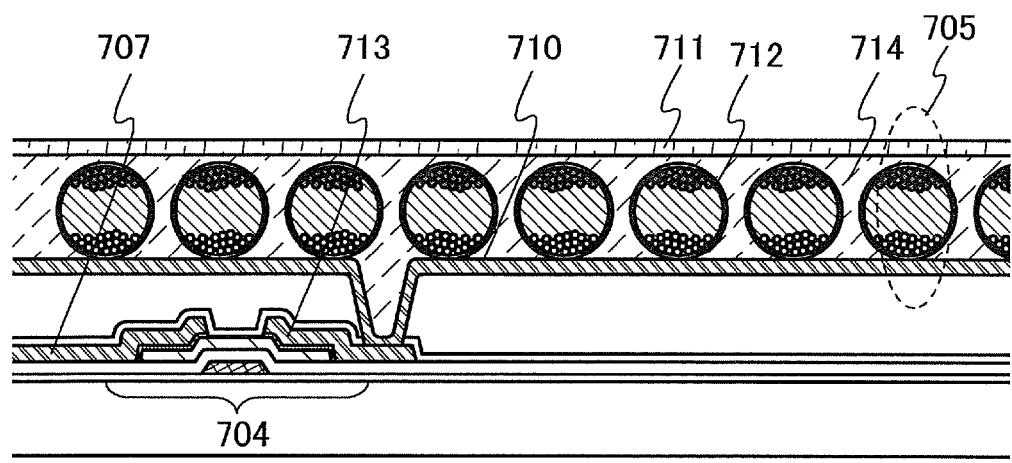

A cross-sectional view of the display element 705 provided in each pixel 703 is illustrated in FIG. 13B taking electrophoretic electronic paper having microcapsules as an example.

The display element 705 includes a pixel electrode 710, a counter electrode 711, and a microcapsule 712 to which voltage is applied by the pixel electrode 710 and the counter electrode 711. A source electrode or a drain electrode 713 of the transistor 704 is connected to the pixel electrode 710.

In the microcapsule 712, a positively charged white pigment such as titanium oxide and a negatively charged black pigment such as carbon black are encapsulated together with a dispersion medium such as oil. Voltage is applied between the pixel electrode and the counter electrode in accordance with the voltage of a video signal applied to the pixel electrode 710, and the black pigment and the white pigment are drawn to a positive electrode side and a negative electrode side, respectively, whereby grayscales can be displayed.

In FIG. 13B, the microcapsule 712 is fixed by a light-transmitting resin 714 between the pixel electrode 710 and the counter electrode 711. However, one embodiment of the present invention is not limited to this structure, and a space formed by the microcapsule 712, the pixel electrode 710, and the counter electrode 711 may be filled with a gas such as air, an inert gas, or the like. In that case, the microcapsule 712 is preferably fixed to one of or both the pixel electrode 710 and the counter electrode 711 by an adhesive agent or the like.

The number of the microcapsules 712 included in the display element 705 is not necessarily plural as illustrated in FIG. 13B. One display element 705 may have a plurality of the microcapsules 712, or a plurality of the display elements 705 may have one microcapsule 712. For example, two display elements 705 share one microcapsule 712, and positive voltage and negative voltage are applied to the pixel electrode 710 included in one of the display elements 705 and the pixel electrode 710 included in the other display element 705, respectively. In that case, in the microcapsule 712 in a region overlapping with the pixel electrode 710 to which positive voltage is applied, the black pigment is drawn to the pixel electrode 710 side and the white pigment is drawn to the counter electrode 711 side. On the other hand, in the microcapsule 712 in a region overlapping with the pixel electrode 710 to which negative voltage is applied, the white pigment is drawn to the pixel electrode 710 side and the black pigment is drawn to the counter electrode 711 side.

Next, a specific driving method of electronic paper is described using the above-described electronic paper of the electrophoretic system as an example.

The operation of the electronic paper can be described in accordance with the following periods: an initialization period, a writing period, and a holding period.

First, the grayscale levels of each of the pixels in a pixel portion are set to be equal in the initialization period before a display image is switched in order to initialize display elements. Initialization of the display elements prevents a residual image from remaining. Specifically, in an electrophoretic system, displayed grayscale level is adjusted by the microcapsule 712 included in the display element 705 such that the display of each pixel is white or black.

In this embodiment, an operation for initialization in the case where an initialization video signal for displaying black is input to a pixel and then an initialization video signal for displaying white is input to the pixel is described. For example, in the case where image display is performed with respect to the counter electrode 711 side in the electronic paper of an electrophoretic system, voltage is applied to the display element 705 such that the black pigment in the microcapsule 712 moves to the counter electrode 711 side and the white pigment in the microcapsule 712 moves to the pixel electrode 710 side. Then, voltage is applied to the display element 705 such that the white pigment in the microcapsule 712 moves to the counter electrode 711 side and the black pigment in the microcapsule 712 moves to the pixel electrode 710 side.

Further, in the case where the initialization video signal is input to the pixel only once, the white pigment and the black pigment in the microcapsule 712 do not finish moving completely depending on the grayscale level displayed before the initialization period; thus, it is possible that a difference between grayscale levels for display of pixels occurs even after the initialization period ends. Therefore, it is preferable that negative voltage −Vp with respect to common voltage Vcom be applied to the pixel electrode 710 a plurality of times so that black is displayed and positive voltage Vp with respect to the common voltage Vcom be applied to the pixel electrode 710 a plurality of times so that white is displayed.

In the case where grayscale levels for display before the initialization period differ depending on display elements of each of the pixels, the minimum number of times for inputting an initialization video signal also varies. Accordingly, the number of times for inputting an initialization video signal may be changed between pixels in accordance with a grayscale level for display before the initialization period. In that case, the common voltage Vcom is preferably input to a pixel to which the initialization video signal is not necessarily input.

In order for the voltage Vp or the voltage −Vp which is an initialization video signal to be applied to the pixel electrode 710 plural times, the following operation sequence is performed plural times: the initialization video signal is input to a pixel of a line including the scan line in a period during which a pulse of a selection signal is supplied to each scan line. The voltage Vp or the voltage −Vp which is an initialization video signal is applied to the pixel electrode 710 plural times, whereby movement of the white pigment and the black pigment in the microcapsule 712 converges in order to prevent a difference of grayscale levels between pixels from occurring. Thus, initialization of a pixel in the pixel portion can be performed.

Note that in each pixel in the initialization period, black may be displayed after white is displayed instead of that white is displayed after black is displayed. Alternatively, in each pixel in the initialization period, black may be displayed after white is displayed; and further, after that white may be displayed.

Further, as for all of the pixels in the pixel portion, timing of starting the initialization period is not necessarily the same. For example, timing of starting the initialization period may be different for every pixel, or every group of pixels belonging to the same line, or the like.

Next, in the writing period, a video signal having image data is input to the pixel.

In the case where an image is displayed on the entire pixel portion, in one frame period, a selection signal in which a pulse of voltage is shifted is sequentially input to all of the scan lines. Then, in one line period in which a pulse appears in a selection signal, a video signal having image data is input to all of the signal lines.

The white pigment and the black pigment in the microcapsule 712 are moved to the pixel electrode 710 side and the counter electrode 711 side in accordance with the voltage of the video signal applied to the pixel electrode 710, so that the display element 705 displays a grayscale.

Also in the writing period, the voltage of a video signal is preferably applied to the pixel electrode 710 plural times as in the initialization period. Accordingly, the following operation sequence is performed plural times: the video signal is input to a pixel of a line including the scan line in a period during which a pulse of a selection signal is supplied to each scan line.

Next, in the holding period, the common voltage Vcom is input to all of the pixels through signal lines, and after that, a selection signal is not input to a scan line or a video signal is not input to a signal line. Accordingly, the positions of the white pigment and the black pigment in the microcapsule 712 included in the display element 705 are maintained unless positive or negative voltage is applied between the pixel electrode 710 and the common electrode 711, so that the grayscale level displayed on the display element 705 is held. Therefore, an image written in the writing period is maintained even in the holding period.

Note that voltage needed for changing the grayscale level of the display element used for electronic paper tends to be higher than that of a liquid crystal element used for a liquid crystal display device or that of a light-emitting element such as an organic light-emitting element used for a light-emitting device. Therefore, the potential difference between the source electrode and the drain electrode of the transistor 704 of a pixel, which serves as a switching element in a writing period is large; as a result, off-state current is increased, and disturbance of display is likely to occur due to fluctuation of the potential of the pixel electrode 710. It is effective to increase the capacity of the storage capacitor 706 in order to prevent the potential of the pixel electrode 710 from fluctuating due to the off-state current of the transistor 704. In addition, not only voltage generated between the pixel electrode 710 and the counter electrode 711 but also voltage generated between the signal line 707 and the counter electrode 711 is applied to the microcapsule 712, so that distorted images are displayed by the display element 705 in some cases. In order to prevent generation of this distorted image, it is effective to have a large area of the pixel electrode 710 and to prevent application of voltage which is generated between the signal line 707 and the counter electrode 711 to the microcapsule 712. However, as described above, when the capacity of the storage capacitor 706 increases in order to prevent fluctuation of the potential of the pixel electrode 710 or the area of the pixel electrode 710 increases in order to prevent generation of distorted images on the display, a current value which is to be supplied to the pixel in the writing period increases, so that it takes time to input a video signal. In an electric paper according to one embodiment of the present invention, the crystal region included in the oxide semiconductor film is in contact with the source electrode or the drain electrode in the transistor 704 used as a switching element in the pixel, so that the contact resistance between the oxide semiconductor film and the source electrode or the drain electrode is decreased and the on-state current and the field-effect mobility can be increased. Accordingly, even when the capacity of the storage capacitor 706 increases or even when the area of the pixel electrode 710 increases, a video signal can be input to the pixel quickly. Therefore, the length of the writing period can be suppressed, and displayed images can be switched smoothly.

Further, in one embodiment of the present invention, an oxide semiconductor film whose impurity concentration is extremely low is used for an active layer of the transistor 704. Therefore, the off-state current of the transistor 704 in the state where voltage between the gate electrode and the source electrode is substantially zero, that is, leakage current is considerably low. Therefore, even when a potential difference between the source electrode and the drain electrode of the transistor 704 increases in the writing period, off-state current can be suppressed, and generation of disturbance of display due to the change in the potential of the pixel electrode 710 can be prevented. In addition, the potential difference between the source electrode and the drain electrode of the transistor 704 used as a switching element in the pixel increases in the writing period, so that the transistor 704 easily deteriorates. However, in one embodiment of the present invention, variation in threshold voltage of the transistor 704 due to degradation over time can be reduced, so that reliability of the electronic paper can be enhanced.

This embodiment can be implemented by being combined as appropriate with the above-described embodiments.

Embodiment 5

Figure 14A:
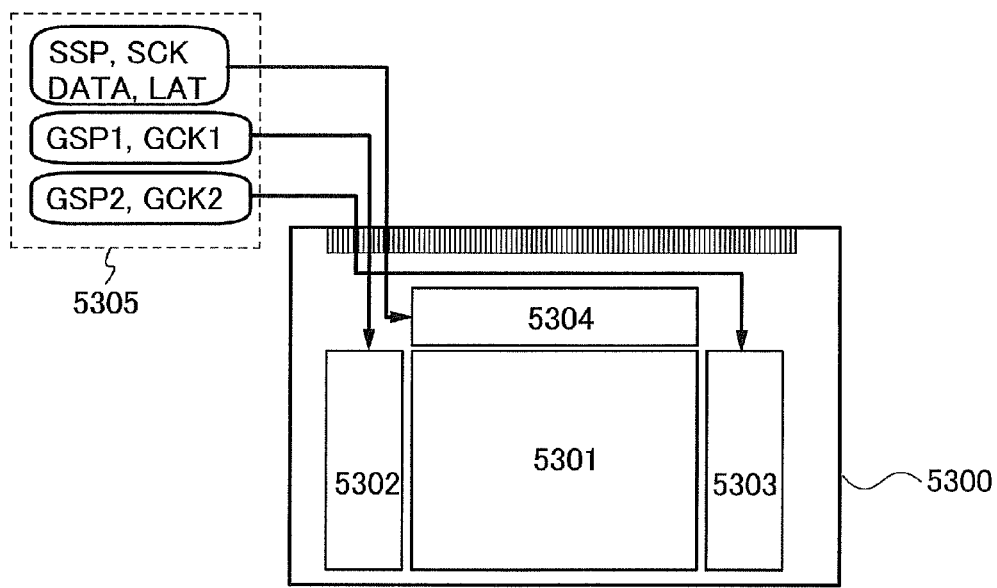
FIGS. 14A and 14B are block diagrams each of a semiconductor device.

FIG. 14A illustrate an example of a block diagram of an active matrix semiconductor display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines which is extended from the signal line driver circuit 5304 is provided and a plurality of scan lines which is extended from the first scan line driver circuit 5302 and the second scan line driver circuit 5303 is provided. Pixels which include display elements are provided in a matrix form in respective regions where the scan lines and the signal lines intersect with each other. Further, the substrate 5300 in the display device is connected to a timing control circuit 5305 (also referred to as a controller or a controller IC) through a connection point such as a flexible printed circuit (FPC).

In FIG. 14A, the first scan line driver circuit 5302, the second scan line driver circuit 5303, and the signal line driver circuit 5304 are formed over one substrate 5300 provided with the pixel portion 5301. Therefore, since the number of components provided outside, such as a driver circuit is reduced, it is possible not only to downsize the display device but also to reduce cost owing to the decrease in the number of assembly steps and inspection steps. In addition, if the driver circuit is provided outside the substrate 5300, a wiring would need to be extended and the number of wiring connections would be increased; therefore, the driver circuit is provided over the substrate 5300, so that the number of connections of the wirings can be reduced. Therefore, the decrease in yield due to defective connection of the driver circuit and the pixel portion can be prevented, and the decrease in reliability due to low mechanical strength at a connection point can be prevented.

Note that as an example, the timing control circuit 5305 supplies a first scan line driver circuit start signal (GSP1) and a scan line driver circuit clock signal (GCK1) to the first scan line driver circuit 5302. The timing control circuit 5305 supplies, for example, a second scan line driver circuit start signal (GSP2) (also referred to as a start pulse) and a scan line driver circuit clock signal (GCK2) to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Note that one of of the first scan line driver circuit 5302 and the second scan line driver circuit 5303 can be omitted.

Figure 14B:
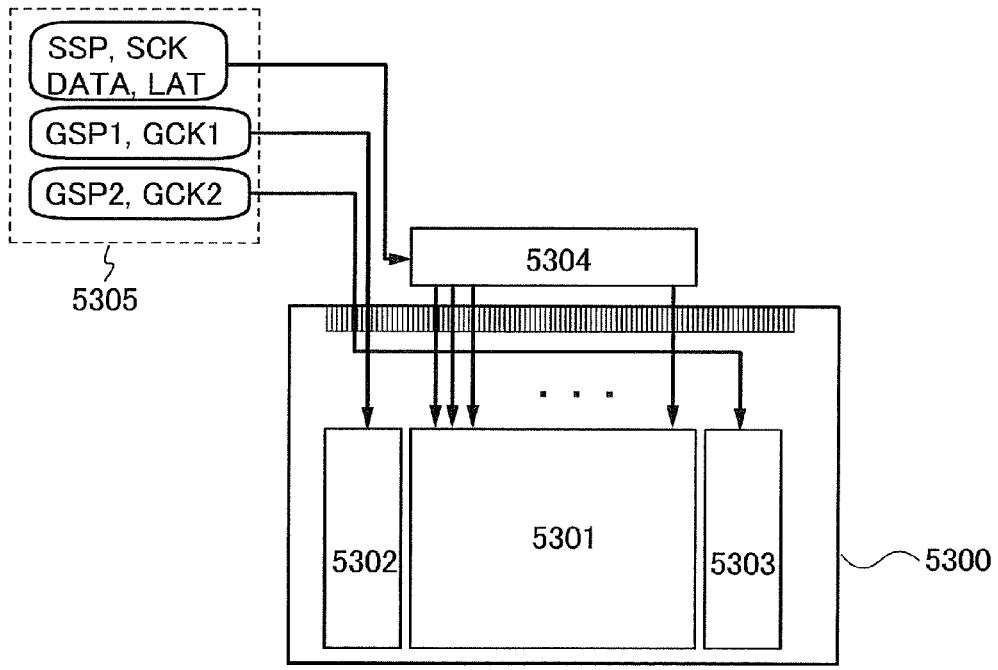

FIG. 14B illustrates a structure in which circuits with low driving frequency (for example, the first scan line driver circuit 5302 and the second scan line driver circuit 5303) are formed over one substrate 5300 provided with the pixel portion 5301 and the signal line driver circuit 5304 is formed over another substrate which is different from the substrate provided with the pixel portion 5301. It is possible to form a circuit with low driving frequency such as an analog switch used for a sampling circuit in the signal line driver circuit 5304 partly over one substrate 5300 provided with the pixel portion 5301. Thus, a system-on-panel is partly employed, so that advantages of the system-on-panel such as the above-described prevention of decrease in yield due to the defective connection or decrease in mechanical strength at a connection point, and reduction in cost due to the decrease in the number of assembly steps and inspection steps can be obtained more or less. Further, as compared with the system-on-panel in which the pixel portion 5301, the first scan line driver circuit 5302, the second scan line driver circuit 5303, and the signal line driver circuit 5304 are formed over one substrate, it is possible to increase the performance of a circuit with high driving frequency, and it is possible to form a pixel portion having a large area, which is difficult to realize in the case of using a single crystal semiconductor.

Next, a structure of a signal line driver circuit using an n-channel transistor is described below.

Figure 15A:
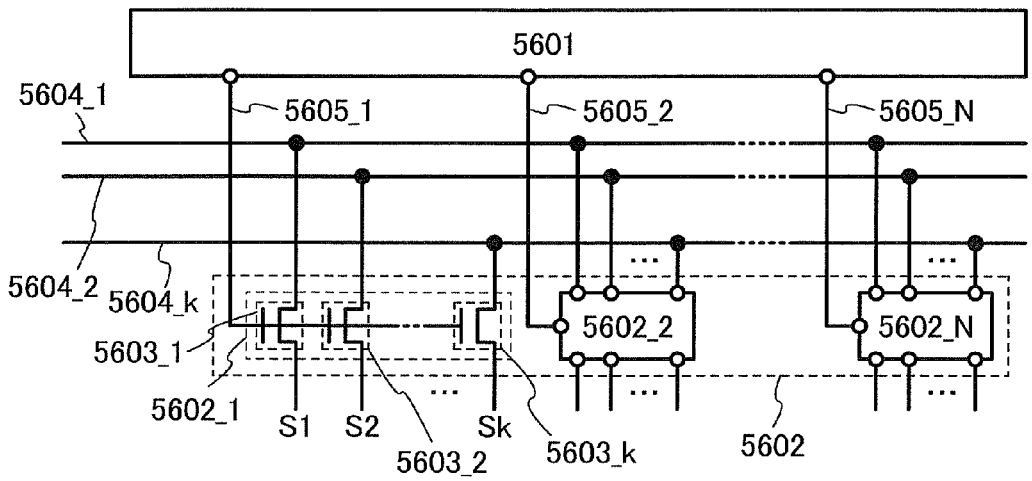
FIGS. 15A and 15B illustrate a structure of a signal line driver circuit.

A signal line driver circuit illustrated in FIG. 15A includes a shift register 5601 and a sampling circuit 5602. The sampling circuit 5602 includes a plurality of switching circuits 5602_1 to 5602_N (N is a natural number). The switching circuits 5602_1 to 5602_N each include a plurality of n-channel transistors 5603_1 to 5603_*k* (k is a natural number).

A connection relation in the signal line driver circuit is described taking the switching circuit 5602_1 as an example. Note that one of a source electrode and a drain electrode of a transistor is referred to as a first terminal, and the other is referred to as a second terminal below.

First terminals of the transistors 5603_1 to 5603_*k* are connected to respective wirings 5604_1 to 5604_*k*. A video signal is input to each of the wirings 5604_1 to 5604_*k*.

Second terminals of the transistors 5603_1 to 5603_*k* are connected to respective signal lines S1 to Sk. Gate electrodes of the transistors 5603_1 to 5603_*k* are connected to the shift register 5601.

The shift register 5601 has the function of sequentially selecting the switching circuits 5602_1 to 5602_N by sequentially outputting timing signals having high level (H-level) voltage to wirings 5605_1 to 5605_N.

The switching circuit 5602_1 has a function of controlling respective conduction states between the wirings 5604_1 to 5604_*k* and the signal lines S1 to Sk (conduction between the first terminal and the second terminal), namely a function of controlling whether or not to supply respective potentials of the wirings 5604_1 to 5604_*k* to the signal lines S1 to Sk with the use of switching of the transistors 5603_1 to 5603_*k*.

Figure 15B:
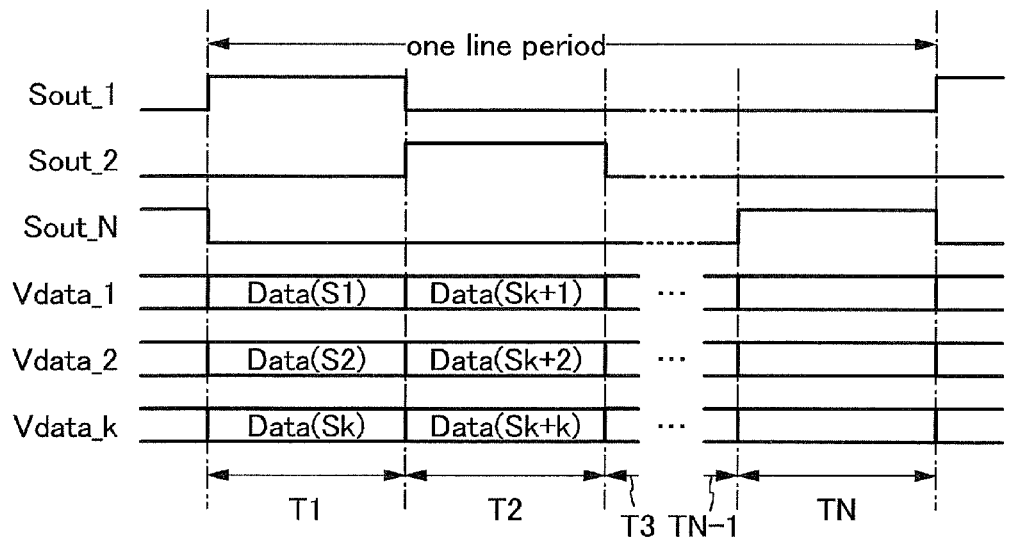

Next, the operation of the signal line driver circuit in FIG. 15A is described with reference to a timing chart in FIG. 15B. FIG. 15B illustrates the timing chart of the timing signals Sout_1 to Sout_N which are input to the respective wirings 5605_1 to 5605_N and video signals Vdata_1 to Vdata_k which are input to the respective wirings 5604_1 to 5604_*k* from the shift register 5601, as an example.

Note that one operation period of the signal line driver circuit corresponds to one line period in a display device. Illustrated in FIG. 15B is the case where one line period is divided into periods T1 to TN. The periods T1 to TN are each periods for writing a video signal into one pixel in a selected row.

In the periods T1 to TN, the shift register 5601 sequentially outputs H-level timing signals to the wirings 5605_1 to 5605_N. For example, in the period T1, the shift register 5601 outputs an H level signal to the wiring 5605_1. Accordingly, the transistors 5603_1 to 5603_*k* included in the switching circuit 5602_1 are turned on, so that the wirings 5604_1 to 5604_*k* and the signal lines S1 to Sk are electrically connected to each other. In that case, Data(S1) to Data(Sk) are input to the respective wirings 5604_1 to 5604_*k*. The Data (S1) to Data(Sk) are input to respective pixels in the first to kth columns in the selected row through the respective transistors 5603_1 to 5603_*k*. Thus, in the periods T1 to TN, video signals are sequentially written to the pixels in the selected row by k columns.

By writing video signals to the pixels by a plurality of columns, the number of video signals or the number of wirings can be reduced. Thus, the number of connections with an external circuit such as a controller can be reduced. By writing video signals to the pixels per plural columns, writing time can be extended and lack of writing of video signals can be prevented.

Next, one embodiment of a shift register which is used for a signal line driver circuit or a scan line driver circuit is described with reference to FIGS. 16A and 16B and FIGS. 17A and 17B.

Figure 16A:
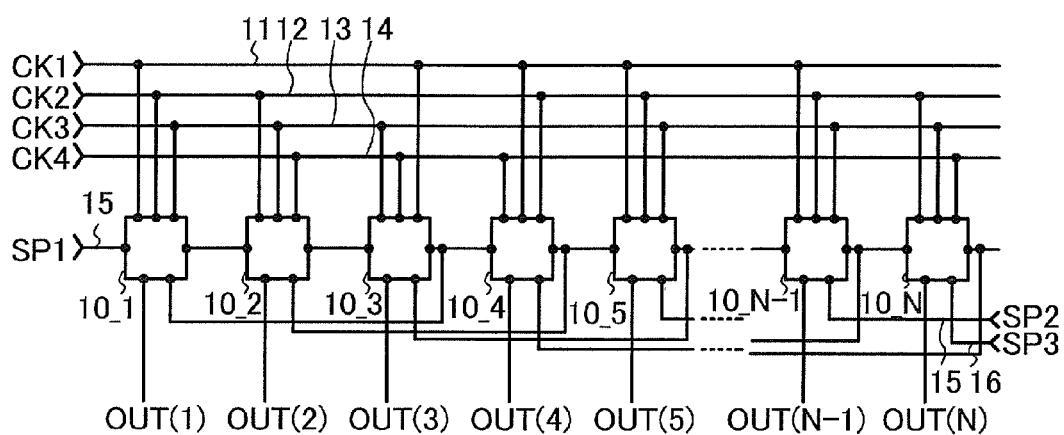
FIGS. 16A and 16B are circuit diagrams each illustrating a structure of a shift register.

The shift register includes first to N-th pulse output circuits 10_1 to 10_N (N is a natural number of 3 or more) (see FIG. 16A). A first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to N-th pulse output circuits 10_1 to 10_N. A start pulse SP1 (a first start pulse) from a fifth wiring 15 is input to the first pulse output circuit 10_1. Further, a signal from the pulse output circuit 10_(n−1) of the previous stage (referred to as a previous stage signal OUT(n−1)) (n is a natural number of 2 or more) is input to the n-th pulse output circuit 10__n_ (n is a natural number of 2 or more and N or less) in a second or subsequent stage. A signal from the third pulse output circuit 10_3 which is two stages after the first pulse output circuit 10_1 is input to the first pulse output circuit 10_1. In a similar way, a signal from the (n+2)-th pulse output circuit 10_(n+2) which is two stages after the n-th pulse output circuit 10_*n* (referred to as the subsequent stage signal OUT(n+2)) is input to the n-th pulse output circuit 10_*n* in the second stage or subsequent stage. Thus, the pulse output circuits of the respective stages output first output signals (OUT(1)(SR) to OUT(N)(SR)) to be input to the pulse output circuits of their respective subsequent stages and/or to the pulse output circuits of their respective stages before their respective previous stages, and second output signals (OUT(1) to OUT(N)) to be input to another circuit or the like. Note that as illustrated in FIG. 16A, a subsequent stage signal OUT(n+2) is not input to the last two stages of the shift register; therefore, as an example, a second start pulse SP2 and a third start pulse SP3 may be input thereto.

Note that the clock signal (CK) is a signal which alternates between an H level and an L level (low level voltage) at regular intervals. The first to fourth clock signals (CK1) to (CK4) are delayed by a 1/4 period sequentially. In this embodiment, by using the first to fourth clock signals (CK1) to (CK4), control or the like of driving of a pulse output circuit is performed.

A first input terminal 21, a second input terminal 22, and a third input terminal 23 are electrically connected to any of the first to fourth wirings 11 to 14. For example, in FIG. 16A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 102 is electrically connected to the second wiring 12, the second input terminal 22 of the second pulse output circuit 102 is electrically connected to the third wiring 13, and the third input terminal 23 of the second pulse output circuit 10_2 is electrically connected to the fourth wiring 14.

Figure 16B:
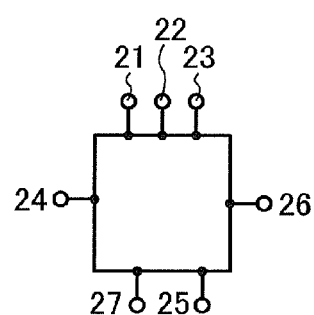

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 16B). In the first pulse output circuit 10_1, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent stage signal OUT(3) is input to the fifth input terminal 25; the first output signal OUT(1)(SR) is output from the first output terminal 26; and the second output signal OUT(1) is output from the second output terminal 27.

Next, an example of a specific circuit structure of a pulse output circuit will be described with reference to FIG. 17A.

Figure 17A:
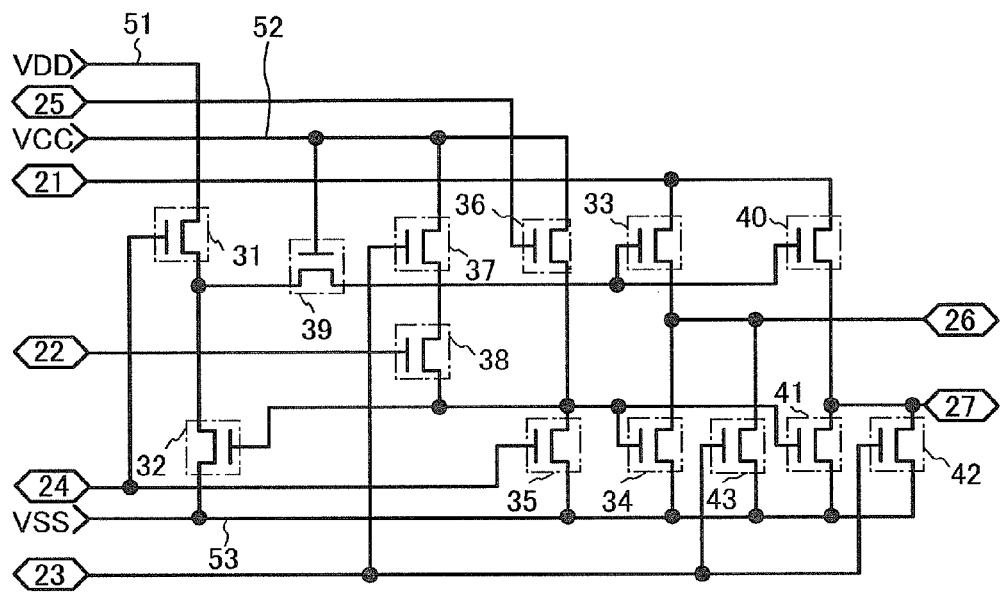
FIGS. 17A and 17B are a diagram illustrating one embodiment of a shift register and a timing chart illustrating operation thereof, respectively.

Pulse output circuits each include 1st to 13th transistors 31 to 43 (see FIG. 17A). Signals or power supply potentials are supplied to the 1st to 13th transistors 31 to 43 from a power supply line 51 to which a first high power supply potential VDD is supplied, a power supply line 52 to which a second high power supply potential VCC is supplied, and a power supply line 53 to which a low power supply potential VSS is supplied, in addition to the above-described first to fifth input terminals 21 to 25, the first output terminal 26, and the second output terminal 27. The relation of the power supply potentials of the power supply lines in FIG. 17A is as follows: the first power supply potential VDD is higher than or equal to the second power supply potential VCC, and the second power supply potential VCC is higher than the third power supply potential VSS. The first to fourth clock signals (CK1) to (CK4) are signals which become H-level signals and L-level signals repeatedly at regular intervals. The potential is VDD when the clock signal is at the H level, and the potential is VSS when the clock signal is at the L level. By making the potential VDD of the power supply line 51 higher than the potential VCC of the power supply line 52, a potential applied to a gate electrode of a transistor can be lowered, shift in the threshold voltage of the transistor can be reduced, and deterioration of the transistor can be suppressed without an adverse effect on the operation of the transistor.

In FIG. 17A, a first terminal of the 1st transistor 31 is electrically connected to the power supply line 51, a second terminal of the 1st transistor 31 is electrically connected to a first terminal of the 9th transistor 39, and a gate electrode of the 1st transistor 31 is electrically connected to the fourth input terminal 24. A first terminal of the 2nd transistor 32 is electrically connected to the power supply line 53, a second terminal of the 2nd transistor 32 is electrically connected to the first terminal of the 9th transistor 39, and a gate electrode of the 2nd transistor 32 is electrically connected to a gate electrode of the 4th transistor 34. A first terminal of the 3rd transistor 33 is electrically connected to the first input terminal 21, and a second terminal of the 3rd transistor 33 is electrically connected to the first output terminal 26. A first terminal of the 4th transistor 34 is electrically connected to the power supply line 53, and a second terminal of the 4th transistor 34 is electrically connected to the first output terminal 26. A first terminal of the 5th transistor 35 is electrically connected to the power supply line 53, a second terminal of the 5th transistor 35 is electrically connected to the gate electrode of the 2nd transistor 32 and the gate electrode of the 4th transistor 34, and a gate electrode of the 5th transistor 35 is electrically connected to the fourth input terminal 24. A first terminal of the 6th transistor 36 is electrically connected to the power supply line 52, a second terminal of the 6th transistor 36 is electrically connected to the gate electrode of the 2nd transistor 32 and the gate electrode of the 4th transistor 34, and a gate electrode of the 6th transistor 36 is electrically connected to the fifth input terminal 25. A first terminal of the 7th transistor 37 is electrically connected to the power supply line 52, a second terminal of the 7th transistor 37 is electrically connected to a second terminal of the 8th transistor 38, and a gate electrode of the 7th transistor 37 is electrically connected to the third input terminal 23. A first terminal of the 8th transistor 38 is electrically connected to the gate electrode of the 2nd transistor 32 and the gate electrode of the 4th transistor 34, and a gate electrode of the 8th transistor 38 is electrically connected to the second input terminal 22. The first terminal of the 9th transistor 39 is electrically connected to the second terminal of the 1st transistor 31 and the second terminal of the 2nd transistor 32, a second terminal of the 9th transistor 39 is electrically connected to a gate electrode of the 3rd transistor 33 and a gate electrode of the 10th transistor 40, and a gate electrode of the 9th transistor 39 is electrically connected to the power supply line 52. A first terminal of the 10th transistor 40 is electrically connected to the first input terminal 21, a second terminal of the 10th transistor 40 is electrically connected to the second output terminal 27, and the gate electrode of the 10th transistor 40 is electrically connected to the second terminal of the 9th transistor 39. A first terminal of the 11th transistor 41 is electrically connected to the power supply line 53, a second terminal of the 11th transistor 41 is electrically connected to the second output terminal 27, and a gate electrode of the 11th transistor 41 is electrically connected to the gate electrode of the 2nd transistor 32 and the gate electrode of the 4th transistor 34. A first terminal of the 12th transistor 42 is electrically connected to the power supply line 53, a second terminal of the 12th transistor 42 is electrically connected to the second output terminal 27, and a gate electrode of the 12th transistor 42 is electrically connected to the gate electrode of the 7th transistor 37. A first terminal of the 13th transistor 43 is electrically connected to the power supply line 53, a second terminal of the 13th transistor 43 is electrically connected to the first output terminal 26, and a gate electrode of the 13th transistor 43 is electrically connected to the gate electrode of the 7th transistor 37.

In FIG. 17A, a connection point of the gate electrode of the 3rd transistor 33, the gate electrode of the 10th transistor 40, and the second terminal of the 9th transistor 39 is referred to as a node A. A connection point where the gate electrode of the 2nd transistor 32, the gate electrode of the 4th transistor 34, the second terminal of the 5th transistor 35, the second terminal of the 6th transistor 36, the first terminal of the 8th transistor 38, and the gate electrode of the 11th transistor 41 are connected is referred to as a node B (see FIG. 17A).

Figure 17B:
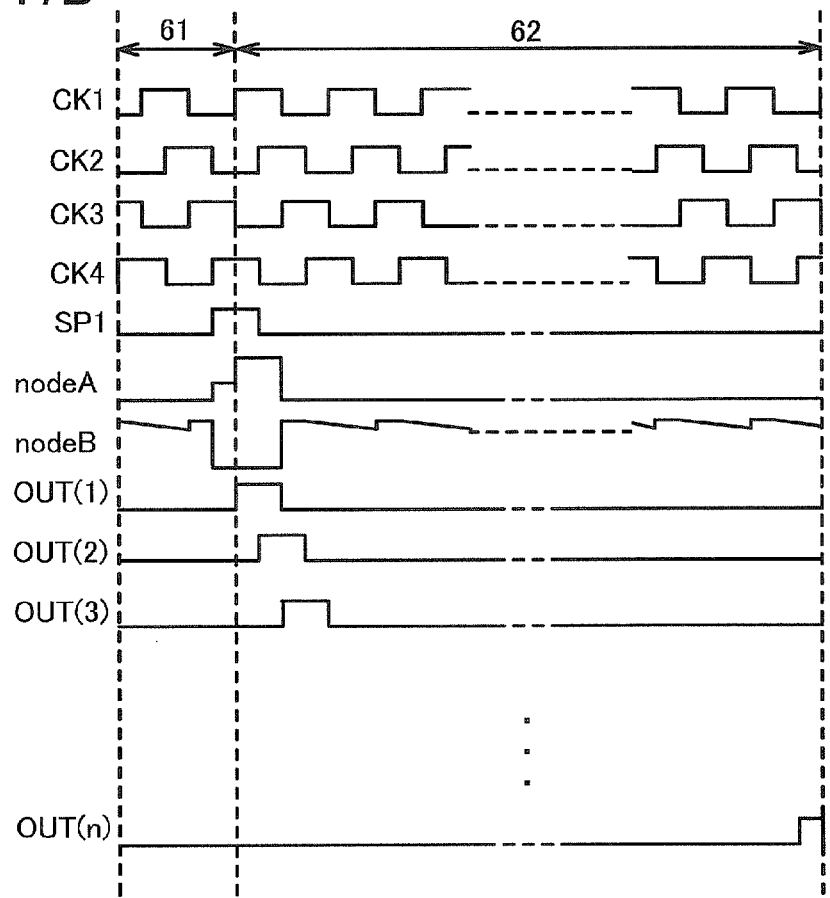

FIG. 17B is a timing chart of the shift register including a plurality of pulse output circuits illustrated in FIG. 17A.

The provision of the 9th transistor 39 in which the second power supply potential VCC is applied to the gate electrode as illustrated in FIG. 17A has the following advantages before and after bootstrap operation.

Without the 9th transistor 39 in which the second high power supply potential VCC is applied to the gate electrode, as the potential of the node A is raised by the bootstrap operation, the potential of the source electrode which is the second terminal of the 1st transistor 31 rises to a value higher than the first power supply potential VDD. Then, the first terminal of the 1st transistor 31, namely the power supply line 51 side thereof, becomes to serve as the source electrode. Consequently, in the 1st transistor 31, high bias voltage is applied and thus significant stress is applied between the gate electrode and the source electrode and between the gate electrode and the drain electrode, which might cause deterioration of the transistor. By providing of the 9th transistor 39 in which the second power supply potential VCC is applied to the gate electrode, an increase in the potential of the second terminal of the 1st transistor 31 can be prevented, though the potential of the node A is raised by the bootstrap operation. In other words, the provision of the 9th transistor 39 can lower the level of negative bias voltage applied between the gate electrode and the source electrode of the 1st transistor 31. Accordingly, with a circuit structure in this embodiment, negative bias voltage applied between the gate electrode and the source electrode of the 1st transistor 31 can be lowered, so that deterioration of the 1st transistor 31, which is due to stress, can be suppressed.

The 9th transistor 39 is provided so as to be connected between the second terminal of the 1st transistor 31 and the gate electrode of the 3rd transistor 33 through the first terminal and the second terminal thereof. Note that when the shift register including a plurality of pulse output circuits in this embodiment is included in a signal line driver circuit having a larger number of stages than a scan line driver circuit, the 9th transistor 39 may be omitted, which is advantageous in that the number of transistors can be reduced.

Note that an oxide semiconductor is used for active layers of the 1st to 13th transistors 31 to 43; thus, the off-state current of the transistors can be reduced, the on-state current and field effect mobility can be increased, and the degree of deterioration of the transistors can be reduced; thus, a malfunction in a circuit can be reduced. Further, the degree of deterioration of the transistor formed using an oxide semiconductor by application of a high potential to a gate electrode is smaller than that of a transistor formed using amorphous silicon. Therefore, even when the first power supply potential VDD is supplied to a power supply line to which the second power supply potential VCC is supplied, similar operation can be performed, and the number of power supply lines which are provided for a circuit can be reduced, so that the circuit can be miniaturized.

A similar function to the above is obtained even when the connection relation is changed so that a clock signal that is supplied to the gate electrode of the 7th transistor 37 from the third input terminal 23 and a clock signal that is supplied to the gate electrode of the 8th transistor 38 from the second input terminal 22 may be supplied from the second input terminal 22 and the third input terminal 23, respectively. Note that in the shift register shown in FIG. 17A, if the state where the 7th transistor 37 and the 8th transistor 38 are both on is changed through the state where the 7th transistor 37 is off and the 8th transistor 38 is on to the state where the 7th transistor 37 is off and the 8th transistor 38 is off, potential reduction at the node B, which is caused by potential reduction of the second input terminal 22 and the third input terminal 23, is caused twice due to the potential reduction of the gate electrode of the 7th transistor 37 and the potential reduction of the gate electrode of the 8th transistor 38. On the other hand, in the case where states of the 7th transistor 37 and the 8th transistor 38 in the shift register illustrated in FIG. 17A are changed in such a manner that both the 7th transistor 37 and the 8th transistor 38 are on, then the 7th transistor 37 is on and the 8th transistor 38 is off, and then the 7th transistor 37 and the 8th transistor 38 are off, the potential reduction at the node B, which is caused by the potential reduction of the second input terminal 22 and the third input terminal 23, is caused only once by the potential reduction of the gate electrode of the 8th transistor 38. Consequently, a connection relation in which the clock signal CK3 is supplied from the third input terminal 23 to the gate electrode of the 7th transistor 37 and the clock signal CK2 is supplied from the second input terminal 22 to the gate electrode of the 8th transistor 38 is preferable. This is because the number of times of the change in the potential of the node B can be reduced, and the noise can be decreased.

In this way, in a period during which the potentials of the first output terminal 26 and the second output terminal 27 are held at the L level, the H level signal is regularly supplied to the node B, whereby malfunction of a pulse output circuit can be suppressed.

This embodiment can be implemented by being combined as appropriate with the above-described embodiments.

Embodiment 6

In a liquid crystal display device according to one embodiment of the present invention, a highly reliable transistor with low off-state current is used; therefore, high visibility and high reliability are obtained. In Embodiment 6, a structure of the liquid crystal display device according to one embodiment of the present invention will be described.

Figure 18:
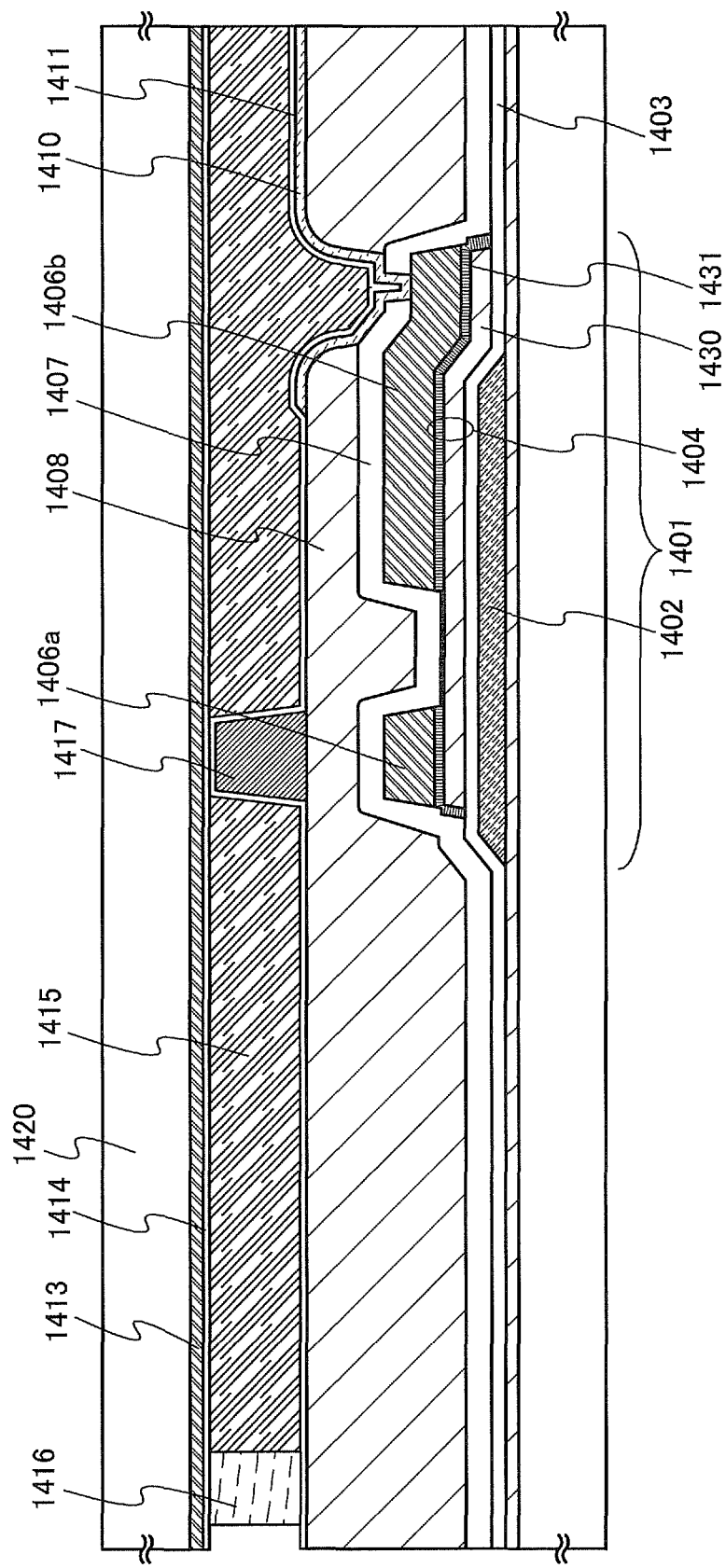
FIG. 18 is a cross-sectional view of a liquid crystal display device.

FIG. 18 is a cross-sectional view of a pixel of a liquid crystal display device according to one embodiment of the present invention, as an example. A transistor 1401 illustrated in FIG. 18 has a gate electrode 1402 formed over an insulating surface, a gate insulating film 1403 over the gate electrode 1402, an oxide semiconductor film 1404 which is over the gate insulating film 1403 and which overlaps with the gate electrode 1402, and a pair of conductive films 1406a and 1406b which function as a source electrode and a drain electrode and which are stacked over the oxide semiconductor film 1404. Further, the transistor 1401 may include an insulating film 1407 formed over the oxide semiconductor film 1404 as a component. The insulating film 1407 is formed so as to cover the gate electrode 1402, the gate insulating film 1403, the oxide semiconductor film 1404, and the conductive films 1406a and 1406b. The oxide semiconductor film 1404 includes an amorphous region 1430 and a crystal region 1431 over the amorphous region 1430. The crystal region 1431 is in contact with the conductive films 1406a and 1406b.

An insulating film 1408 is formed over the insulating film 1407. Part of the insulating film 1407 and the insulating film 1408 is provided with an opening, and a pixel electrode 1410 is formed so as to be in contact with the conductive film 1406b in the opening.

Further, a spacer 1417 for controlling a cell gap of a liquid crystal element is formed over the insulating film 1408. The spacer 1417 can be formed by etching an insulating film into an appropriate shape. Alternatively, the cell gap may be controlled by dispersing a filler over the insulating film 1408.

An alignment film 1411 is formed over the pixel electrode 1410. Further, a counter electrode 1413 is provided in a position opposed to the pixel electrode 1410, and an alignment film 1414 is formed on the side of the counter electrode 1413 which is close to the pixel electrode 1410. The alignment film 1411 and the alignment film 1414 can be formed using an organic resin such as polyimide or polyvinyl alcohol. Alignment treatment such as rubbing is performed on their surfaces in order to align liquid crystal molecules in certain direction. Rubbing can be performed by rolling a roller wrapped with cloth of nylon or the like while applying pressure on the alignment film so that the surface of the alignment film is rubbed in certain direction. Note that it is also possible to form the alignment films 1411 and 1414 that have alignment characteristics by using an inorganic material such as silicon oxide by an evaporation method, without alignment process.

Furthermore, a liquid crystal 1415 is provided in a region which is surrounded by a sealant 1416 between the pixel electrode 1410 and the counter electrode 1413. Injection of the liquid crystal 1415 may be performed by a dispenser method (dripping method) or a dipping method (pumping method). A filler may be mixed in the sealant 1416.

The liquid crystal element formed using the pixel electrode 1410, the counter electrode 1413, and the liquid crystal 1415 may overlap with a color filter through which light in a particular wavelength region can pass. The color filter may be formed on a substrate (counter substrate) 1420 provided with the counter electrode 1413. The color filter can be selectively formed by photolithography after application of an organic resin such as an acrylic-based resin in which a pigment is dispersed on the substrate 1420. Alternatively, the color filter can be selectively formed by etching after application of a polyimide-based resin in which a pigment is dispersed on the substrate 1420. Further alternatively, the color filter can be selectively formed by a droplet discharge method such as an ink jet method.

A light-blocking film which can block light may be formed between the pixels so that disclination due to variations between the pixels in the alignment of the liquid crystal 1415 is prevented from seeing. The light-blocking film can be formed using an organic resin containing a black pigment such as a carbon black or a low-valent titanium oxide. Alternatively, the light-blocking film may be formed using a film using chromium.

The pixel electrode 1410 and the counter electrode 1413 can be formed using a transparent conductive material such as indium tin oxide including silicon oxide (ITSO), indium tin oxide (ITO), zinc oxide (ZnO), indium zinc oxide (IZO), or gallium-doped zinc oxide (GZO), for example. Although an example of manufacturing a transmissive liquid crystal element by using a light-transmitting conductive film for the pixel electrode 1410 and the counter electrode 1413 is described in Embodiment 6, one embodiment of the present invention is not limited to this structure. The liquid crystal display device according to one embodiment of the present invention may be a transreflective liquid crystal display device or a reflective liquid crystal display device.

Although a liquid crystal display device of a TN (twisted nematic) mode is described in Embodiment 6, the transistor of the present invention can be used for other liquid crystal display devices of a VA (vertical alignment) mode, an OCB (optically compensated birefringence) mode, an IPS (in-plane-switching) mode, and the like.

Alternatively, liquid crystal exhibiting a blue phase for which an alignment film is unnecessary may be used. A blue phase is one of liquid crystal phases, which is generated just before a cholesteric phase changes into an isotropic phase as temperature of cholesteric liquid crystal is increased. Since the blue phase is generated within an only narrow range of temperature, a liquid crystal composition containing a chiral agent at 5 wt % or more so as to improve the temperature range is used for the liquid crystal 1415. The liquid crystal composition including liquid crystal exhibiting a blue phase and a chiral agent has a short response time of greater than or equal to 10 μsec and less than or equal to 100 μsec and is optically isotropic; therefore, alignment treatment is not necessary and viewing angle dependence is small.

Figure 19:
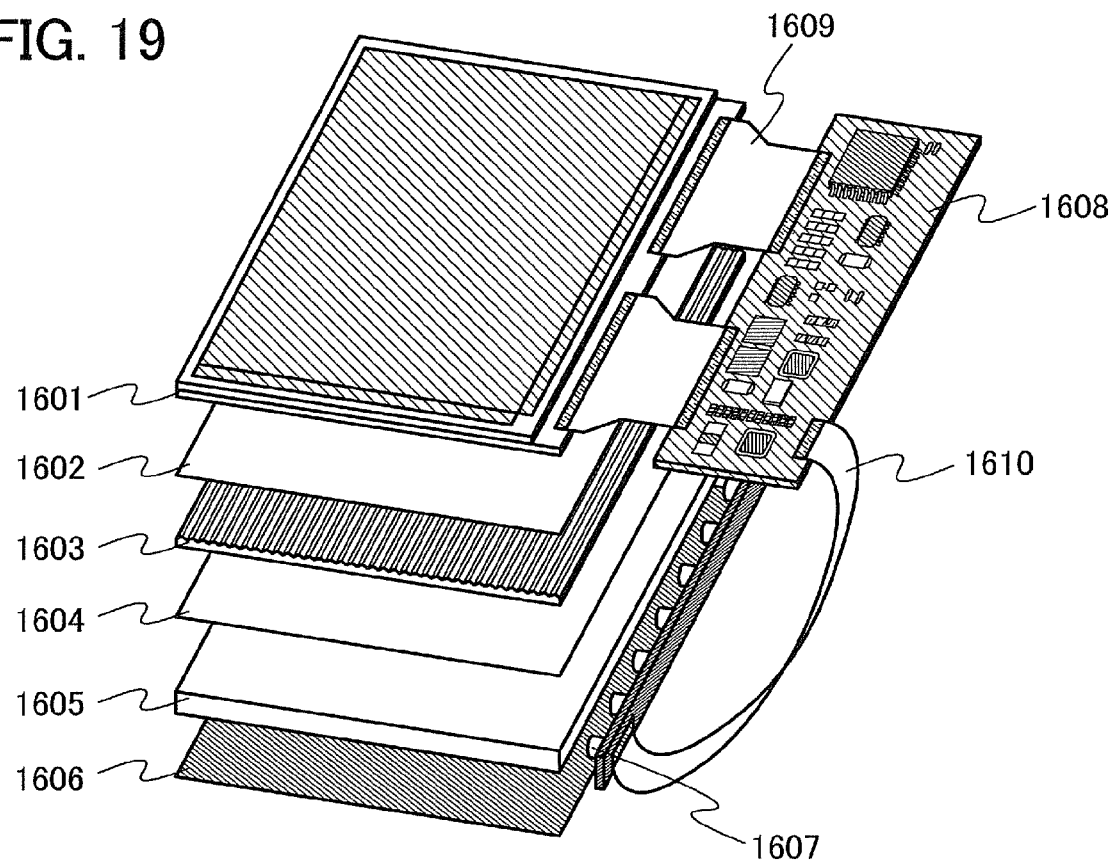
FIG. 19 is a view illustrating a structure of a liquid crystal display device module.

FIG. 19 is an example of a perspective view showing a structure of a liquid crystal display device of the present invention. The liquid crystal display device illustrated in FIG. 19 is provided with a liquid crystal panel 1601 in which a liquid crystal element is formed between a pair of substrates; a first diffusion plate 1602; a prism sheet 1603; a second diffusion plate 1604; a light guide plate 1605; a reflection plate 1606; a light source 1607; and a circuit board 1608.

The liquid crystal panel 1601, the first diffusion plate 1602, the prism sheet 1603, the second diffusion plate 1604, the light guide plate 1605, and the reflection plate 1606 are sequentially stacked. The light source 1607 is provided at an end portion of the light guide plate 1605. The liquid crystal panel 1601 is uniformly irradiated with light from the light source 1607 which is diffused inside the light guide plate 1605, due to the first diffusion plate 1602, the prism sheet 1603, and the second diffusion plate 1604.

Although the first diffusion plate 1602 and the second diffusion plate 1604 are used in this embodiment, the number of diffusion plates is not limited thereto. The number of diffusion plates may be one, or may be three or more. It is acceptable as long as the diffusion plate is provided between the light guide plate 1605 and the liquid crystal panel 1601. Therefore, a diffusion plate may be provided only on the side closer to the liquid crystal panel 1601 than the prism sheet 1603, or may be provided only on the side closer to the light guide plate 1605 than the prism sheet 1603.

Further, the cross section of the prism sheet 1603 is not limited to a sawtooth-shape illustrated in FIG. 19. The prism sheet 1603 may have any shape as long as light from the light guide plate 1605 can be concentrated on the liquid crystal panel 1601 side.

The circuit board 1608 is provided with a circuit which generates various kinds of signals input to the liquid crystal panel 1601, a circuit which processes the signals, or the like.

In FIG. 19, the circuit board 1608 and the liquid crystal panel 1601 are connected to each other via a flexible printed circuit (FPC) 1609. Note that the circuit may be connected to the liquid crystal panel 1601 by using a chip on glass (COG) method, or part of the circuit may be connected to the FPC 1609 by using a chip on film (COF) method.

FIG. 19 illustrates an example in which the circuit board 1608 is provided with a control circuit which controls driving of the light source 1607 and the control circuit and the light source 1607 are connected to each other via an FPC 1610. Note that the above-described control circuit may be formed over the liquid crystal panel 1601. In that case, the liquid crystal panel 1601 and the light source 1607 are connected to each other via an FPC or the like.

Although FIG. 19 illustrates an edge-light type light source in which the light source 1607 is provided at an end portion of the liquid crystal panel 1601, a liquid crystal display device of the present invention may be a direct-below type in which the light source 1607 is provided directly below the liquid crystal panel 1601.

This embodiment can be implemented by being combined as appropriate with the above-described embodiments.

Embodiment 7

In Embodiment 7, a structure of a light-emitting device using the transistor according to one embodiment of the present invention for a pixel will be described. In this embodiment, a cross-sectional structure of a pixel when a transistor for driving a light-emitting element is an n-channel transistor is described with reference to FIG. 20A to 20C. Although the case where a first electrode is a cathode and a second electrode is an anode is described in FIGS. 20A to 20C, the first electrode may be an anode and the second electrode may be a cathode.

Figure 20A:
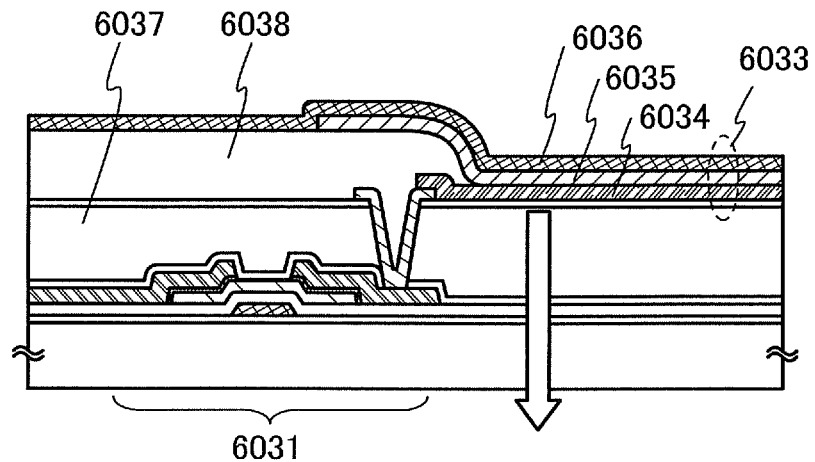
FIGS. 20A to 20C are cross-sectional views each of a light-emitting device.

FIG. 20A is a cross-sectional view of a pixel in the case where an n-channel transistor is employed as a transistor 6031, and light emitted from a light-emitting element 6033 is extracted from a first electrode 6034 side. The transistor 6031 is covered with an insulating film 6037, and a partition 6038 having an opening is formed over the insulating film 6037. In the opening of the partition 6038, the first electrode 6034 is partly exposed, and the first electrode 6034, an electroluminescent layer 6035, and a second electrode 6036 are sequentially stacked in the opening.

The first electrode 6034 is formed using a material or to a thickness such that light transmits therethrough, and can be formed using a material having a low work function of a metal, an alloy, an electrically conductive compound, a mixture thereof, or the like. Specifically, an alkali metal such as Li or Cs, an alkaline earth metal such as Mg, Ca, or Sr, an alloy containing such metals (e.g., Mg:Ag, Al:Li, or Mg:In), a compound of such materials (e.g., calcium fluoride or calcium nitride), or a rare-earth metal such as Yb or Er can be used. Further, in the case where an electron injection layer is provided, another conductive layer such as an aluminum layer may be used. Then, the first electrode 6034 is formed to a thickness such that light transmits therethrough (preferably, about 5 nm to 30 nm). Furthermore, the sheet resistance of the first electrode 6034 may be suppressed by formation of a light-transmitting conductive layer of a light-transmitting oxide conductive material so as to be in contact with and over or under the above-described conductive layer with a thickness such that light transmits therethrough. Alternatively, the first electrode 6034 may be formed using only a conductive layer of another light-transmitting oxide conductive material such as indium tin oxide (ITO), zinc oxide (ZnO), indium zinc oxide (IZO), or gallium-doped zinc oxide (GZO). Furthermore, a mixture in which zinc oxide (ZnO) is mixed at 2% to 20% in ITSO or in indium oxide including silicon oxide may be used. In the case of using the light-transmitting oxide conductive material, it is preferable to provide an electron injection layer in the electroluminescent layer 6035.

The second electrode 6036 is formed using a material and to a thickness such that light is reflected or blocked, and can be formed using a material suitable for being used as an anode. For example, a single-layer film including one or more of titanium nitride, zirconium nitride, titanium, tungsten, nickel, platinum, chromium, silver, aluminum, and the like, a stacked layer of a titanium nitride film containing titanium nitride as a main component and a film containing aluminum as a main component, a three-layer structure of a titanium nitride film, a film containing aluminum as a main component, and a titanium nitride film, or the like can be used for the second electrode 6036.

The electroluminescent layer 6035 is formed using a single layer or a plurality of layers. When the electroluminescent layer 6035 is formed with a plurality of layers, these layers can be classified into a hole injection layer, a hole transport layer, a light-emitting layer, an electron transport layer, an electron injection layer, and the like in view of the carrier transport property. In the case where the electroluminescent layer 6035 includes at least one of a hole injection layer, a hole transport layer, an electron transport layer, and an electron injection layer in addition to a light-emitting layer, the electron injection layer, the electron transport layer, the light-emitting layer, the hole transport layer, and the hole injection layer are sequentially stacked over the first electrode 6034. Note that the boundary between layers which are adjacent to each other is not necessarily clear, and there may be the case where the boundary is unclear since materials for forming the layers are mixed. Each layer may be formed with an organic material or an inorganic material. As the organic material, any of a high molecular weight material, a medium molecular weight material, and a low molecular weight material may be used. Note that the medium molecular weight material corresponds to a low polymer in which the number of repetitions of a structural unit (the degree of polymerization) is about 2 to 20. A distinction between a hole injection layer and a hole transport layer is not always distinct, and they are the same in the sense that a hole transport property (hole mobility) is a particularly important characteristic. A layer being in contact with the anode is referred to as a hole injection layer and a layer being in contact with the hole injection layer is referred to as a hole transport layer for convenience. The same is also true for the electron transport layer and the electron injection layer; a layer being in contact with the cathode is referred to as an electron injection layer and a layer being in contact with the electron injection layer is referred to as an electron transport layer. In some cases, the light-emitting layer also functions as the electron transport layer, and it is therefore referred to as a light-emitting electron transport layer, too.

In the case of the pixel illustrated in FIG. 20A, light emitted from the light-emitting element 6033 can be extracted from the first electrode 6034 side as shown by a hollow arrow.

Figure 20B:
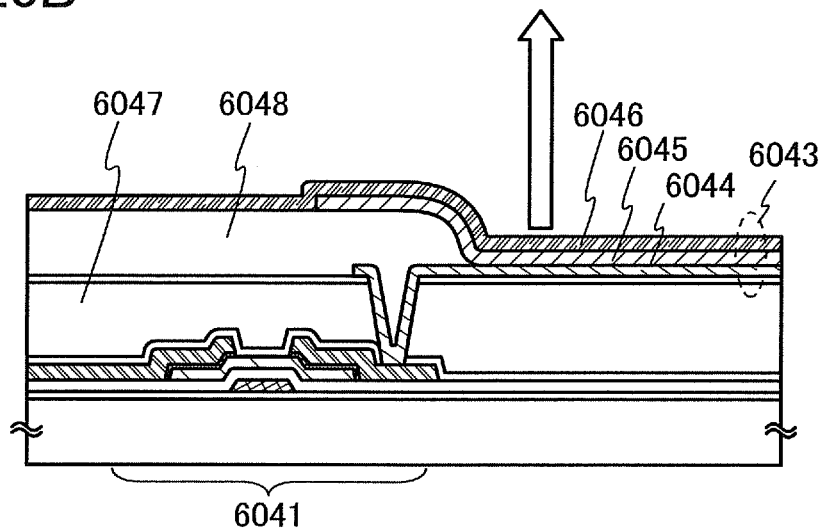

Next, a cross-sectional view of a pixel in the case where an n-channel transistor is used as a transistor 6041, and light emitted from a light-emitting element 6043 is extracted from a second electrode 6046 side is illustrated in FIG. 20B. The transistor 6041 is covered with an insulating film 6047, and a partition 6048 having an opening is formed over the insulating film 6047. In the opening of the partition 6048, a first electrode 6044 is partly exposed, and the first electrode 6044, an electroluminescent layer 6045, and the second electrode 6046 are sequentially stacked in the opening.

The first electrode 6044 is formed using a material and to a thickness such that light is reflected or blocked, and can be formed using a material having a low work function of a metal, an alloy, an electrically conductive compound, a mixture thereof, or the like. Specifically, an alkali metal such as Li or Cs, an alkaline earth metal such as Mg, Ca, or Sr, an alloy containing such metals (e.g., Mg:Ag, Al:Li, or Mg:In), a compound of such materials (e.g., calcium fluoride or calcium nitride), or a rare-earth metal such as Yb or Er can be used. Further, in the case where an electron injection layer is provided, another conductive film such as an aluminum film may be used.

The second electrode 6046 is formed using a material or to a thickness such that light transmits therethrough, and formed using a material suitable for being used as an anode. For example, another light-transmitting oxide conductive material such as indium tin oxide (ITO), zinc oxide (ZnO), indium zinc oxide (IZO), or gallium-doped zinc oxide (GZO) can be used for the second electrode 6046. Further, a mixture in which zinc oxide (ZnO) is mixed at 2% to 20% in ITSO or indium oxide including silicon oxide may be used for the second electrode 6046. Furthermore, other than the above-described light-transmitting oxide conductive material, a single-layer film including one or more of titanium nitride, zirconium nitride, titanium, tungsten, nickel, platinum, chromium, silver, aluminum, and the like, a stacked layer of a film containing titanium nitride as a main component and a film containing aluminum as a main component, a three-layer structure of a titanium nitride film, a film containing aluminum as a main component, and a titanium nitride film, or the like can be used for the second electrode 6046. However, in the case of using a material other than the light-transmitting oxide conductive material, the second electrode 6046 is formed to have a thickness such that light transmits therethrough (preferably, about 5 nm to 30 nm).

The electroluminescent layer 6045 can be formed in a manner similar to the electroluminescent layer 6035 of FIG. 20A.

In the case of the pixel illustrated in FIG. 20B, light emitted from the light-emitting element 6043 can be extracted from the second electrode 6046 side as shown by a hollow arrow.

Figure 20C:
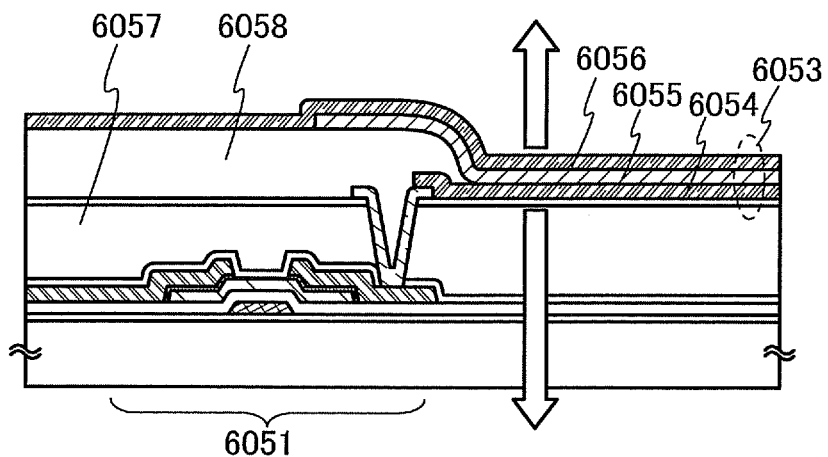

Next, a cross-sectional view of a pixel in the case where an n-channel transistor is used as a transistor 6051, and light emitted from a light-emitting element 6053 is extracted from a first electrode 6054 side and a second electrode 6056 side is illustrated in FIG. 20C. The transistor 6051 is covered with an insulating film 6057, and a partition 6058 having an opening is formed over the insulating film 6057. In the opening of the partition 6058, the first electrode 6054 is partly exposed, and the first electrode 6054, an electroluminescent layer 6055, and the second electrode 6056 are sequentially stacked in the opening.

The first electrode 6054 can be formed in a manner similar to that of the first electrode 6034 in FIG. 20A. The second electrode 6056 can be formed in a manner similar to that of the second electrode 6046 of FIG. 20B. The electroluminescent layer 6055 can be formed in a manner similar to that of the electroluminescent layer 6035 of FIG. 20A.

In the case of the pixel illustrated in FIG. 20C, light emitted from the light-emitting element 6053 can be extracted from both sides of a first electrode 6054 side and a second electrode 6056 side as shown by hollow arrows.

This embodiment can be implemented by being combined as appropriate with the above-described embodiments.

Example 1

A semiconductor device according to one embodiment of the present invention can be used so that a highly reliable electronic device, an electronic device with low power consumption, and an electronic device with high-speed driving can be provided. In addition, a semiconductor display device according to one embodiment of the present invention can be used so that a highly reliable electronic device, an electronic device with high visibility, and an electronic device with low power consumption can be provided. In particular, in the case where a portable electronic device which has difficulty in continuously receiving power, a semiconductor device or a semiconductor display device with low power consumption according to one embodiment of the present invention is added to the component of the device, whereby an advantage in increasing the continuous duty period can be obtained. Further, by use of a transistor with low off-state current, redundant circuit design which is needed to compensate high off-state current is unnecessary; therefore, the density of an integrated circuit used for the semiconductor device can be increased, and a higher performance semiconductor device can be formed.

Moreover, with the semiconductor device of the present invention, the heat treatment temperature in the manufacturing process can be suppressed; therefore, a highly reliable thin film transistor with excellent characteristics can be formed even when the thin film transistor is formed over a substrate formed using a flexible synthetic resin of which heat resistance is lower than that of glass, such as plastic. Accordingly, with the use of the manufacturing method according to one embodiment of the present invention, a highly reliable, lightweight, and flexible semiconductor device can be provided. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, an acrylonitrile-butadiene-styrene resin, polyvinyl chloride, polypropylene, polyvinyl acetate, an acrylic resin, and the like.

The semiconductor device according to one embodiment of the present invention can be used for display devices, laptops, or image reproducing devices provided with recording media (typically, devices which reproduce the content of recording media such as digital versatile discs (DVDs) and have displays for displaying the reproduced images). Other than the above, as an electronic device which can be provided with the semiconductor device according to one embodiment of the present invention, mobile phones, portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 21A to 21F illustrate specific examples of these electronic devices.

Figure 21A:
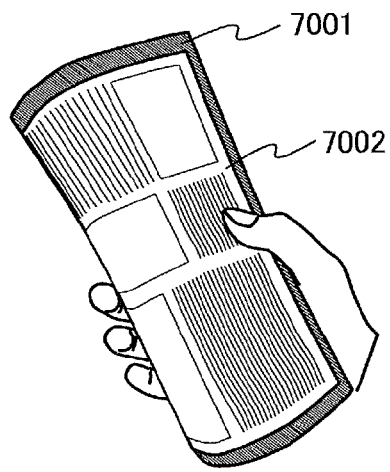
FIGS. 21A to 21F are views each illustrating an electronic device using a semiconductor device.

FIG. 21A illustrates an e-book reader including a housing 7001, a display portion 7002, and the like. The semiconductor display device according to one embodiment of the present invention can be used for the display portion 7002, so that a highly reliable e-book reader, an e-book reader capable of displaying an image with high visibility, and an e-book reader with low power consumption can be provided. The semiconductor device according to one embodiment of the present invention can be used for an integrated circuit for controlling driving of the e-book reader, so that a highly reliable e-book reader, an e-book reader with low power consumption, an e-book reader with high-speed driving, and a higher performance e-book reader can be provided. When a flexible substrate is used, a semiconductor device and a semiconductor display device can have flexibility, whereby a user-friendly e-book reader which is flexible and lightweight can be provided.

Figure 21B:
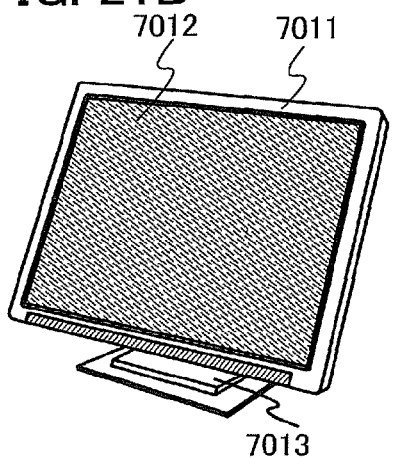

FIG. 21B illustrates a display device including a housing 7011, a display portion 7012, a supporting base 7013, and the like. The semiconductor display device according to one embodiment of the present invention can be used for the display portion 7012, so that a highly reliable display device, a display device capable of displaying an image with high visibility, and a display device with low power consumption can be provided. The semiconductor device according to one embodiment of the present invention can be used for an integrated circuit for controlling driving of the display device, so that a highly reliable display device, a display device with low power consumption, a display device with high-speed driving, and a higher performance display device can be provided. The display device includes in its category any kind of display device for displaying information, such as display devices for personal computers, for receiving television broadcast, and for displaying advertisement.

Figure 21C:
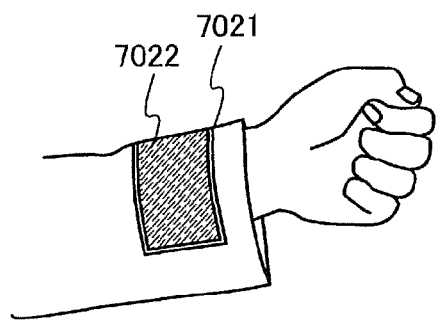

FIG. 21C illustrates a display device including a housing 7021, a display portion 7022, and the like. The semiconductor display device according to one embodiment of the present invention can be used for the display portion 7022, so that a highly reliable display device, a display device capable of displaying an image with high visibility, and a display device with low power consumption can be provided. The semiconductor device according to one embodiment of the present invention can be used for an integrated circuit for controlling driving of the display device, so that a highly reliable display device, a display device with low power consumption, and a higher performance display device can be provided. When a flexible substrate is used, a semiconductor device and a semiconductor display device can have flexibility, whereby a user-friendly display device which is flexible and lightweight can be provided. Accordingly, as illustrated in FIG. 21C, a display device can be used while being fixed to fabric or the like, and an application range of the display device is dramatically widened.

Figure 21D:
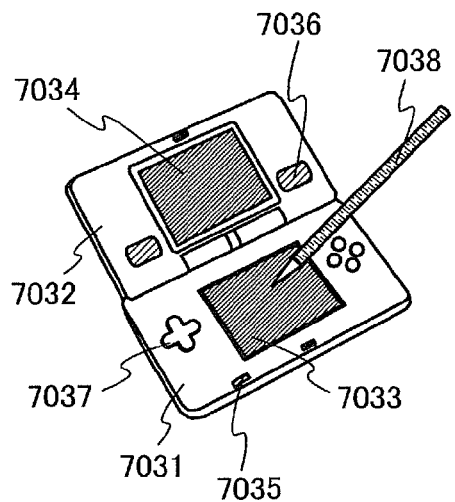

FIG. 21D illustrates a portable game machine including a housing 7031, a housing 7032, a display portion 7033, a display portion 7034, a microphone 7035, speakers 7036, an operation key 7037, a stylus 7038, and the like. The semiconductor display device according to one embodiment of the present invention can be used for the display portion 7033 and the display portion 7034, so that a highly reliable portable game machine, a portable game machine capable of displaying an image with high visibility, and a portable game machine with low power consumption can be provided. The semiconductor device according to one embodiment of the present invention can be used for an integrated circuit for controlling driving of the portable game machine, so that a highly reliable portable game machine, a portable game machine with low power consumption, and a higher performance portable game machine can be provided. Although the portable game machine illustrated in FIG. 21D includes two display portions 7033 and 7034, the number of display portions included in the portable game machine is not limited to two.

Figure 21E:
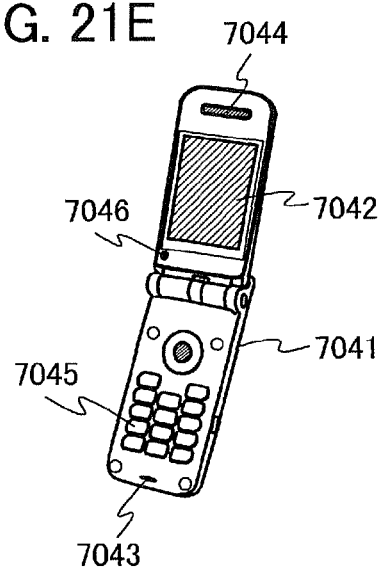

FIG. 21E illustrates a mobile phone including a housing 7041, a display portion 7042, an audio input portion 7043, an audio output portion 7044, operation keys 7045, a light-receiving portion 7046, and the like. Light received in the light-receiving portion 7046 is converted into electrical signals, whereby an outside image can be downloaded. The semiconductor display device according to one embodiment of the present invention can be used for the display portion 7042, so that a highly reliable mobile phone, a mobile phone capable of displaying an image with high visibility, and a mobile phone with low power consumption can be provided. The semiconductor device according to one embodiment of the present invention can be used for an integrated circuit for controlling driving of the mobile phone, so that a highly reliable mobile phone, a mobile phone with low power consumption, a mobile phone with high-speed driving, and a higher performance mobile phone can be provided.

Figure 21F:
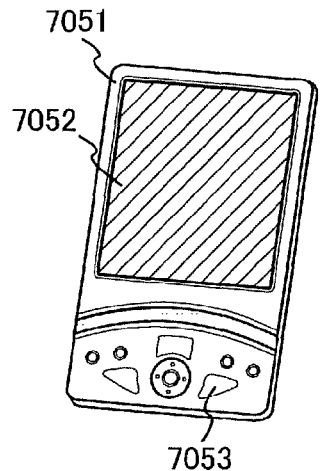

FIG. 21F illustrates a portable information terminal including a housing 7051, a display portion 7052, operation keys 7053, and the like. A modem may be incorporated in the housing 7051 of the portable information terminal illustrated in FIG. 21F. The semiconductor display device according to one embodiment of the present invention can be used for the display portion 7052, so that a highly reliable portable information terminal, a portable information terminal capable of displaying an image with high visibility, and a portable information terminal with low power consumption can be provided. The semiconductor device according to one embodiment of the present invention can be used for an integrated circuit for controlling driving of the portable information terminal, so that a highly reliable portable information terminal, a portable information terminal with low power consumption, a portable information terminal with high-speed driving, and a higher performance portable information terminal can be provided.

This embodiment can be implemented by being combined as appropriate with the above-described embodiments.

This application is based on Japanese Patent Application serial No. 2009-277078 filed with Japan Patent Office on Dec. 4, 2009, the entire contents of which are hereby incorporated by reference.

EXPLANATION OF REFERENCE

10: pulse output circuit; 11: wiring; 12: wiring; 13: wiring; 14: wiring; 15: wiring; 21: input terminal; 22: input terminal; 23: input terminal; 24: input terminal; 25: input terminal; 26: output terminal; 27: output terminal; 31: transistor; 32: transistor; 33: transistor; 34: transistor; 35: transistor; 36: transistor; 37: transistor; 38: transistor; 39: transistor; 40: transistor; 41: transistor; 42: transistor; 43: transistor; 51: power supply line; 52: power supply line; 53: power supply line; 100: substrate; 101: gate electrode; 102: gate insulating film; 103: oxide semiconductor film; 104: oxide semiconductor film; 105: oxide semiconductor film; 106: crystal region; 107: oxide semiconductor film; 108: oxide semiconductor film; 109: crystal region; 110: amorphous region; 111: source electrode; 112: drain electrode; 113: insulating film; 114: transistor; 115: back gate electrode; 116: insulating film; 130: channel protective film; 131: source electrode; 132: drain electrode; 133: insulating film; 140: transistor; 145: back gate electrode; 146: insulating film; 200: substrate; 201: insulating film; 202: electrode; 203: oxide semiconductor film; 205: oxide semiconductor film; 206: crystal region; 207: oxide semiconductor film; 208: oxide semiconductor film; 209: crystal region; 210: amorphous region; 211: electrode; 212: gate insulating film; 213: gate electrode; 214: insulating film;

215: wiring; 216: wiring; 217: wiring; 218: portion; 220: transistor; 221: contact hole; 222: contact hole; 223: contact hole; 230: wiring; 231: contact hole; 700: pixel portion; 701: signal line driver circuit; 702: scan line driver circuit; 703: pixel; 704: transistor; 705: display element; 706: storage capacitor; 707: signal line; 708: scan line; 710: pixel electrode; 711: counter electrode; 712: microcapsule; 713: drain electrode; 714: resin; 1401: transistor; 1402: gate electrode; 1403: gate insulating film; 1404: oxide semiconductor film; 1406a: conductive film; 1406b: conductive film; 1407: insulating film; 1408: insulating film; 1410: pixel electrode; 1411: alignment film; 1413: counter electrode; 1414: alignment film; 1415: liquid crystal; 1416: sealant; 1417: spacer; 1420: substrate; 1430: amorphous region; 1431: crystal region; 1601: liquid crystal panel; 1602: diffusion plate; 1603: prism sheet; 1604: diffusion plate; 1605: light guide plate; 1606: reflection plate; 1607: light source; 1608: circuit board; 1609: FPC; 1610: FPC; 5300: substrate; 5301: pixel portion; 5302: scan line driver circuit; 5303: scan line driver circuit; 5304: signal line driver circuit; 5305: timing control circuit; 5601: shift register; 5602: sampling circuit; 5603: transistor; 5604: wiring; 5605: wiring; 6031: transistor; 6033: light-emitting element; 6034: electrode; 6035: electroluminescence layer; 6036: electrode; 6037: insulating film; 6038: partition; 6041: transistor; 6043: light-emitting element; 6044: electrode; 6045: electroluminescence layer; 6046: electrode; 6047: insulating film; 6048: partition; 6051: transistor; 6053: light-emitting element; 6054: electrode; 6055: electroluminescence layer; 6056: electrode; 6057: insulating film; 6058: partition; 7001: housing; 7002: display portion; 7011: housing; 7012: display portion; 7013: supporting base; 7021: housing; 7022: display portion; 7031: housing; 7032: housing; 7033: display portion; 7034: display portion; 7035: microphone; 7036: speaker; 7037: operation key; 7038: stylus; 7041: housing; 7042: display portion; 7043: audio input portion; 7044: audio output portion; 7045: operation key; 7046: light-receiving portion; 7051: housing; 7052: display portion; 7053: operation key

The invention claimed is:

1. A method for manufacturing a semiconductor device, comprising the steps of:
    forming an oxide semiconductor layer comprising indium over a substrate, wherein the oxide semiconductor layer comprises a crystal region;
    forming a source electrode and a drain electrode over and in contact with the oxide semiconductor layer, wherein part of the oxide semiconductor layer is not covered by the source electrode and the drain electrode; and
    removing an upper surface region and side surface regions of the oxide semiconductor layer at the uncovered part of the oxide semiconductor layer,
    wherein the crystal region has a c-axis orientation.

2. The method according to claim 1, further comprising the steps of:
    adding oxygen into the oxide semiconductor layer; and
    performing a second heat treatment on the oxide semiconductor layer after adding oxygen.

3. The method according to claim 1, further comprising the step of heating the oxide semiconductor layer, wherein a hydrogen concentration of the oxide semiconductor layer is less than or equal to $5 \times 10^{19}/cm^3$ after heating the oxide semiconductor layer.

4. The method according to claim 1, wherein the crystal region has a c-axis which is aligned in a direction substantially perpendicular to a top surface of the oxide semiconductor layer.

5. The method according to claim 1, wherein the oxide semiconductor layer is formed over a gate electrode with a gate insulating film therebetween.

6. A method for manufacturing a semiconductor device, comprising the steps of:
    forming an oxide semiconductor layer comprising indium over a substrate, wherein the oxide semiconductor layer comprises a crystal region;
    forming a conductive film over and in contact with the oxide semiconductor layer;
    forming a source electrode and a drain electrode by selectively etching the conductive film, wherein part of the oxide semiconductor layer is not covered by the source electrode and the drain electrode; and
    removing an upper surface region and side surface regions at the uncovered part of the oxide semiconductor layer,
    wherein the crystal region has a c-axis orientation.

7. The method according to claim 6, wherein the conductive film is selectively etched by wet etching.

8. The method according to claim 6, further comprising the steps of:
    adding oxygen into the oxide semiconductor layer; and
    performing a second heat treatment on the oxide semiconductor layer after adding oxygen.

9. The method according to claim 6, further comprising the step of heating the oxide semiconductor layer, wherein a hydrogen concentration of the oxide semiconductor layer is less than or equal to $5 \times 10^{19}/cm^3$ after heating the oxide semiconductor layer.

10. The method according to claim 6, wherein the crystal region has a c-axis which is aligned in a direction substantially perpendicular to a top surface of the oxide semiconductor layer.

11. The method according to claim 6, wherein the oxide semiconductor layer is formed over a gate electrode with a gate insulating film therebetween.

12. A method for manufacturing a semiconductor device, comprising the steps of:
    forming an oxide semiconductor layer comprising indium over a substrate, wherein the oxide semiconductor layer comprises a crystal region;
    forming a source electrode and a drain electrode over and in contact with the oxide semiconductor layer, wherein the oxide semiconductor layer extends beyond side edges of the source electrode and side edges of the drain electrode in a channel width direction, and wherein part of the oxide semiconductor layer is not covered by the source electrode and the drain electrode; and
    removing an upper surface region and side surface regions of the oxide semiconductor layer at the uncovered part of the oxide semiconductor layer,
    wherein the crystal region has a c-axis orientation.

13. The method according to claim 12, further comprising the steps of:
    adding oxygen into the oxide semiconductor layer; and
    performing a second heat treatment on the oxide semiconductor layer after adding oxygen.

14. The method according to claim 12, further comprising the step of heating the oxide semiconductor layer, wherein a hydrogen concentration of the oxide semiconductor layer is less than or equal to $5 \times 10^{19}/cm^3$ after heating the oxide semiconductor layer.

15. The method according to claim 12, wherein the crystal region has a c-axis which is aligned in a direction substantially perpendicular to a top surface of the oxide semiconductor layer.

16. The method according to claim 12, wherein the oxide semiconductor layer is formed over a gate electrode with a gate insulating film therebetween.

* * * * *